United States Patent
Sakuishi et al.

(10) Patent No.: US 9,437,832 B2
(45) Date of Patent: Sep. 6, 2016

(54) LIGHT-EMITTING DEVICE AND PEELING METHOD

(71) Applicant: Semiconductor Energy Laboratory Co., Ltd., Astugi-shi, Kanagawa-ken (JP)

(72) Inventors: Tatsuya Sakuishi, Kanagawa (JP); Yutaka Uchida, Kanagawa (JP); Hiroki Adachi, Tochigi (JP); Saki Eguchi, Tochigi (JP); Junpei Yanaka, Tochigi (JP); Kayo Kumakura, Tochigi (JP); Seiji Yasumoto, Tochigi (JP); Kohei Yokoyama, Kanagawa (JP); Akihiro Chida, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/621,914

(22) Filed: Feb. 13, 2015

(65) Prior Publication Data

US 2015/0236280 A1 Aug. 20, 2015

(30) Foreign Application Priority Data

Feb. 19, 2014 (JP) ................................ 2014-029756

(51) Int. Cl.
*H01L 51/00* (2006.01)
*B32B 7/02* (2006.01)
(Continued)

(52) U.S. Cl.
CPC ............. *H01L 51/0097* (2013.01); *B32B 7/02* (2013.01); *B32B 7/12* (2013.01); *B32B 15/08* (2013.01); *B32B 15/18* (2013.01); *B32B 15/20* (2013.01); *B32B 17/00* (2013.01); *B32B 27/20* (2013.01); *B32B 27/286* (2013.01); *B32B 27/30* (2013.01); *B32B 27/325* (2013.01); *B32B 27/34* (2013.01); *B32B 27/36* (2013.01); *B32B 27/365* (2013.01); *B32B 38/10* (2013.01); *H01L 51/003* (2013.01); *B32B 37/02* (2013.01); *B32B 37/1292* (2013.01); *B32B 37/18* (2013.01); *B32B 2250/05* (2013.01); *B32B 2255/20* (2013.01); *B32B 2260/021* (2013.01); *B32B 2260/046* (2013.01); *B32B 2264/102* (2013.01); *B32B 2307/202* (2013.01);
(Continued)

(58) Field of Classification Search
None
See application file for complete search history.

(56) References Cited

U.S. PATENT DOCUMENTS 5,821,138 A 10/1998 Yamazaki et al.
6,846,696 B2 1/2005 Adachi et al.
(Continued)

FOREIGN PATENT DOCUMENTS

CN 001471065 A 1/2004
CN 102651458 A 8/2012
(Continued)

OTHER PUBLICATIONS

International Search Report (Application No. PCT/IB2015/051007) Dated Jun. 2, 2015.
(Continued)

*Primary Examiner* — Scott B Geyer
(74) *Attorney, Agent, or Firm* — Fish & Richardson P.C.

(57) ABSTRACT

A flexible device is provided. The hardness of a bonding layer of the flexible device is set to be higher than Shore D of 70, or preferably higher than or equal to Shore D of 80. The coefficient of expansion of a flexible substrate of the flexible device is set to be less than 58 ppm/° C., or preferably less than or equal to 30 ppm/° C.

26 Claims, 37 Drawing Sheets

(51) Int. Cl.

| | | |
|---|---|---|
| *B32B 38/10* | (2006.01) | |
| *B32B 7/12* | (2006.01) | |
| *B32B 15/08* | (2006.01) | |
| *B32B 15/18* | (2006.01) | |
| *B32B 15/20* | (2006.01) | |
| *B32B 17/00* | (2006.01) | |
| *B32B 27/20* | (2006.01) | |
| *B32B 27/28* | (2006.01) | |
| *B32B 27/30* | (2006.01) | |
| *B32B 27/32* | (2006.01) | |
| *B32B 27/34* | (2006.01) | |
| *B32B 27/36* | (2006.01) | |
| *B32B 37/02* | (2006.01) | |
| *B32B 37/18* | (2006.01) | |
| *B32B 37/12* | (2006.01) | |
| *H01L 51/52* | (2006.01) | |

(52) U.S. Cl.
CPC ........ *B32B 2307/40* (2013.01); *B32B 2307/50* (2013.01); *B32B 2307/536* (2013.01); *B32B 2307/558* (2013.01); *B32B 2310/0843* (2013.01); *B32B 2315/08* (2013.01); *B32B 2457/20* (2013.01); *H01L 51/5253* (2013.01); *H01L 2251/5338* (2013.01); *Y02E 10/549* (2013.01)

(56) References Cited

U.S. PATENT DOCUMENTS

| | | |
|---|---|---|
| 6,946,361 B2 | 9/2005 | Takayama et al. |
| 7,056,810 B2 | 6/2006 | Yamazaki et al. |
| 7,180,091 B2 | 2/2007 | Yamazaki et al. |
| 7,189,631 B2 | 3/2007 | Yamazaki et al. |
| 7,282,380 B2 | 10/2007 | Maruyama et al. |
| 7,335,573 B2 | 2/2008 | Takayama et al. |
| 7,351,300 B2 | 4/2008 | Takayama et al. |
| 7,521,383 B2 | 4/2009 | Morisue et al. |
| 7,867,907 B2 | 1/2011 | Shimomura et al. |
| 8,030,132 B2 | 10/2011 | Ogita et al. |
| 8,034,182 B2 | 10/2011 | Yamazaki et al. |
| 8,110,442 B2 | 2/2012 | Jinbo |
| 8,188,474 B2 | 5/2012 | Hatano et al. |
| 8,367,440 B2 | 2/2013 | Takayama et al. |
| 2001/0015256 A1 | 8/2001 | Yamazaki et al. |
| 2004/0004434 A1 | 1/2004 | Nishi et al. |
| 2004/0152392 A1 | 8/2004 | Nakamura |
| 2006/0207714 A1 | 9/2006 | Yamazaki et al. |
| 2007/0040492 A1 | 2/2007 | Nakamura |
| 2010/0173555 A1 | 7/2010 | Nishi et al. |
| 2011/0062434 A1 | 3/2011 | Eguchi et al. |
| 2011/0272717 A1 | 11/2011 | Nishi et al. |
| 2012/0286312 A1 | 11/2012 | Hatano et al. |
| 2013/0153877 A1 | 6/2013 | Eguchi et al. |
| 2013/0256714 A1 | 10/2013 | Nishi et al. |
| 2014/0008668 A1 | 1/2014 | Hirakata |
| 2014/0077199 A1* | 3/2014 | Yamazaki ........... H01L 27/3244 257/40 |
| 2014/0166995 A1* | 6/2014 | Lee ..................... H01L 51/0097 257/40 |
| 2014/0210112 A1* | 7/2014 | Reusch ............... H01L 51/5253 257/790 |
| 2014/0264425 A1* | 9/2014 | Chida .................... H01L 33/20 257/99 |
| 2015/0044792 A1 | 2/2015 | Aoyama et al. |

FOREIGN PATENT DOCUMENTS

| | | |
|---|---|---|
| EP | 0858110 B | 12/2006 |
| JP | 10-125931 A | 5/1998 |
| JP | 2001-272923 A | 10/2001 |
| JP | 2003-174153 A | 6/2003 |
| JP | 2004-039542 A | 2/2004 |
| JP | 2004-220870 A | 8/2004 |
| JP | 2005-302401 A | 10/2005 |
| JP | 2011-085923 A | 4/2011 |
| JP | 2012-253014 A | 12/2012 |
| JP | 2013-251191 A | 12/2013 |
| JP | 2014-029853 A | 2/2014 |
| KR | 2012-0068772 A | 6/2012 |
| KR | 2014-0005770 A | 1/2014 |
| TW | 490717 | 6/2002 |
| TW | 201126697 | 8/2011 |
| TW | 201409753 | 3/2014 |
| WO | WO-2011/034068 | 3/2011 |

OTHER PUBLICATIONS

Written Opinion (Application No. PCT/IB2015/051007) Dated Jun. 2, 2015.

\* cited by examiner

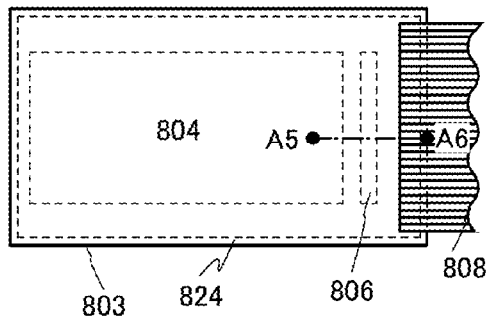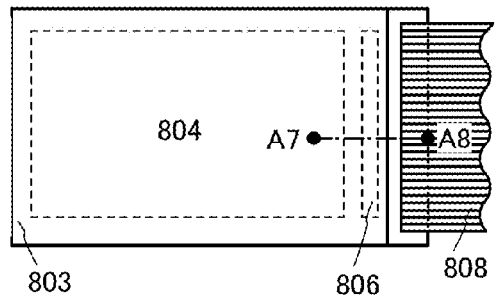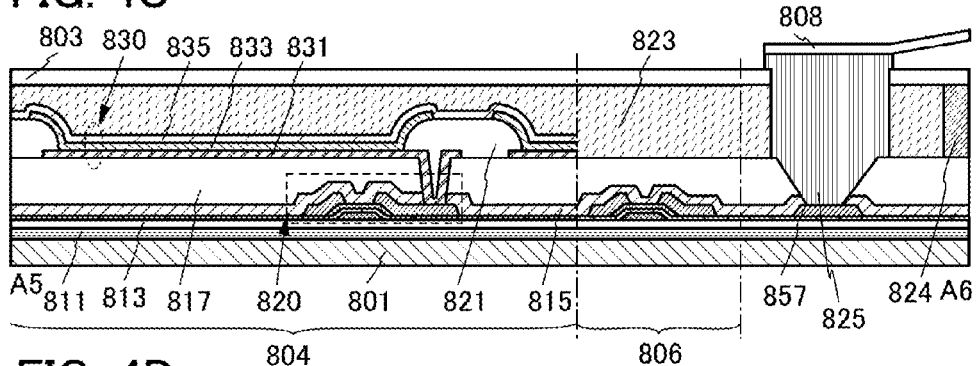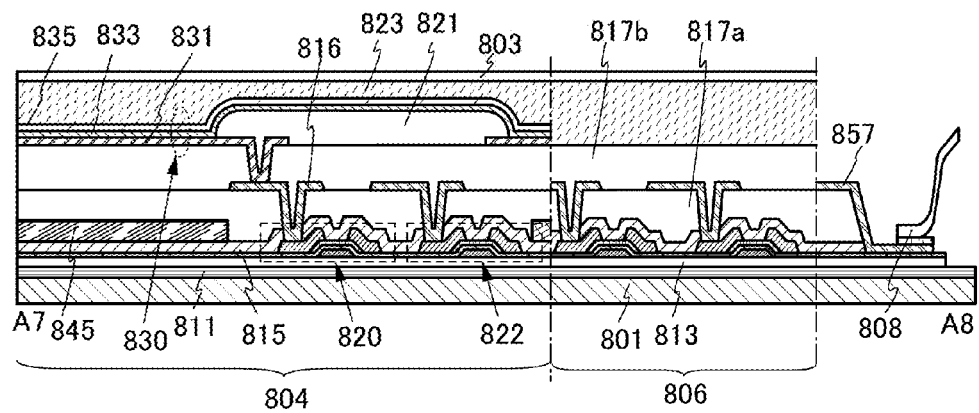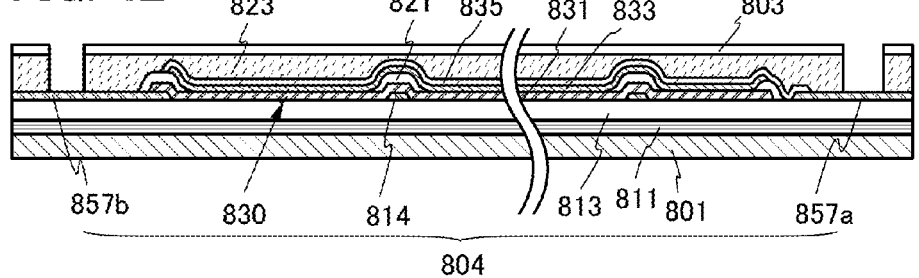

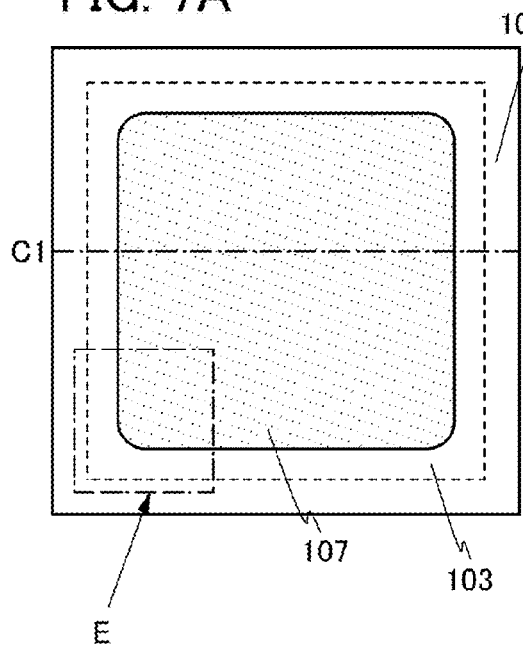
FIG. 7A
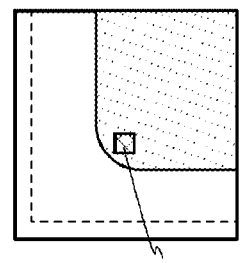
FIG. 7B1
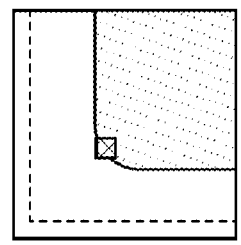
FIG. 7B2
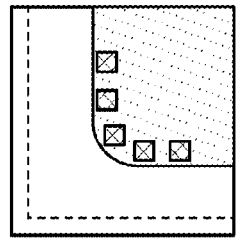
FIG. 7B3
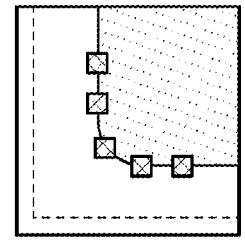
FIG. 7B4
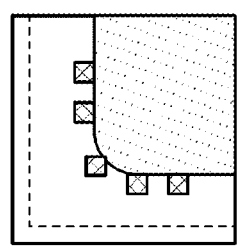
FIG. 7B5
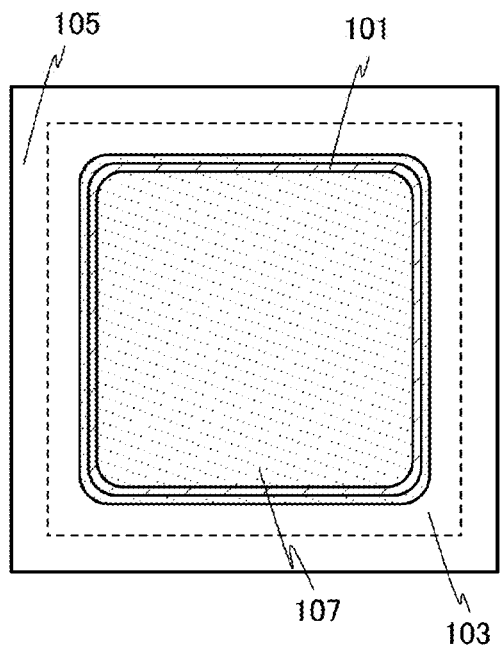
FIG. 7C FIG. 22A
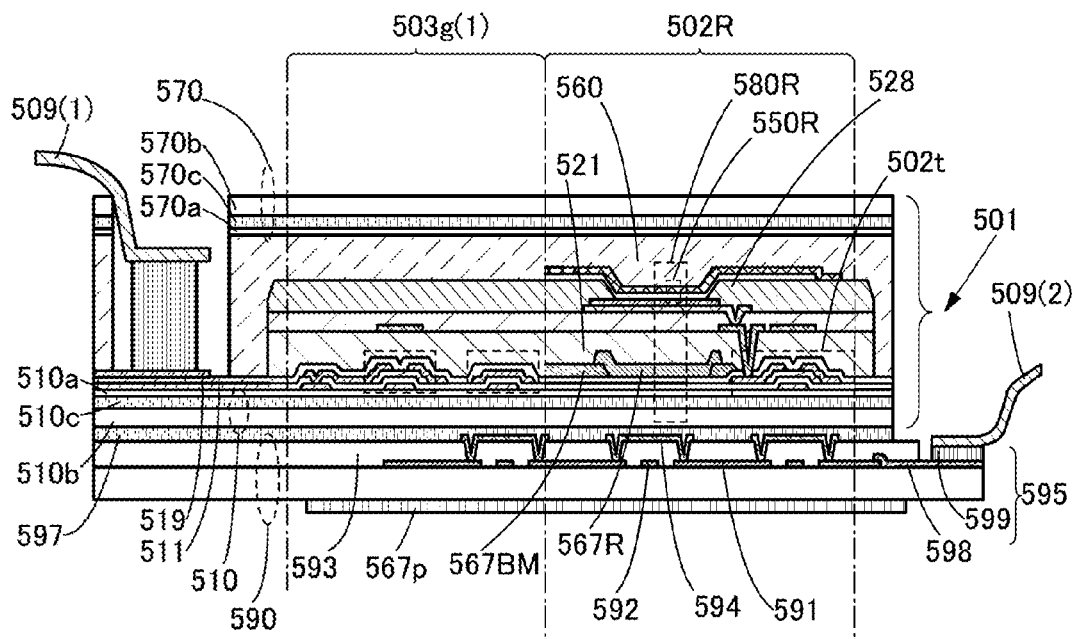
FIG. 22B
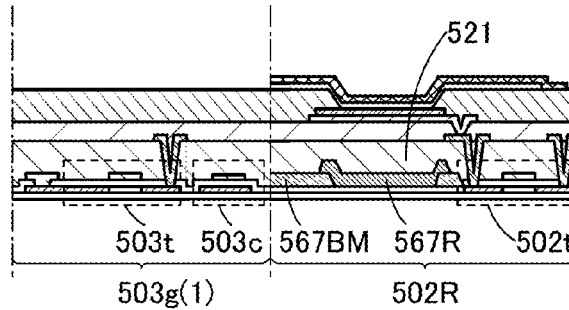
FIG. 22C FIG. 27A
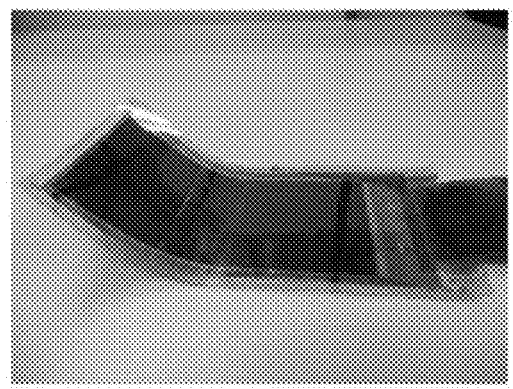
FIG. 27B
Before the bending test
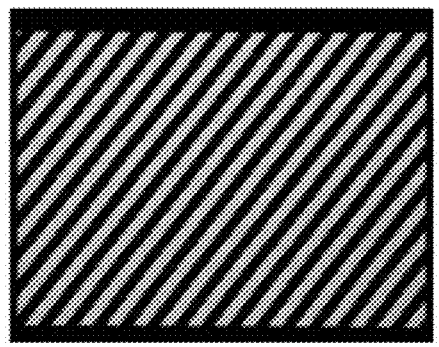
After the bending test
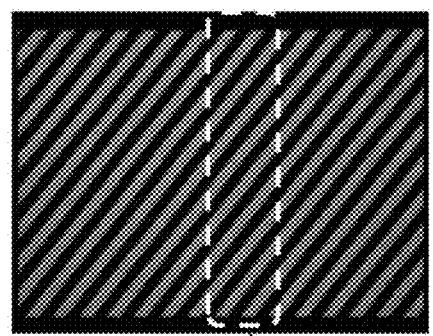
Bent portion
FIG. 27C
Before the preservation test
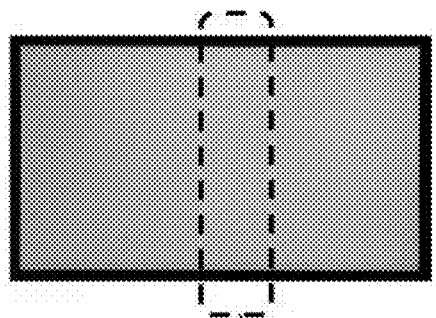
100 hours after the preservation test
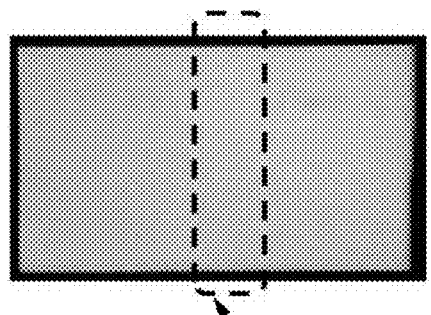
Bent portion                    Bent portion Before the bending test　　　After the bending test Bent portion Before the preservation test　　　100 hours after the preservation test Bent portion　　　Bent portion

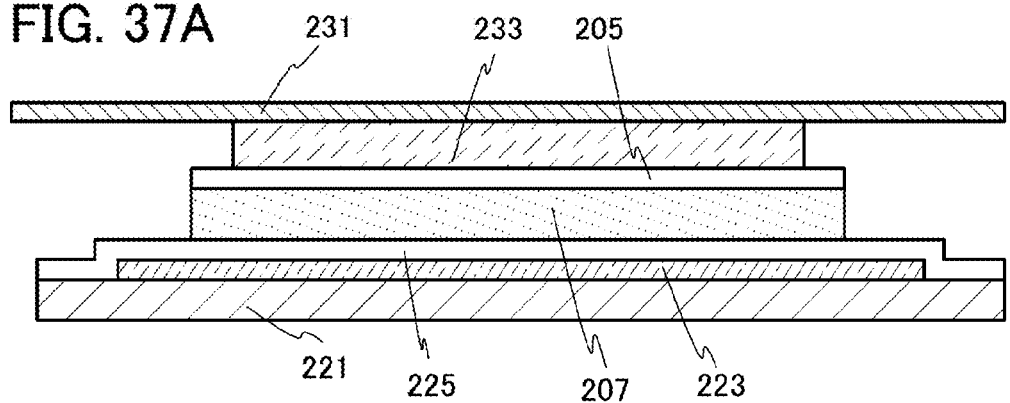
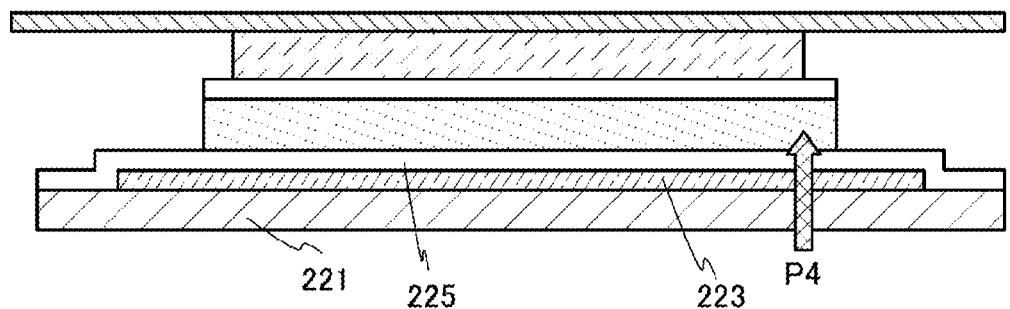
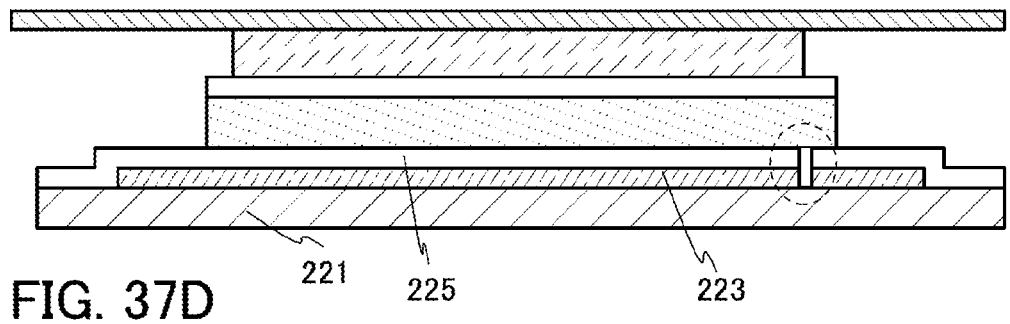
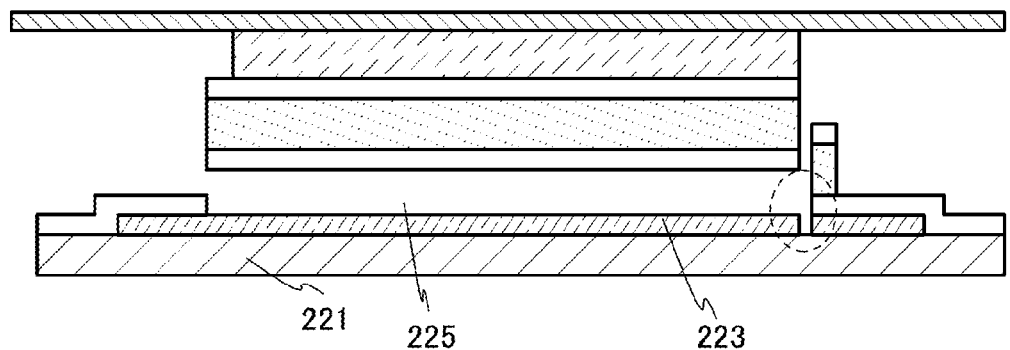

LIGHT-EMITTING DEVICE AND PEELING METHOD

TECHNICAL FIELD

One embodiment of the present invention relates to a light-emitting device, a display device, an electronic device, a lighting device, or a manufacturing method thereof. In particular, one embodiment of the present invention relates to a light-emitting device, a display device, an electronic device, or a lighting device utilizing an electroluminescence (hereinafter also referred to as EL) phenomenon, and a manufacturing method thereof. In particular, one embodiment of the present invention relates to a peeling method and a method for manufacturing a device including a peeling process.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification can include a semiconductor device, a display device, a light-emitting device, a power storage device, a storage device, a method for driving any of them, and a method for manufacturing any of them.

BACKGROUND ART

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for manufacturing a device including a flexible substrate, a technique has been developed in which a functional element such as a thin film transistor or an organic EL element is formed over a formation substrate (e.g., a glass substrate or a quartz substrate), and then the functional element is transferred to a flexible substrate. This technique needs a step of peeling a layer including the functional element from the formation substrate (also referred to as a peeling process).

For example, Patent Document 1 discloses the following peeling technique using laser ablation: a separation layer formed of amorphous silicon or the like is formed over a substrate, a layer to be peeled which is formed of a thin film element is formed over the separation layer, and the layer to be peeled is bonded to a transfer body with the use of a bonding layer. The separation layer is ablated by laser light irradiation, so that peeling is generated in the separation layer.

In addition, Patent Document 2 discloses a technique in which peeling is conducted by physical force such as human hands. In addition, Patent Document 2 discloses the following peeling technique: a metal layer is formed between a substrate and an oxide layer and peeling is generated at an interface between the oxide layer and the metal layer by utilizing weak bonding at the interface between the oxide layer and the metal layer, so that a layer to be peeled and the substrate are separated from each other.

REFERENCE

Patent Document

[Patent Document 1] Japanese Published Patent Application No. H10-125931
[Patent Document 2] Japanese Published Patent Application No. 2003-174153

DISCLOSURE OF INVENTION

One object of one embodiment of the present invention is to improve yield in a peeling process. Another object of one embodiment of the present invention is to suppress occurrence of a crack in an inorganic insulating film or the like (breaking or cracking the film) in a peeling process.

Another object of one embodiment of the present invention is to improve yield in a manufacturing process of a device such as a semiconductor device, a light-emitting device, a display device, an electronic device, or a lighting device. In particular, another object of one embodiment of the present invention is to improve yield in a manufacturing process of a device such as a semiconductor device, a light-emitting device, a display device, an electronic device, or a lighting device which is lightweight, thin, or flexible. Another object of one embodiment of the present invention is to suppress occurrence of a crack in an inorganic insulating film or the like in a manufacturing process of a device. Another object of one embodiment of the present invention is to provide a method for manufacturing a device with high mass productivity.

Another object of one embodiment of the present invention is to provide a highly reliable device. Another object of one embodiment of the present invention is to provide a device with high resistance to repeated bending. Another object of one embodiment of the present invention is to provide a novel semiconductor device, light-emitting device, display device, electronic device, or lighting device.

Another object of one embodiment of the present invention is to reduce the amount of dust generated in a manufacturing process of the device. Another object of one embodiment of the present invention is to suppress entry of impurities in a manufacturing process of the device. Another object of one embodiment of the present invention is to improve alignment accuracy at the time of attachment of substrates in a manufacturing process of the device. Another object of one embodiment of the present invention is to provide a novel peeling method or a novel method for manufacturing the device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a first substrate, a second substrate, an element layer, a first bonding layer, a second bonding layer, and an insulating layer. The first substrate and the second substrate have flexibility. The element layer is provided between the first substrate and the second substrate. The element layer includes a light-emitting element. The insulating layer is provided between the first substrate and the element layer. The first bonding layer is provided between the first substrate and the insulating layer. The second bonding layer is provided between the second substrate and the element layer. The first bonding layer includes a first portion. The second bonding layer includes a second portion. Hardness of the first portion is higher than Shore D (also referred to as shore D hardness) of 70. Hardness of the second portion is higher than shore D of 70. The first substrate includes a third portion. The second substrate includes a fourth portion. A coefficient of expansion of the third portion is less than 58 ppm/° C. A coefficient of expansion of the fourth portion is less than 58 ppm/° C.

In the above light-emitting device, it is preferable that the hardness of the first portion be higher than or equal to Shore D of 80 and that the hardness of the second portion be higher than or equal to Shore D of 80.

In the above light-emitting device, it is preferable that the coefficient of expansion of the third portion be less than or equal to 30 ppm/° C. and that the coefficient of expansion of the fourth portion be less than or equal to 30 ppm/° C.

Another embodiment of the present invention is a peeling method including a first step, a second step, a third step, a fourth step, a fifth step, and a sixth step. The first step includes a step of forming a peeling layer over a first substrate. The second step includes a step of forming a layer to be peeled over the peeling layer. The layer to be peeled includes a first layer. The first layer includes a region in contact with the peeling layer. The third step includes a step of disposing a bonding layer so as to overlap with the peeling layer and the layer to be peeled. A sheet-like adhesive is used for the bonding layer. The fourth step includes a step of curing the bonding layer. The fifth step includes a step of removing a first portion. The first layer includes the first portion. The first portion includes a region overlapping with the peeling layer and the bonding layer. The sixth step includes a step of separating the peeling layer and the layer to be peeled from each other.

In the above peeling method, in the fifth step, the first portion is preferably removed by laser light irradiation.

In the above peeling method, in the third step, the peeling layer and the bonding layer preferably overlap with each other so that an end portion of the bonding layer is positioned on an inner side than an end portion of the peeling layer.

In the above peeling method, the bonding layer cured in the fourth step preferably has a portion having hardness higher than Shore D of 70. It is particularly preferable that the bonding layer have a portion having hardness higher than or equal to Shore D of 80.

In addition, the light-emitting device of one embodiment of the present invention includes a first flexible substrate; a second flexible substrate; an element layer including a light-emitting element, between the first flexible substrate and the second flexible substrate; an insulating layer between the first flexible substrate and the element layer; a first bonding layer between the first flexible substrate and the insulating layer; and a second bonding layer between the second flexible substrate and the element layer. The light-emitting element includes a layer containing a light-emitting organic compound between a pair of electrodes.

In the above light-emitting device, at least one of hardness of the first bonding layer and hardness of the second bonding layer is preferably higher than Shore D of 70, or further preferably higher than or equal to Shore D of 80.

In the above light-emitting device, at least one of the coefficient of expansion of the first flexible substrate and the coefficient of expansion of the second flexible substrate is preferably less than 58 ppm/° C., or further preferably less than or equal to 30 ppm/° C.

A peeling method according to one embodiment of the present invention includes a first step of forming a peeling layer over a first substrate, a second step of forming a layer to be peeled including a first layer in contact with the peeling layer over the peeling layer, a third step of curing a bonding layer in an overlapping manner with the peeling layer and the layer to be peeled, a fourth step of removing part of the first layer overlapping with the peeling layer and the bonding layer to form a peeling starting point, and a fifth step of separating the peeling layer and the layer to be peeled. Note that a sheet-like adhesive is used for the bonding layer.

In the above peeling method, the peeling starting point is preferably formed by laser light irradiation.

In the above peeling method, the layer to be peeled preferably includes an inorganic insulating film. For example, the first layer may be an inorganic insulating film.

In the above peeling method, the peeling layer and the bonding layer preferably overlap with each other so that an end portion of the bonding layer is positioned on an inner side than an end portion of the peeling layer.

In the above peeling method, the hardness of the bonding layer in a cured state is preferably higher than Shore D of 70, or further preferably higher than or equal to Shore D of 80.

Note that the light-emitting device in this specification includes, in its category, a display device using a light-emitting element. Furthermore, the light-emitting device may be included in a module in which a light-emitting element is provided with a connector such as an anisotropic conductive film or a TCP (tape carrier package); a module having a TCP at the tip of which a printed wiring board is provided; and a module in which an IC (integrated circuit) is directly mounted on a light-emitting element by a COG (chip on glass) method. Moreover, lighting equipment or the like may include the light-emitting device.

According to one embodiment of the present invention, yield in a peeling process can be improved. According to one embodiment of the present invention, occurrence of a crack in an inorganic insulating film or the like in a peeling process can be suppressed.

Moreover, according to one embodiment of the present invention, yield in a manufacturing process of a device such as a semiconductor device, a light-emitting device, a display device, an electronic device, or a lighting device can be improved. In particular, yield in a manufacturing process of a device such as a semiconductor device, a light-emitting device, a display device, an electronic device, or a lighting device which is lightweight, thin, or flexible can be improved. According to one embodiment of the present invention, occurrence of a crack in an inorganic insulating film or the like in a manufacturing process of the device can be suppressed. According to one embodiment of the present invention, a method for manufacturing a device with high mass productivity can be provided.

In addition, according to one embodiment of the present invention, a highly reliable device can be provided. According to one embodiment of the present invention, a device with high resistance to repeated bending can be provided. According to one embodiment of the present invention, a novel device such as a semiconductor device, a light-emitting device, a display device, an electronic device, or a lighting device can be provided.

Furthermore, according to one embodiment of the present invention, the amount of dust generated in a manufacturing process of the device can be reduced. According to one embodiment of the present invention, entry of impurities in a manufacturing process of the device can be suppressed. According to one embodiment of the present invention, alignment accuracy at the time of attachment of substrates in a manufacturing process of the device can be improved. According to one embodiment of the present invention, a novel peeling method or a novel method for manufacturing the device can be provided.

Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF DRAWINGS

FIGS. 4A to 4E illustrate examples of a light-emitting device.

FIGS. 7A, 7B1, 7B2, 7B3, 7B4, 7B5, and 7C illustrate a peeling method.

FIGS. 22A to 22C illustrate examples of a touch panel.

FIGS. 27A to 27C show results of a bending test and a preservation test.

FIGS. 37A to 37D illustrate a method for manufacturing a light-emitting device.

BEST MODE FOR CARRYING OUT THE INVENTION

Figure 1A:
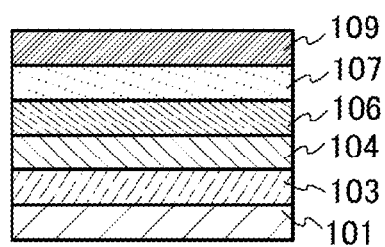
FIGS. 1A to 1F illustrate an example of a method for manufacturing a light-emitting device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

Embodiment 1

In this embodiment, a light-emitting device of one embodiment of the present invention and a manufacturing method thereof will be described with reference to FIGS. 1A to 1F, FIGS. 2A to 2E, FIGS. 3A to 3D, and FIGS. 4A to 4E.

A layer to be peeled can be formed over a formation substrate, peeled off from the formation substrate, and then transferred to another substrate. With this method, for example, a layer to be peeled which is formed over a formation substrate having high heat resistance can be transferred to a substrate having low heat resistance. Therefore, the manufacturing temperature of the layer to be peeled is not limited by the substrate having low heat resistance. Moreover, the layer to be peeled can be transferred to a substrate or the like which is more lightweight, thin, or flexible than the formation substrate, whereby a variety of devices such as a semiconductor device, a light-emitting device, or a display device can be made lightweight, thin, and flexible.

Furthermore, electronic devices including the variety of devices, such as television devices, monitors for computers, digital cameras, digital video cameras, digital photo frames, cellular phones, portable game machines, portable information terminals, and audio reproducing devices, can be made lightweight, thin, and flexible.

A device that can be manufactured by one embodiment of the present invention includes a functional element.

Examples of the functional element include a semiconductor element such as a transistor; a light-emitting diode; a light-emitting element such as an inorganic EL element and an organic EL element; and a display element such as a liquid crystal element. For example, a semiconductor device including a transistor and a light-emitting device including a light-emitting element (here, a display device including a transistor and a light-emitting element is also included) are examples of the device that can be manufactured according to one embodiment of the present invention.

For example, an organic EL element is likely to deteriorate due to moisture or the like; therefore, reliability might be insufficient when the organic EL element is formed over an organic resin substrate having a poor moisture-proof property. Here, according to one embodiment of the present invention, a protective film having an excellent moisture-proof property is formed over a glass substrate at a high temperature, whereby the protective film can be transferred to a flexible organic resin substrate having low heat resistance and a poor moisture-proof property. A highly reliable flexible light-emitting device can be manufactured by forming an organic EL element over the protective film transferred to the organic resin substrate.

Another example is as follows: after a protective film having an excellent moisture-proof property is formed over a glass substrate at a high temperature and an organic EL element is formed over the protective film, the protective film and the organic EL element can be peeled off from the glass substrate and transferred to a flexible organic resin substrate having a low heat resistance and a poor moisture-proof property. A highly reliable flexible light-emitting device can be manufactured by transferring the protective film and the organic EL element to the organic resin substrate.

Here, two methods for manufacturing the device are described briefly. Note that in this embodiment, a method for manufacturing the device which will be described in Embodiment 2 can be referred to as appropriate.

FIGS. 1A to 1F illustrate a method for manufacturing the device in which a peeling process is performed once.

First, as illustrated in FIG. 1A, an insulating layer 104 (e.g., the above-described protective film having an excellent moisture-proof property) is formed over a formation substrate 101 with a peeling layer 103 provided therebetween. If necessary, at least part of an element layer 106 (e.g., the above-described organic EL element and the semiconductor element such as a transistor) is further formed over the insulating layer 104. Then, the element layer 106 and a substrate 109 are attached to each other with a bonding layer 107. Note that the element layer 106 may be formed partly or entirely before being attached to the substrate 109 or may be formed over the insulating layer 104 after the insulating layer 104 is transferred to a substrate 114.

Figure 1D:
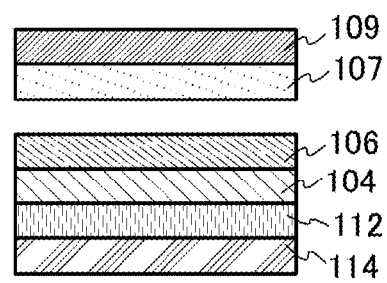
Figure 1B:
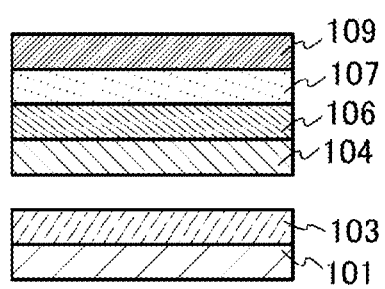

Next, as illustrated in FIG. 1B, the formation substrate 101 is peeled off from the insulating layer 104 using the peeling layer 103.

Figure 1E:
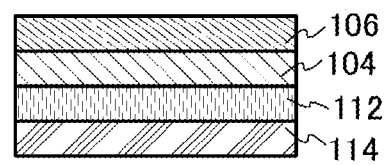
Figure 1C:
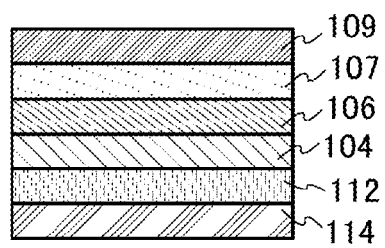

Then, as illustrated in FIG. 1C, the exposed insulating layer 104 is attached to the substrate 114 with a bonding layer 112.

Figure 1F:
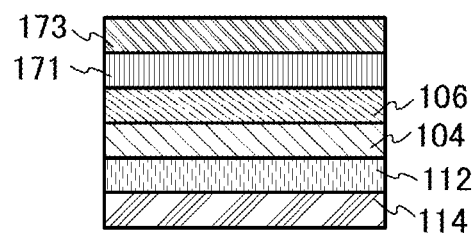

After that, the substrate 109 is removed by dissolving or plasticizing the bonding layer 107 (FIG. 1D). In FIG. 1E, when it is necessary to partly or entirely form layers of the element layer 106, the element layer 106 is formed partly or entirely. For example, the following structure may be employed: elements up to a lower electrode of the organic EL element are formed in the step of FIG. 1A and an EL layer and an upper electrode are formed over the lower electrode in the step of FIG. 1E to complete the organic EL element. As illustrated in FIG. 1F, the element layer 106 and a substrate 173 are attached to each other with a bonding layer 171 after the element layer 106 is formed. In the above manner, the device of one embodiment of the present invention can be manufactured.

FIGS. 2A to 2E illustrate a method for manufacturing the device in which a peeling process is performed twice.

Figure 2A:
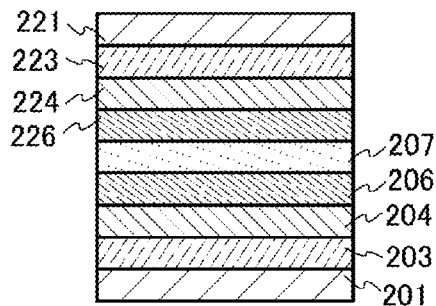
FIGS. 2A to 2E illustrate an example of a method for manufacturing a light-emitting device.

First, an insulating layer 204 (e.g., the above-described protective film having an excellent moisture-proof property) is formed over a formation substrate 201 with a peeling layer 203 provided therebetween. An element layer 206 (e.g., a layer including the above-described semiconductor element such as a transistor and the element such as an organic EL element) is further formed over the insulating layer 204. In addition, an insulating layer 224 (e.g., the above-described protective film having an excellent moisture-proof property) is formed over a formation substrate 221 with a peeling layer 223 provided therebetween. Furthermore, a functional layer 226 (e.g., a layer including a coloring layer, a light-blocking layer, and the like, which may include the above-described semiconductor element such as a transistor and the element such as an organic EL element) is formed over the insulating layer 224. Then, the sides of the two formation substrates on each of which the peeling layer is formed are faced each other to attach the element layer 206 and the functional layer 226 each other with a bonding layer 207 (FIG. 2A).

Figure 2B:
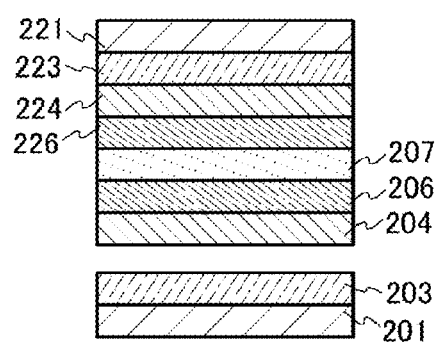
Figure 2C:
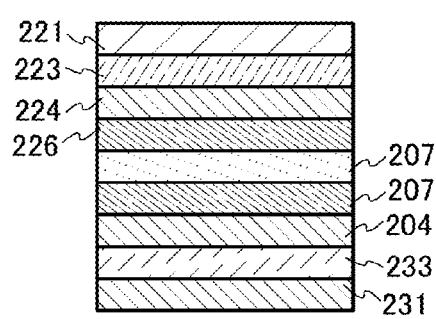

Next, as illustrated in FIG. 2B, the formation substrate 201 is peeled off from the insulating layer 204 using the peeling layer 203. Then, as illustrated in FIG. 2C, the exposed insulating layer 204 is attached to a substrate 231 with a bonding layer 233.

Figure 2D:
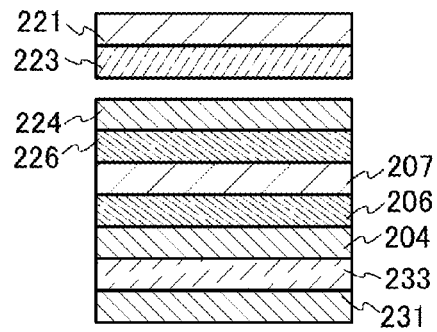
Figure 2E:
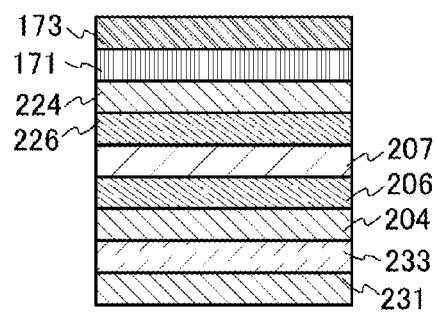

Next, as illustrated in FIG. 2D, the formation substrate 221 is peeled off from the insulating layer 224 using the peeling layer 223. Then, as illustrated in FIG. 2E, the exposed insulating layer 224 is attached to the substrate 173 with the bonding layer 171. In the above manner, the device of one embodiment of the present invention can be manufactured.

In the above two methods for manufacturing the device, a crack (breaking or cracking the layer or the film) might occur in the insulating layer, the element layer, and films (typically an inorganic insulating film) of the functional layer at the time of peeling the formation substrate. Even when the crack occurs at the time of peeling is not fatal, the number of cracks or their sizes might be increased depending on subsequent manufacturing steps (e.g., heat treatment), the use of the device after manufacture, or the like. The occurrence of a crack in the device results in a malfunction of the elements, a reduction of lifetime, and the like and accordingly the reliability of the device might be reduced.

Thus, according to one embodiment of the present invention, the hardness of the bonding layer used for the device is set to be higher than Shore D of 70. Accordingly, it is possible to suppress occurrence of a crack in the insulating layer, the element layer, and films (typically an inorganic insulating film) of the functional layer at the time of peeling the formation substrate. Furthermore, a flexible device to which this structure is applied is preferable because of its high resistance to repeated bending. For example, the device of one embodiment of the present invention has a minimum curvature radius when bent, which can be greater than or equal to 0.1 mm and less than or equal to 150 mm, preferably greater than or equal to 1 mm and less than or equal to 100 mm, further preferably greater than or equal to 1 mm and less than or equal to 50 mm, or still further preferably greater than or equal to 2 mm and less than or equal to 5 mm.

For example, a bonding layer having hardness higher than Shore D of 70 may be used for at least any one of the above bonding layers 107, 112, 171, 207, and 233. It is preferable that the hardness of each bonding layer be higher than Shore D of 70.

Alternatively, according to one embodiment of the present invention, the coefficient of expansion of a flexible substrate used for the device is less than 58 ppm/° C. Accordingly, it is possible to suppress occurrence of a crack or development of the crack in the insulating layer, the element layer, the functional layer, and the like after these layers are transferred to the flexible substrate.

For example, a substrate having a coefficient of expansion less than 58 ppm/° C. may be used for at least any one of the above-described substrates 114, 173, and 231. The coefficient of expansion of each substrate is preferably less than 58 ppm/° C.

Specifically, the light-emitting device of one embodiment of the present invention includes a first flexible substrate; a second flexible substrate; an element layer between the first flexible substrate and the second flexible substrate; an insulating layer between the first flexible substrate and the element layer; a first bonding layer between the first flexible substrate and the insulating layer; and a second bonding layer between the second flexible substrate and the element layer. The element layer includes a light-emitting element.

In one embodiment of the present invention, the hardness of the first bonding layer is preferably higher than Shore D of 70, or further preferably higher than or equal to Shore D of 80.

In a similar manner, in one embodiment of the present invention, the hardness of the second bonding layer is preferably higher than Shore D of 70, or further preferably higher than or equal to Shore D of 80.

Although in one embodiment of the present invention, the hardness of both the first bonding layer and the second bonding layer is preferably higher than Shore D of 70, or further preferably higher than or equal to Shore D of 80, one embodiment of the present invention is not limited thereto. The hardness of either the first bonding layer or the second bonding layer may be higher than Shore D of 70. Alternatively, the hardness of both the first bonding layer and the hardness of the second bonding layer may be lower than or equal to Shore D 70 in some cases where, for example, a layer in which a crack occurs easily is not used for the element layer or the insulating layer.

In one embodiment of the present invention, the coefficient of expansion of the first flexible substrate is preferably less than 58 ppm/° C., or further preferably less than or equal to 30 ppm/° C.

In a similar manner, in one embodiment of the present invention, the coefficient of expansion of the second flexible substrate is preferably less than 58 ppm/° C., or further preferably less than or equal to 30 ppm/° C.

Although in one embodiment of the present invention, the coefficients of expansion of both the first flexible substrate and the second flexible substrate are preferably less than 58 ppm/° C., or further preferably less than or equal to 30 ppm/° C., one embodiment of the present invention is not limited thereto. The coefficient of expansion of either the first flexible substrate or the second flexible substrate may be less than 58 ppm/° C. Alternatively, the coefficient of expansions of both the first flexible substrate and the second flexible substrate may be greater than or equal to 58 ppm/° C. in some cases where, for example, a layer in which crack occurs easily is not used for the element layer or the insulating layer.

Specific examples of a light-emitting device using the light-emitting element to which one embodiment of the present invention is applied are described below.

Specific Example 1

Figure 3A:
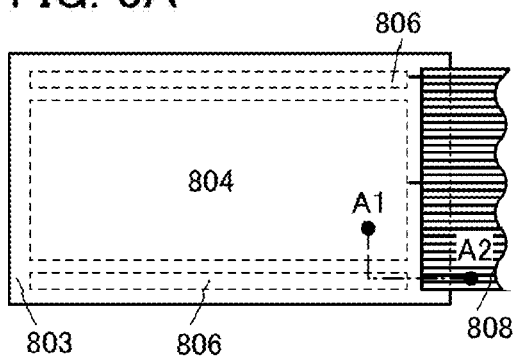
FIGS. 3A to 3D illustrate examples of a light-emitting device.
Figure 3B:
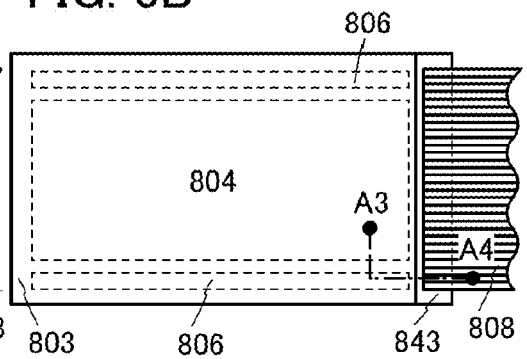
Figure 3C:
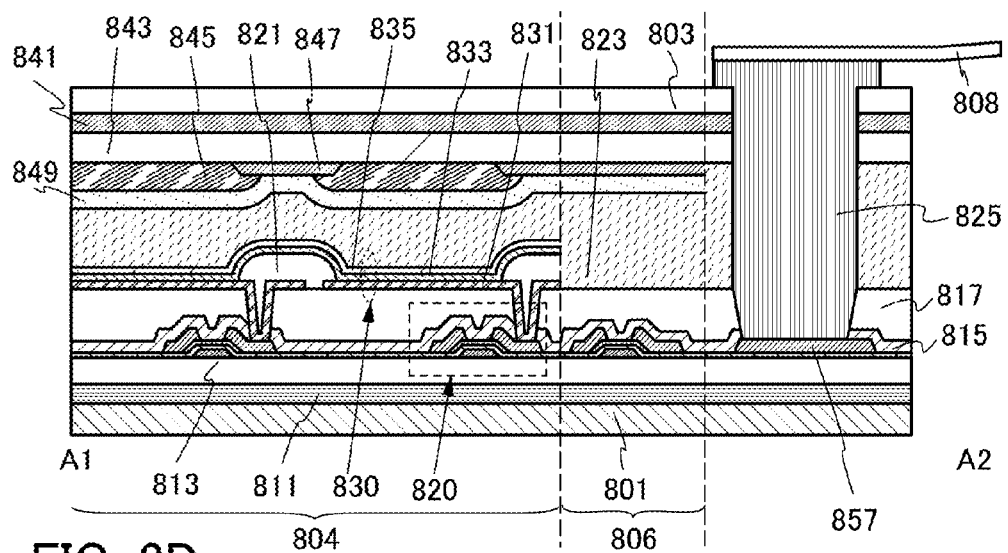

FIG. 3A is a plan view of the light-emitting device, and FIG. 3C is an example of a cross-sectional view taken along the dashed-dotted line A1-A2 in FIG. 3A. The light-emitting device in Specific Example 1 is a top-emission light-emitting device using a color filter method. In this embodiment, the light-emitting device can have a structure in which sub-pixels of three colors of, for example, red (R), green (G), and blue (B) express one color, a structure in which sub-pixels of four colors of R, G, B, and white (W) express one color, or the like. The color element is not particularly limited and colors other than R, G, B, and W may be used. For example, yellow, cyan, magenta, and the like may be used.

The light-emitting device illustrated in FIG. 3A includes a light-emitting portion 804, a driver circuit portion 806, and a flexible printed circuit (FPC) 808. Light-emitting elements and transistors included in the light-emitting portion 804 and the driver circuit portion 806 are sealed with a substrate 801, a substrate 803, and a bonding layer 823.

The light-emitting device in FIG. 3C includes the substrate 801, a bonding layer 811, an insulating layer 813, a plurality of transistors, a conductive layer 857, an insulating layer 815, an insulating layer 817, a plurality of light-emitting elements, an insulating layer 821, the bonding layer 823, an overcoat 849, a coloring layer 845, a light-blocking layer 847, an insulating layer 843, a bonding layer 841, and the substrate 803. The bonding layer 823, the overcoat 849, the insulating layer 843, the bonding layer 841, and the substrate 803 transmit visible light.

The light-emitting portion 804 includes a transistor 820 and a light-emitting element 830 over the substrate 801 with the bonding layer 811 and the insulating layer 813 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. It is preferable that the lower electrode 831 reflect visible light. The upper electrode 835 transmits visible light.

In addition, the light-emitting portion 804 includes the coloring layer 845 overlapping with the light-emitting element 830 and the light-blocking layer 847 overlapping with the insulating layer 821. The coloring layer 845 and the light-blocking layer 847 are covered with the overcoat 849. The space between the light-emitting element 830 and the overcoat 849 is filled with the bonding layer 823.

The insulating layer 815 has an effect of suppressing diffusion of impurities to a semiconductor included in the transistor. As the insulating layer 817, an insulating layer having a planarization function is preferably selected in order to reduce surface unevenness due to the transistor.

The driver circuit portion 806 includes a plurality of transistors over the substrate 801 with the bonding layer 811 and the insulating layer 813 provided therebetween. In FIG. 3C, one transistor included in the driver circuit portion 806 is illustrated.

The insulating layer 813 and the substrate 801 are attached to each other with the bonding layer 811. The insulating layer 843 and the substrate 803 are attached to each other with the bonding layer 841. It is preferable to use films having an excellent moisture-proof property as the insulating layer 813 and the insulating layer 843, in which case entry of an impurity such as moisture into the light-emitting element 830 or the transistor 820 can be suppressed, leading to improved reliability of the light-emitting device.

The conductive layer 857 is electrically connected to an external input terminal through which a signal (e.g., a video signal, a clock signal, a start signal, a reset signal, or the like) or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the light-emitting device in FIG. 3C, the FPC 808 is located over the substrate 803. A connector 825 is connected to the conductive layer 857 through an opening provided in the substrate 803, the bonding layer 841, the insulating layer 843, the bonding layer 823, the insulating layer 817, and the insulating layer 815. Moreover, the connector 825 is connected to the FPC 808. The FPC 808 and the conductive layer 857 are electrically connected to each other with the connector 825 provided therebetween. In the case where the conductive layer 857 and the substrate 803 overlap with each other, the conductive layer 857, the connector 825, and the FPC 808 are electrically connected to one another by forming an opening in the substrate 803 (or using a substrate having an opening).

In Specific Example 1, it is preferable to employ a bonding layer having hardness higher than Shore D of 70 for at least any one of the bonding layers 811, 841, and 823. It is particularly preferable to employ a bonding layer having hardness higher than Shore D of 70 for each of the bonding layers 811, 841, and 823. Accordingly, it is possible to suppress occurrence of a crack in the insulating layer 813, the insulating layer 843, the transistor, the light-emitting element, and the like at the time of manufacturing the light-emitting device. Furthermore, the light-emitting device can have high resistance to repeated bending.

Moreover, in Specific Example 1, a substrate having a coefficient of expansion less than 58 ppm/° C. is preferably used for at least either the substrate 801 or 803, or further preferably used for both of the substrates. Accordingly, it is possible to suppress occurrence of a crack or development of the crack in the insulating layer 813, the insulating layer 843, the transistor, the light-emitting element, and the like that are transferred to the substrate 801 and the substrate 803. Furthermore, the light-emitting device can have high resistance to repeated bending.

Specific Example 2

Figure 3D:
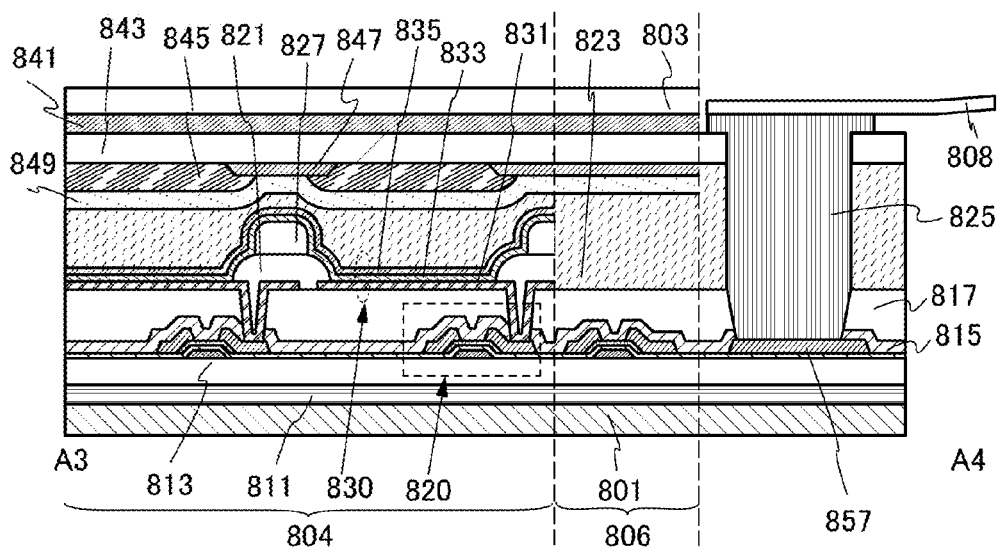

FIG. 3B is a plan view of the light-emitting device, and FIG. 3D is an example of a cross-sectional view taken along the dashed-dotted line A3-A4 in FIG. 3B. The light-emitting device in Specific Example 2 is a top-emission light-emitting device using a color filter method, which differs from the light-emitting device in Specific Example 1. Here, only different points from those of Specific Example 1 are described and the description of the same points as Specific Example 1 is omitted.

The light-emitting device illustrated in FIG. 3D differs from the light-emitting device in FIG. 3C in the following points.

The light-emitting device in FIG. 3D includes a spacer 827 over the insulating layer 821. The spacer 827 can adjust the distance between the substrate 801 and the substrate 803.

In addition, in the light-emitting device in FIG. 3D, the substrate 801 differs from the substrate 803 in size. The FPC 808 is located over the insulating layer 843 and does not overlap with the substrate 803. The connector 825 is connected to the conductive layer 857 through an opening provided in the insulating layer 843, the bonding layer 823, the insulating layer 817, and the insulating layer 815. Since it is not necessary to form the opening in the substrate 803, the material of the substrate 803 is not limited.

Specific Example 3

FIG. 4A is a plan view of the light-emitting device, and FIG. 4C is an example of a cross-sectional view taken along the dashed-dotted line A5-A6 in FIG. 4A. The light-emitting device in Specific Example 3 is a top-emission light-emitting device using a separate coloring method.

The light-emitting device illustrated in FIG. 4A includes the light-emitting portion 804, the driver circuit portion 806, and the FPC 808. A light-emitting element and transistors included in the light-emitting portion 804 and the driver circuit portion 806 are sealed with the substrate 801, the substrate 803, a frame-shaped bonding layer 824, and the bonding layer 823.

The light-emitting device in FIG. 4C includes the substrate 801, the bonding layer 811, the insulating layer 813, a plurality of transistors, the conductive layer 857, the insulating layer 815, the insulating layer 817, a plurality of light-emitting elements, the insulating layer 821, the bonding layer 823, the frame-shaped bonding layer 824, and the substrate 803. The bonding layer 823 and the substrate 803 transmit visible light.

The frame-shaped bonding layer 824 preferably has a better moisture-proof property than the bonding layer 823. Accordingly, entry of an impurity such as moisture into the light-emitting device from the outside can be suppressed. Thus, the light-emitting device can be highly reliable.

In Specific Example 3, light emitted from the light-emitting element 830 is extracted from the light-emitting device through the bonding layer 823. For this reason, the bonding layer 823 preferably has a more excellent light-transmitting property than the frame-shaped bonding layer 824. In addition, the bonding layer 823 preferably has a higher refractive index than the frame-shaped bonding layer 824. Furthermore, the volume of the bonding layer 823 is preferably less reduced by curing than that of the frame-shaped bonding layer 824.

The light-emitting portion 804 includes the transistor 820 and the light-emitting element 830 over the substrate 801 with the bonding layer 811 and the insulating layer 813 provided therebetween. The light-emitting element 830 includes the lower electrode 831 over the insulating layer 817, the EL layer 833 over the lower electrode 831, and the upper electrode 835 over the EL layer 833. The lower electrode 831 is electrically connected to the source electrode or the drain electrode of the transistor 820. The end portion of the lower electrode 831 is covered with the insulating layer 821. It is preferable that the lower electrode 831 reflect visible light. The upper electrode 835 transmits visible light.

The driver circuit portion 806 includes a plurality of transistors over the substrate 801 with the bonding layer 811 and the insulating layer 813 provided therebetween. In FIG. 4C, one transistors included in the driver circuit portion 806 is illustrated.

The insulating layer 813 and the substrate 801 are attached to each other with the bonding layer 811. It is preferable to use films having an excellent moisture-proof property as the insulating layer 813, in which case entry of an impurity such as moisture into the light-emitting element 830 or the transistor 820 can be suppressed, leading to improved reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. Here, an example is described in which the conductive layer 857 is formed using the same material and the same step(s) as those of the electrodes of the transistor 820.

In the light-emitting device in FIG. 4C, the FPC 808 is located over the substrate 803. The connector 825 is connected to the conductive layer 857 through an opening provided in the substrate 803, the bonding layer 823, the insulating layer 817, and the insulating layer 815. Moreover, the connector 825 is connected to the FPC 808. The FPC 808 and the conductive layer 857 are electrically connected to each other with the connector 825 provided therebetween.

In Specific Example 3, it is preferable to employ a bonding layer having hardness higher than Shore D of 70 for at least either the bonding layer 811 or 823, or further preferably for both of the bonding layers. Accordingly, it is possible to suppress occurrence of a crack in the insulating layer 813, the transistor, the light-emitting element, and the like at the time of manufacturing the light-emitting device. Furthermore, the light-emitting device can have high resistance to repeated bending.

Moreover, in Specific Example 3, a substrate having a coefficient of expansion less than 58 ppm/° C. is preferably used for at least either the substrate 801 or 803, or further preferably used for both of the substrates. Accordingly, it is possible to suppress occurrence of a crack or development of the crack in the insulating layer 813, the transistor, the light-emitting element, and the like that are transferred to the substrate 801. Furthermore, the light-emitting device can have high resistance to repeated bending.

Specific Example 4

FIG. 4B is a plan view of the light-emitting device, and FIG. 4D is an example of a cross-sectional view taken along the dashed-dotted line A7-A8 in FIG. 4B. The light-emitting device in Specific Example 4 is a bottom-emission light-emitting device using a color filter method.

The light-emitting device in FIG. 4D includes the substrate 801, the bonding layer 811, the insulating layer 813, a plurality of transistors, the conductive layer 857, the insulating layer 815, the coloring layer 845, an insulating layer 817a, an insulating layer 817b, a conductive layer 816, a plurality of light-emitting elements, the insulating layer 821, the bonding layer 823, and the substrate 803. The substrate 801, the bonding layer 811, the insulating layer 813, the insulating layer 815, the insulating layer 817a, and the insulating layer 817b transmit visible light.

The light-emitting portion 804 includes the transistor 820, a transistor 822, and the light-emitting element 830 over the substrate 801 with the bonding layer 811 and the insulating layer 813 provided therebetween. The light-emitting element 830 includes the lower electrode 831 over the insulating layer 817, the EL layer 833 over the lower electrode 831, and the upper electrode 835 over the EL layer 833. The lower electrode 831 is electrically connected to the source electrode or the drain electrode of the transistor 820. The end portion of the lower electrode 831 is covered with the insulating layer 821. It is preferable that the upper electrode 835 reflect visible light. The lower electrode 831 transmits visible light. The location of the coloring layer 845 overlapping with the light-emitting element 830 is not particularly limited and may be, for example, between the insulating layer 817a and the insulating layer 817b or between the insulating layer 815 and the insulating layer 817a.

The driver circuit portion 806 includes a plurality of transistors over the substrate 801 with the bonding layer 811 and the insulating layer 813 provided therebetween. In FIG. 4C, two transistors included in the driver circuit portion 806 is illustrated.

The insulating layer 813 and the substrate 801 are attached to each other with the bonding layer 811. It is preferable to use films having an excellent moisture-proof property as the insulating layer 813, in which case entry of an impurity such as moisture into the light-emitting element 830 or the transistors 820 and 822, leading to improved reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described. Here, an example is described in which the conductive layer 857 is formed using the same material and the same step(s) as those of the conductive layer 816.

In Specific Example 4, it is preferable to employ a bonding layer having hardness higher than Shore D of 70 for at least either the bonding layer 811 or 823, or further preferably for both of the bonding layers. Accordingly, it is possible to suppress occurrence of a crack in the insulating layer 813, the transistors, the light-emitting element, and the like at the time of manufacturing the light-emitting device. Furthermore, the light-emitting device can have high resistance to repeated bending.

Moreover, in Specific Example 4, a substrate having a coefficient of expansion less than 58 ppm/° C. is preferably used for at least either the substrate 801 or 803, or further preferably used for both of the substrates. Accordingly, it is possible to suppress occurrence of a crack or development of the crack in the insulating layer 813, the transistors, the light-emitting element, and the like that are transferred to the substrate 801. Furthermore, the light-emitting device can have high resistance to repeated bending.

Specific Example 5

FIG. 4E shows an example of a light-emitting device different from those of Specific Examples 1 to 4.

A light-emitting device in FIG. 4E includes the substrate 801, the bonding layer 811, the insulating layer 813, a conductive layer 814, a conductive layer 857a, a conductive layer 857b, the light-emitting element 830, the insulating layer 821, the bonding layer 823, and the substrate 803.

The conductive layer 857*a* and the conductive layer 857*b*, which are external connection electrodes of the light-emitting device, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be suppressed. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, or aluminum or an alloy material containing any of these materials as its main component. The thickness of the conductive layer 814 can be greater than or equal to 0.1 µm and less than or equal to 3 µm, preferably greater than or equal to 0.1 µm and less than or equal to 0.5 µm, for example.

When a paste (e.g., silver paste) is used as a material for the conductive layer electrically connected to the upper electrode 835, metal particles forming the conductive layer aggregate; therefore, the surface of the conductive layer is rough and has many gaps. Thus, even when the conductive layer is formed over the insulating layer 821, for example, it is difficult for the EL layer 833 to completely cover the conductive layer; accordingly, the upper electrode and the conductive layer are electrically connected to each other easily, which is preferable.

In Specific Example 5, it is preferable to employ a bonding layer having hardness higher than Shore D of 70 for at least either the bonding layer 811 or 823, or further preferably for both of the bonding layers. Accordingly, it is possible to suppress occurrence of a crack in the insulating layer 813, light-emitting element, and the like at the time of manufacturing the light-emitting device. Furthermore, the light-emitting device can have high resistance to repeated bending.

Moreover, in Specific Example 5, a substrate having a coefficient of expansion less than 58 ppm/° C. is preferably used for at least either the substrate 801 or 803, or further preferably used for both of the substrates. Accordingly, it is possible to suppress occurrence of a crack or development of the crack in the insulating layer 813, the light-emitting element, and the like that are transferred to the substrate 801. Furthermore, the light-emitting device can have high resistance to repeated bending.

Examples of Materials

Next, materials and the like that can be used for a light-emitting device are described. Note that description on the components already described in this specification and the like is omitted in some cases.

As materials for the substrates, glass, quartz, an organic resin, metal, an alloy, or the like can be used. The substrate through which light is extracted from the light-emitting element is formed using a material which transmits the light.

In particular, a flexible substrate is preferably used. For example, an organic resin, a glass material that is thin enough to have flexibility, metal, or an alloy can be used.

An organic resin, which has a specific gravity smaller than that of glass, is preferably used for the flexible substrate, in which case the light-emitting device can be lightweight as compared with the case where glass is used.

The substrate is preferably formed using a material with high toughness. In that case, a light-emitting device with high impact resistance that is less likely to be broken can be provided. For example, when an organic resin substrate or a thin metal or alloy substrate is used, the light-emitting device can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the light-emitting device. The thickness of a substrate using a metal material or an alloy material is preferably greater than or equal to 10 µm and less than or equal to 200 µm, or further preferably greater than or equal to 20 µm and less than or equal to 50 µm.

There is no particular limitation on a material of the metal substrate or the alloy substrate, but it is preferable to use, for example, aluminum, copper, nickel, a metal alloy such as an aluminum alloy or stainless steel.

Furthermore, when a material with high thermal emissivity is used for the substrate, the surface temperature of the light-emitting device can be prevented from rising, leading to prevention of breakage or a decrease in reliability of the light-emitting device. For example, the substrate may have a stacked-layer structure of a metal substrate and a layer with high thermal emissivity (the layer can be formed using a metal oxide or a ceramic material, for example).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material having a low coefficient of thermal expansion is preferable, and for example, a polyamide imide resin, a polyimide resin, PET, or the like can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials.

The flexible substrate may be formed by stacking a plurality of layers. When a glass layer is used, a barrier property against water and oxygen can be improved and thus a highly reliable light-emitting device can be provided.

For example, a flexible substrate in which a glass layer, a bonding layer, and an organic resin layer are stacked from the side closer to an organic EL element can be used. The thickness of the glass layer is greater than or equal to 20 µm and less than or equal to 200 µm, or preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, or preferably greater than or equal to 20 µm and less than or equal to 50 µm. Providing such an organic resin layer outside the glass layer, occurrence of a crack or a break in the glass layer can be suppressed and mechanical strength can be improved. With the substrate that includes such a composite material of a glass material and an organic resin, a highly reliable flexible light-emitting device can be provided.

As the bonding layer, various curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, a bonding sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress entry of impurities such as moisture into the functional element and can improve the reliability of the light-emitting device.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

There is no particular limitation on the structure of the transistor in the light-emitting device. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided if not necessary. In each of the above structure examples, the insulating layer 813 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. In addition, lanthanum, neodymium, germanium, or the like may be added to the metal material or the alloy. Moreover, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Furthermore, when a metal film or a metal oxide film is stacked on and in contact with an aluminum alloy film, oxidation of the aluminum alloy film can be suppressed. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element is preferably provided between a pair of insulating films having an excellent moisture-proof property. In that case, entry of an impurity such as moisture into the light-emitting element can be suppressed, leading to suppressing of a decrease in the reliability of the light-emitting device.

As an insulating film having an excellent moisture-proof property, a film containing nitrogen and silicon (e.g., a silicon nitride film, a silicon nitride oxide film, or the like), a film containing nitrogen and aluminum (e.g., an aluminum nitride film or the like), or the like can be used. Alternatively, a silicon oxide film, a silicon oxynitride film, an aluminum oxide film, or the like can be used.

For example, the water vapor transmittance of the insulating film having an excellent moisture-proof property is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], or still further preferably lower than or equal to $1\times10^{-8}$ [g/m$^2$·day].

The insulating film having an excellent moisture-proof property is preferably used for the insulating layer 813 or the insulating layer 843.

As the insulating layer 815, for example, an inorganic insulating film such as a silicon oxide film, a silicon oxynitride film, or an aluminum oxide film can be used. For example, as the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

For the insulating layer 821, an organic insulating material or an inorganic insulating material is used. As the resin, for example, a polyimide resin, a polyamide resin, an acrylic resin, a siloxane resin, an epoxy resin, a phenol resin, or the like can be used. It is particularly preferable that the insulating layer 821 be formed to have an inclined side wall with continuous curvature, using a photosensitive resin material.

There is no particular limitation on the method for forming the insulating layer 821; a photolithography method, a sputtering method, an evaporation method, a droplet discharging method (e.g., an inkjet method), a printing method (e.g., a screen printing method, an off-set printing method, or the like), or the like may be used.

The spacer 827 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 827 containing a conductive material is electrically connected to the upper electrode 835, voltage drop due to the resistance of the upper electrode 835 can be suppressed. The spacer 827 may have either a tapered shape or an inverse tapered shape.

For example, a conductive layer functioning as an electrode or a wiring of the transistor, an auxiliary electrode of the light-emitting element, or the like, which is used for the light-emitting device, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer is provided between the adjacent coloring layers. The light-blocking layer blocks light emitted from an adjacent light-emitting element to suppress color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an ITO film or a metal film such as an Ag film which is thin enough to transmit light is preferably used as the overcoat.

For the connector, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

Note that although the light-emitting device including the light-emitting element is described as an example in this embodiment, one embodiment of the present invention can be applied to various devices such as a semiconductor device, a light-emitting device, and a display device. Alternatively, one embodiment of the present invention may be a device including a touch panel.

In this specification and the like, a display element, a display device which is a device including a display element, a light-emitting element, and a light-emitting device which is a device including a light-emitting element can employ various modes or can include various elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element including a micro electro mechanical system (MEMS), a digital micromirror device (DMD), a digital micro shutter (DMS), an interferometric modulator display (IMOD) element, an MEMS shutter display element, optical interference type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of a display device having an EL element include an EL display and the like. Examples of a display device having an electron emitter include a field emission display (FED), an SED-type flat panel display (SED: surface-conduction electron-emitter display), and the like. Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display) and the like. Examples of a display device having electronic ink, ELECTRONIC LIQUID POWDER (registered trademark), or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. Furthermore, in such a case, a memory circuit such as an SRAM can be provided under the reflective electrodes, leading to lower power consumption.

For example, in this specification and the like, an active matrix method in which an active element (a non-linear element) is included in a pixel or a passive matrix method in which an active element is not included in a pixel can be used.

In the active matrix method, as an active element, not only a transistor but also a variety of active elements can be used. For example, a metal insulator metal (MIM), a thin film diode (TFD), or the like can also be used. Since these elements can be formed with a smaller number of manufacturing steps, manufacturing cost can be reduced or a yield can be improved. Alternatively, since the size of these elements is small, the aperture ratio can be improved, so that power consumption can be reduced or higher luminance can be achieved.

Since an active element is not used in the passive matrix method, the number of manufacturing steps is small, so that manufacturing cost can be reduced or a yield can be improved. Alternatively, since an active element is not used, the aperture ratio can be improved, so that power consumption can be reduced or higher luminance can be achieved, for example.

Note that an example of the case where a variety of display is performed using the display device is shown here; however, one embodiment of the present invention is not limited thereto. For example, data is not necessarily displayed. As an example, the display device may be used as a lighting device. By using the device as a lighting device, it can be used as interior lighting having an attractive design. Alternatively, in one embodiment of the present invention, it can be used as lighting from which light radiates in various directions. Further alternatively, it may be used as a light source, for example, a backlight, a front light, or the like, not the display device. In other words, it may be used as a lighting device for the display panel.

As described in this embodiment, in one embodiment of the present invention, the hardness of the bonding layers included in the device is set to be high (specifically, higher than Shore D of 70). Additionally, in one embodiment of the present invention, the coefficient of expansion of the flexible substrate included in the device is set to be small (specifically, less than 58 ppm/° C.), whereby it is possible to suppress occurrence of a crack in the inorganic insulating film or the element in the manufacturing process of the device. Moreover, even when a crack occurs in the inorganic insulating film or the element, development of the crack can be suppressed. Accordingly, a device having high reliability and high resistance to repeated bending can be achieved.

This embodiment can be combined with any other embodiment as appropriate.

Embodiment 2

In this embodiment, the peeling method of one embodiment of the present invention and a method for manufacturing the device of one embodiment of the present invention will be described with reference to FIGS. 5A to 5E, FIGS. 6A to 6D, FIGS. 7A, 7B1, 7B2, 7B3, 7B4, 7B5, and 7C, FIGS. 8A to 8D, FIGS. 9A to 9D, FIGS. 10A to 10D, FIGS. 11A to 11C, FIGS. 12A to 12I, FIGS. 13A to 13C, FIGS. 14A to 14C, FIGS. 15A to 15C, FIGS. 16A to 16C, FIGS. 17A and 17B, and FIGS. 37A to 37D.

Specifically, one embodiment of the present invention is a peeling method including a first step of forming a peeling layer over a first substrate, a second step of forming a layer to be peeled including a first layer in contact with the peeling layer over the peeling layer, a third step of curing a bonding layer in an overlapping manner with the peeling layer and the layer to be peeled, a fourth step of removing part of the first layer overlapping with the peeling layer and the bonding layer to form a peeling starting point, and a fifth step of separating the peeling layer and the layer to be peeled. Note that a sheet-like adhesive is used for the bonding layer.

According to one embodiment of the present invention, in a region where the peeling layer, the layer to be peeled, and the bonding layer in the cured state overlap with one another, part of the first layer (a layer which is included in the layer to be peeled and which is in contact with the peeling layer) is removed to form the peeling starting point. Yield of the peeling can be improved by forming the peeling starting point in the above region.

Figure 6A:
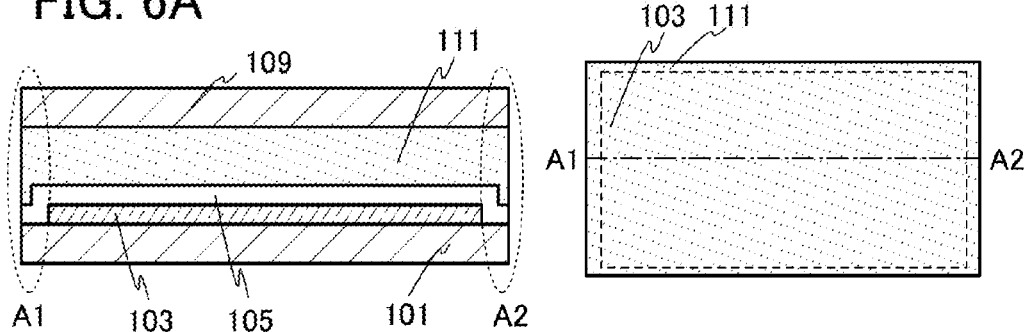
FIGS. 6A to 6D illustrate a peeling method.

Here, when the formation substrate 101 and the substrate 109 are attached to each other using a bonding layer 111 without overlapping with the peeling layer 103 as in a region surrounded by a dotted line in the cross-sectional view of FIG. 6A, yield of a subsequent peeling process might be decreased depending on a degree of adhesion between the formation substrate 101 and the substrate 109 (or adhesion between a layer over the formation substrate 101 and a layer over the substrate 109, which are in contact with the bonding layer 111). FIG. 6A illustrates a plan view from the substrate 109 side and a cross-sectional view taken along the dashed-dotted line A1-A2 in the plan view (the substrate 109 is not illustrated in the plan view).

Therefore, in one embodiment of the present invention, a sheet-like adhesive is preferably used for the bonding layer 111. The sheet-like adhesive has low fluidity and therefore can be disposed only in a desired region. Thus, the bonding layer can be inhibited from spreading outside the peeling layer and a decrease in the yield of the peeling process can be suppressed.

When a material having high fluidity is used for the bonding layer, the material that protrudes from the desired region is wasted and it takes time to remove the protrusion, for example. The sheet-like adhesive is preferably used, in which case the cost of the material and the time needed to manufacture the device can be reduced.

In the case where the device of one embodiment of the present invention includes a plurality of bonding layers, the sheet-like adhesive may be used for at least one of the bonding layers. In particular, it is preferable to use the sheet-like adhesive for all of the bonding layers.

Figure 6B:
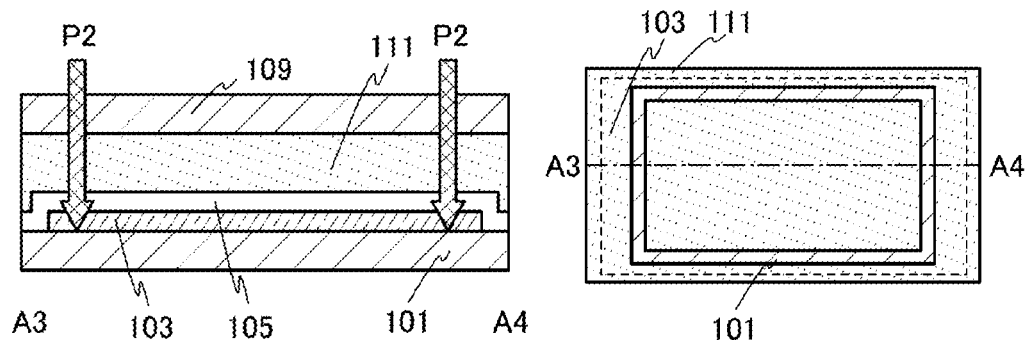
Figure 6C:
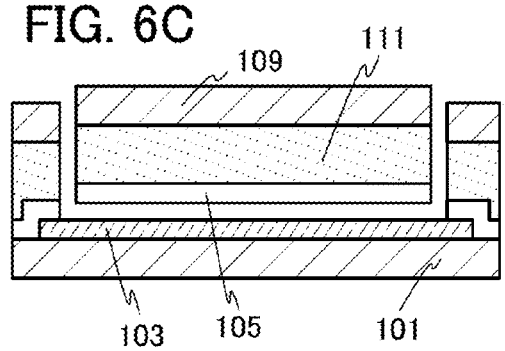

In the case where the substrate 109 on the side where the peeling layer 103 is not provided can be cut by a knife or the like, a cut can be made in the substrate 109, the bonding layer 111, and a layer 105 to be peeled (hereinafter referred to as a layer 105) (see arrows P2 in FIG. 6B). For example, a cut can be made by a sharp knife such as a cutter. Here, an example in which the peeling starting point in a form of a solid line is formed by making a cut in a frame shape in a region where the bonding layer 111 and the peeling layer 103 overlap with each other is shown. With this method, peeling can be performed in a state where the layer 105 is peeled easily from the peeling layer 103 even when the adhesion between the formation substrate 101 and the substrate 109 is high (FIG. 6C); therefore, a decrease in the yield of the peeling process can be suppressed.

However, a method for cutting the substrate 109 and the bonding layer 111 has problems in that it takes time, dust is generated, it is difficult to reuse the formation substrate 101 in which the dust (a remaining portion of the substrate 109 or the bonding layer 111) is left on the surface, or a sharp knife such as a cutter is worn. Accordingly, cutting the substrate 109 and the bonding layer 111 is not suitable for mass production in some cases. The mechanism for improving the yield of the peeling in which, for example, a sharp knife or the like is made to slide on the interface of peeling so that the peeling starting point is formed more clearly might be difficult to be applied to mass production.

Therefore, in one embodiment of the present invention, it is preferable to use the sheet-like adhesive for the boding layer to form the peeling starting point by laser light irradiation. With laser light, the substrate does not need to be cut to form the peeling starting point and thus generation of dust can be suppressed, which is preferable. In addition, the time taken to form the peeling starting point can be shortened. Moreover, the formation substrate 101 can be reused easily because dust that remains on the surface of the formation substrate 101 can be reduced. Furthermore, a method using the sheet-like adhesive for the bonding layer has advantages in that the cost can be reduced and use of the sheet-like adhesive for the bonding layer is easily applied to mass production because a sharp knife such as a cutter is not worn. Peeling can be started by pulling the end portion of any of the substrates and therefore can be easily applied to mass production.

Moreover, according to one embodiment of the present invention, in a region which is in the vicinity of an end portion of the bonding layer in the cured state and in which the peeling layer and the layer to be peeled overlap with each other, part of the first layer may be removed to form a peeling starting point. In such a case where the peeling starting point is formed in a position not overlapping with the bonding layer, it is preferable that the position at which the peeling starting point is formed be in a short distance from the bonding layer, whereby the peeling layer and the layer to be peeled can be separated surely; specifically, it is preferable that the peeling starting point be formed in a distance from the end portion of the bonding layer within 1 mm.

In the above peeling method, the peeling layer and the bonding layer preferably overlap with each other so that an end portion of the bonding layer is positioned on an inner side than an end portion of the peeling layer. When there is a region where the bonding layer does not overlap with the peeling layer, failure of peeling is likely to occur depending on the area of the region and adhesion between the bonding layer and a layer in contact therewith. Therefore, it is preferable that the bonding layer be not positioned on an outer side than the peeling layer. Note that the end portion of the bonding layer and the end portion of the peeling layer may overlap with each other.

In the above peeling method, the hardness of the bonding layer in a cured state is preferably higher than Shore D of 70, or further preferably higher than or equal to Shore D of 80. Accordingly, it is possible to suppress occurrence of a crack in the inorganic insulating film or the element in the peeling process. Moreover, even when a crack occurs in the inorganic insulating film or the element, development of the crack can be suppressed. Accordingly, a device having high reliability and high resistance to repeated bending can be achieved.

Two examples of the peeling method of one embodiment of the present invention are described below.

<First Peeling Method>

Figure 5A:
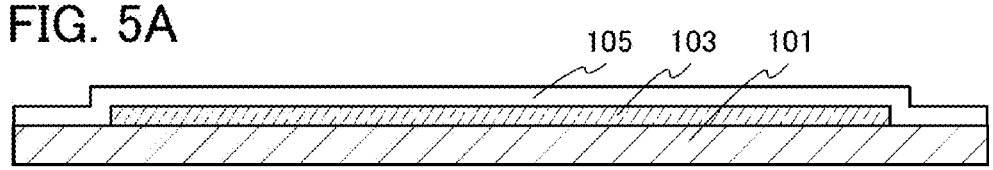
FIGS. 5A to 5E illustrate a peeling method.

First, the peeling layer 103 is formed over the formation substrate 101, and the layer 105 is formed over the peeling layer 103 (FIG. 5A). Although an example in which the peeling layer is formed to have an island shape is described here, one embodiment of the present invention is not limited to such an example. Furthermore, the layer 105 may be formed to have an island shape. In this step, the material of the separation layer 103 can be selected such that peeling occurs at the interface between the formation substrate 101 and the peeling layer 103, the interface between the peeling layer 103 and the layer 105, or in the peeling layer 103 when the layer 105 is peeled off from the formation substrate 101. Although an example in which peeling occurs at the interface between the layer 105 and the peeling layer 103 is described in this embodiment, one embodiment of the present invention is not limited to such an example depending on a material used for the peeling layer 103 or the layer 105. Note that in the case where the layer 105 has a stacked-layer structure, a layer in contact with the peeling layer 103 is particularly referred to as a first layer.

For example, in the case where the peeling layer 103 has a stacked-layer structure of a tungsten film and a tungsten oxide film, part of the peeling layer 103 (here, part of the tungsten oxide film) may remain on the layer 105 side when peeling occurs at the interface between the tungsten film and the tungsten oxide film (or the vicinity of the interface). Moreover, the peeling layer 103 remaining on the layer 105 side may be removed after peeling. For example, water or an alkaline aqueous solution can be used to remove the tungsten oxide film. In addition, for example, a mixture of ammonium water and a hydrogen peroxide solution, a hydrogen peroxide solution, an ethanol aqueous solution, or the like can be used. Since the rate at which the tungsten oxide film can be removed varies depending on the temperature of water or a solution, the water or the solution may be selected as appropriate. For example, water at a temperature of approximately 60° C. can remove the tungsten oxide film more easily than water at room temperature.

As the formation substrate 101, a substrate having at least heat resistance high enough to withstand process temperature in a manufacturing process is used. As the formation substrate 101, for example, a glass substrate, a quartz substrate, a sapphire substrate, a semiconductor substrate, a ceramic substrate, a metal substrate, a resin substrate, a plastic substrate, or the like can be used.

Note that it is preferable to use a large-sized glass substrate as the formation substrate 101 in terms of productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

In the case where a glass substrate is used as the formation substrate 101, as a base film, an insulating film such as a silicon oxide film, a silicon oxynitride film, a silicon nitride film, or a silicon nitride oxide film is preferably formed between the formation substrate 101 and the separation layer 103, in which case contamination from the glass substrate can be prevented.

The peeling layer 103 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The peeling layer 103 is preferably formed using a high-melting point metal material such as tungsten, titanium, or molybdenum, in which case the degree of freedom of the process for forming the layer 105 can be increased.

The peeling layer 103 can be formed by, for example, a sputtering method, a plasma CVD method, a coating method (including a spin coating method, a droplet discharging method, a dispensing method, and the like), a printing method, or the like. The thickness of the peeling layer 103 is, for example, greater than or equal to 10 nm and less than or equal to 200 nm, or preferably greater than or equal to 20 nm and less than or equal to 100 nm.

In the case where the peeling layer 103 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the peeling layer 103 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the peeling layer 103 is changed by the plasma treatment or heat treatment, whereby adhesion between the peeling layer 103 and the insulating layer formed later can be controlled.

Note that the peeling layer is not necessary in the case where peeling at the interface between the formation substrate and the layer to be peeled is possible. For example, a glass substrate is used as the formation substrate, and an organic resin such as polyimide, polyester, polyolefin, polyamide, polycarbonate, or acrylic is formed in contact with the glass substrate. Next, adhesion between the formation substrate and the organic resin is improved by laser light irradiation or heat treatment. Then, an insulating film, a transistor, and the like are formed over the organic resin. After that, peeling at the interface between the formation substrate and the organic resin can be performed by performing laser light irradiation with higher energy density higher than the above laser light irradiation or performing heat treatment at a higher temperature than the above heat treatment. Moreover, the interface between the formation substrate and the organic resin may be soaked in a liquid to be separated when peeled.

Since the insulating film, the transistor, and the like are formed over the organic resin having low heat resistance in the above method, it is impossible to expose the substrate to high temperatures in the manufacturing process. Here, a manufacturing process at high temperatures is dispensable for a transistor including an oxide semiconductor; therefore, the transistor can be favorably formed over the organic resin.

Note that the organic resin may be used as the substrate of the device. Alternatively, the organic resin may be removed and another substrate may be attached to the exposed surface of the layer to be peeled using an adhesive.

Alternatively, peeling at the interface between a metal layer and the organic resin may be performed in the following manner: the metal layer is provided between the formation substrate and the organic resin and current is made to flow in the metal layer so that the metal layer is heated.

There is no particular limitation on a layer formed as the layer 105. In this embodiment, an insulating layer over and in contact with the peeling layer 103 is formed as the layer 105. Furthermore, a functional element may be formed over the insulating layer.

The insulating layer over the peeling layer 103 preferably has a single-layer structure or a stacked-layer structure including any of a silicon nitride film, a silicon oxynitride film, a silicon oxide film, a silicon nitride oxide film, and the like.

The insulating layer can be formed by a sputtering method, a plasma CVD method, a coating method, a printing method, or the like. For example, the insulating layer is formed at a temperature higher than or equal to 250° C. and lower than or equal to 400° C. by a plasma CVD method, whereby the insulating layer can be a dense film having an excellent moisture-proof property. Note that the thickness of the insulating layer is preferably greater than or equal to 10 nm and less than or equal to 3000 nm, or further preferably greater than or equal to 200 nm and less than or equal to 1500 nm.

Figure 5B:
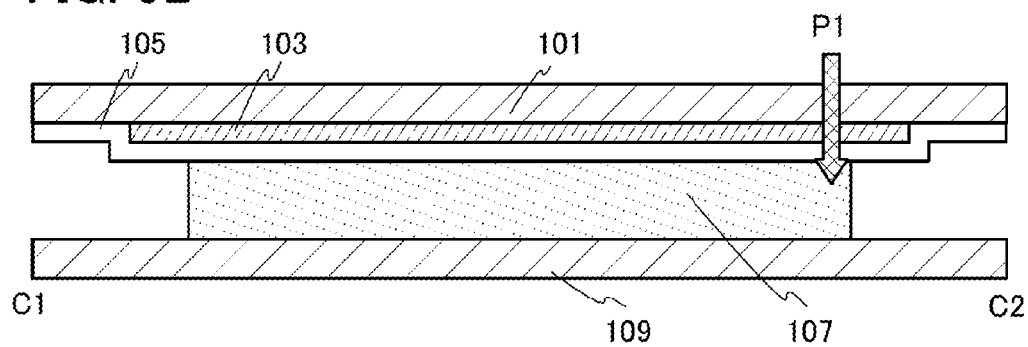

Next, the layer 105 is attached to a substrate 109 with the bonding layer 107, and the bonding layer 107 is cured (FIG. 5B). In this embodiment, a sheet-like adhesive is used for the bonding layer 107.

Here, FIG. 5B corresponds to a cross-sectional view taken along the dashed-dotted line C1-C2 in FIG. 7A. Note that FIG. 7A is a plan view viewed from the substrate 109 side (the substrate 109 is not illustrated in the plan view).

The bonding layer 107 is provided so that it overlaps with the peeling layer 103 and the layer 105. As illustrated in FIG. 7A, it is preferable that an end portion of the bonding layer 107 be not positioned on an outer side than an end portion of the peeling layer 103. When there is a region where the bonding layer 107 does not overlap with the peeling layer 103, failure of peeling is likely to occur depending on the area of the region and adhesion between the bonding layer 107 and a layer in contact therewith. Therefore, it is preferable that the bonding layer 107 be positioned on an inner side than the peeling layer 103 or the end portion of the bonding layer 107 and the end portion of the peeling layer 103 overlap with each other.

In one embodiment of the present invention, a sheet-like adhesive is used for the bonding layer 107. The sheet-like adhesive has low fluidity and therefore can be disposed only in a desired region. Thus, the bonding layer 107 can be inhibited from spreading outside the peeling layer 103 and a decrease in the yield of the peeling process can be suppressed. Thus, the yield of the peeling process can be improved.

Figure 6D:
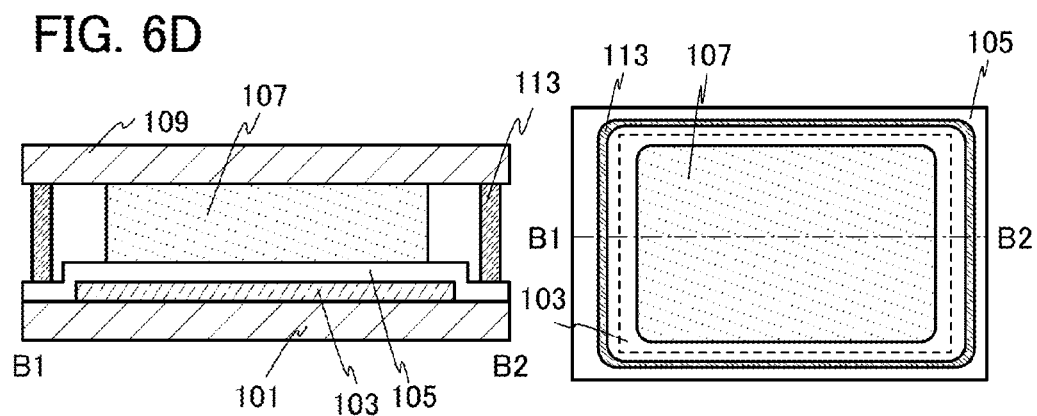

As illustrated in FIG. 6D, a resin layer 113 may be provided outside the bonding layer 107. FIG. 6D illustrates a plan view from the substrate 109 side and a cross-sectional view taken along the dashed-dotted line B1-B2 in the plan view (the substrate 109 is not illustrated in the plan view). With the resin layer 113, entry of impurities such as moisture into the layer 105 can be suppressed even when the light-emitting device is exposed to an air atmosphere during the manufacturing process.

Note that the layer 105 and the substrate 109 are preferably attached to each other in a reduced-pressure atmosphere.

For the sheet-like adhesive, a material having fluidity low enough to dispose the material only in a desired region may be used. For example, an optical clear adhesive (OCA) film can be preferably used. In addition, various curable bonding sheets using a reactive curable adhesive, a thermosetting adhesive, an anaerobic adhesive, and a photo curable adhesive such as an ultraviolet curable adhesive; an adhesive sheet; a sheet-like or film-like adhesive; or the like can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. With the thermosetting adhesive, the range of choices for the material of the substrate 109 is preferably wider than that in the case of using the photo curable adhesive, in which case the adhesive is curable regardless of a light-transmitting property of the substrate 109.

The sheet-like adhesive may have adhesion before attachment or exhibit adhesion after attachment by heating or light irradiation.

Alternatively, an adhesive with which the substrate 109 and the layer 105 can be chemically or physically separated when necessary, such as an adhesive which is soluble in water or a solvent or an adhesive which is capable of being plasticized upon irradiation of UV light, can be used as the sheet-like adhesive. For example, a sheet-like adhesive using a water-soluble resin may be applied.

Moreover, in one embodiment of the present invention, an adhesive film, a bonding film, and the like in each of which the sheet-like adhesive and the substrate are stacked may be used.

As the substrate 109, various substrates that can be used as the formation substrate 101 can be used. Alternatively, a film-like flexible substrate may be used.

As the resin layer 113, various curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case it can suppress deterioration of the functional element due to entry of moisture in the air and can improve the reliability of the device.

Alternatively, an adhesive with which the substrate 109 and the layer 105 can be chemically or physically separated when necessary, such as an adhesive which is soluble in water or a solvent or an adhesive which is capable of being plasticized upon irradiation of UV light, can be used for the resin layer 113. For example, a water-soluble resin may be used.

When the resin layer 113 is in a cured state, yield of a subsequent peeling process might be decreased because of a height of adhesion between the formation substrate 101 and the substrate 109. Therefore, at least part of the resin layer 113 is preferably in a semi-cured state or an uncured state. With the use of a material having high viscosity for the resin layer 113, an effect of suppressing entry of impurities such as moisture in the air into the layer 105 can be increased even when the resin layer 113 is in a semi-cured state or an uncured state.

For example, part of the resin layer 113 may be cured in such a manner that a light curable resin is used for the resin layer 113 and is partly irradiated with light. Moreover, part of the resin layer 113 is preferably cured, so that a space between the formation substrate 101 and the substrate 109 and positions thereof can be kept constant even in the case where the device under manufacture is moved from a reduced-pressure atmosphere to an atmospheric pressure atmosphere in a subsequent manufacturing process.

Figure 5C:
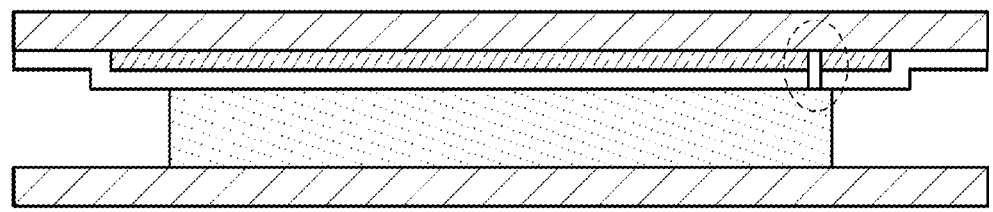

Next, a peeling starting point is formed by laser light irradiation (FIGS. 5B and 5C).

A region where the bonding layer 107 in a cured state, the layer 105, and the peeling layer 103 overlap with one another is irradiated with laser light (see an arrow P1 in FIG. 5B). Although laser light irradiation may be performed from either substrate side, it is preferable to perform laser light irradiation from the formation substrate 101 side in which the peeling layer 103 is provided so that irradiation of the functional element or the like with scattered light can be suppressed. Note that a material that transmits the laser light is used for the substrate on the side where laser light irradiation is performed.

Part of the first layer can be removed and the peeling starting point can be formed by cracking (causing break or crack) at least the first layer (a layer which is included in the layer 105 and which is in contact with the peeling layer 103) (see a region surrounded by a dashed line in FIG. 5C). Here, an example in which films of the layer 105 are partly removed is described. At this time, not only the first layer but also the peeling layer 103, the bonding layer 107, or another layer of the layer 105 may be partly removed. Laser light irradiation enables part of the films of the layer 105, the peeling layer 103, or the bonding layer 107 to be dissolved, evaporated, or thermally broken.

Enlarged views of a region E surrounded by a dashed-dotted line in FIG. 7A are illustrated in FIGS. 7B1, 7B2, 7B3, 7B4, and 7B5. In each enlarged view, a laser light irradiation region 115 is illustrated as an example. FIGS. 7B1 to 7B5 all illustrate examples in which a region where the bonding layer 107 in a cured state and the peeling layer 103 overlap with each other is irradiated with laser light.

It is preferable that at a peeling process, force of separating the layer 105 and the peeling layer 103 be concentrated at the peeling starting point; therefore, it is preferable to form the peeling starting point not at the center portion of the bonding layer 107 in a cured state but in the vicinity of the end portion. It is particularly preferable to form the peeling starting point in the vicinity of the corner portion compared to the vicinity of the side portion among the vicinities of the end portion. For example, as illustrated in FIGS. 7B1 and 7B3, the laser light irradiation region 115 may be positioned only in a region where the bonding layer 107 in a cured state and the peeling layer 103 overlap with each other. Alternatively, as illustrated in FIGS. 7B2, 7B4, and 7B5, the laser light irradiation region 115 may be positioned not only in the region where the bonding layer 107 in a cured state and the peeling layer 103 overlap with each other but also in an outside region thereof. Note that as illustrated in FIG. 7B5, laser light irradiation in a state in contact with the side of the bonding layer 107 is also one mode of laser light irradiation of the region where the bonding layer 107 in a cured state and the peeling layer 103 overlaps with each other.

As illustrated in FIGS. 7B3 to 7B5, a peeling starting point is preferably formed in a form of a dashed line by performing laser light irradiation discontinuously in the vicinity of the end portion of the bonding layer 107 because peeling is easily performed.

As illustrated in FIG. 7C, a peeling starting point in a form of a solid line or a dashed line may be formed in a frame by performing laser light irradiation continuously or discontinuously in a region where the bonding layer 107 in a cured state and the peeling layer 103 overlap with each other.

There is no particular limitation on a laser used to form a peeling starting point. For example, a continuous wave laser or a pulsed oscillation laser can be used. Note that a condition for laser light irradiation such as frequency, power density, energy density, or beam profile is controlled as appropriate in consideration of thicknesses, materials, or the like of the formation substrate 101 and the peeling layer 103.

Figure 5D:
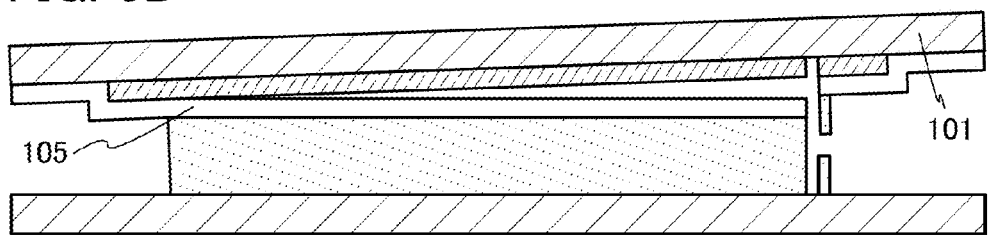
Figure 5E:
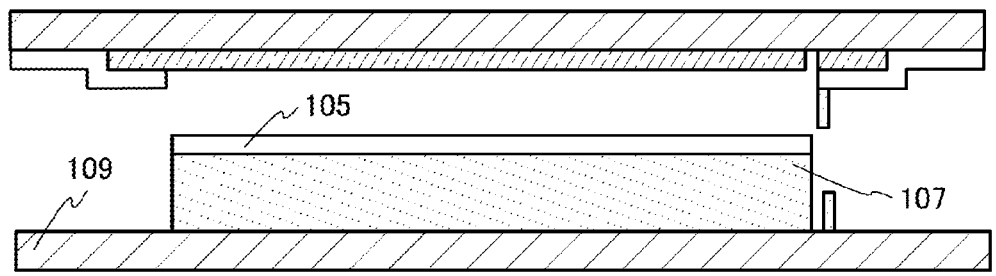

Then, the layer 105 and the formation substrate 101 are separated from each other from the formed peeling starting point (FIGS. 5D and 5E). Accordingly, the layer 105 can be transferred from the formation substrate 101 to the substrate 109. At this time, one of the substrates is preferably fixed to a suction stage or the like. For example, the formation substrate 101 may be fixed to the suction stage to peel the layer 105 from the formation substrate 101. Alternatively, the substrate 109 may be fixed to the suction stage to peel the formation substrate 101 from the substrate 109.

For example, the layer 105 and the formation substrate 101 may be separated by mechanical force (a peeling process with a human hand or a gripper, a separation process by rotation of a roller, or the like) from the peeling starting point.

The formation substrate 101 and the layer 105 may be separated by filling the interface between the peeling layer 103 and the layer 105 with liquid such as water. A portion between the peeling layer 103 and the layer 105 absorbs a liquid through capillarity action, so that the peeling layer 103 can be separated easily. Furthermore, an adverse effect on the functional element included in the layer 105 due to static electricity caused at peeling (e.g., a phenomenon in which a semiconductor element is damaged by static electricity) can be suppressed. Note that liquid can be sprayed in the form of mist or steam. As the liquid, pure water is preferable, and an organic solvent or the like can be used. For example, a neutral solution, an alkaline solution, an acid solution, a solution into which salt is melted, or the like may be used. In addition, a mixture of ammonium water and a hydrogen peroxide solution, a hydrogen peroxide solution, or the like may be used.

Note that after the peeling, the bonding layer 107, the resin layer 113, or the like which does not contribute to attachment between the layer 105 and the substrate 109 and which remains over the substrate 109 may be removed. By such removal, an adverse effect on the functional element in a subsequent step (e.g., entry of impurities) can be preferably suppressed. For example, an unnecessary resin can be removed by wiping, cleaning, or the like.

In the peeling method of one embodiment of the present invention described above, peeling is performed in such a manner that a peeling starting point is formed by laser light irradiation and then the interface between the peeling layer 103 and the layer 105 is made in a peelable state. Accordingly, the yield of the peeling process can be improved.

<Second Peeling Method>

Figure 8A:
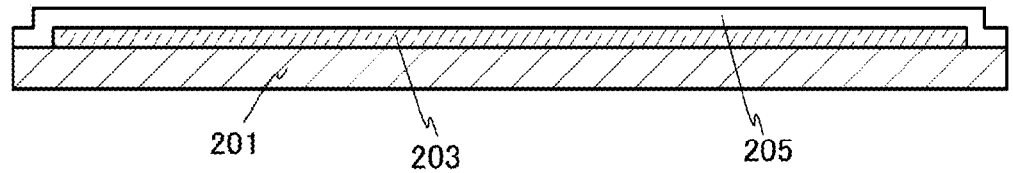
FIGS. 8A to 8D illustrate a peeling method.
Figure 8B:
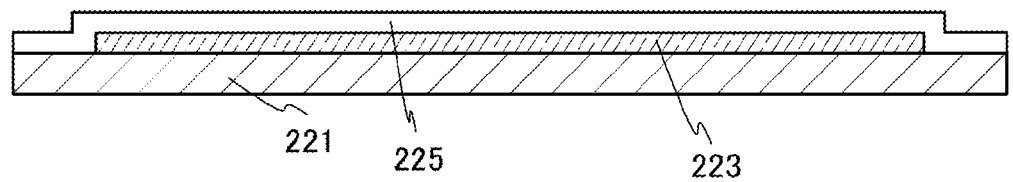

First, the peeling layer 203 is formed over the formation substrate 201, and a layer 205 to be peeled (hereinafter referred to as a layer 205) is formed over the peeling layer 203 (FIG. 8A). In addition, the peeling layer 223 is formed over the formation substrate 221, and a layer 225 to be peeled (hereinafter referred to as a layer 225) is formed over the peeling layer 223 (FIG. 8B).

Figure 8C:
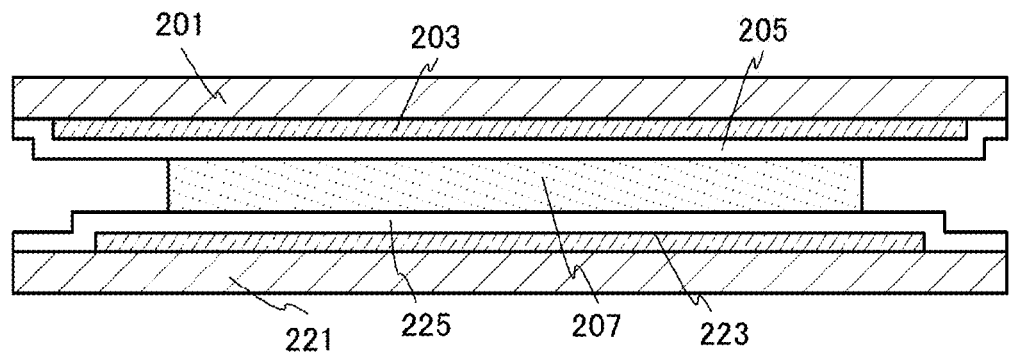

Next, the formation substrate 201 and the formation substrate 221 are attached to each other with the bonding layer 207 so that the surfaces on which the layers to be peeled are formed face each other, and the bonding layer 207 is cured (FIG. 8C). In this embodiment, a sheet-like adhesive is used for the bonding layer 207.

Note that the formation substrate 201 and the formation substrate 221 are preferably attached to each other in a reduced-pressure atmosphere.

Figure 8D:
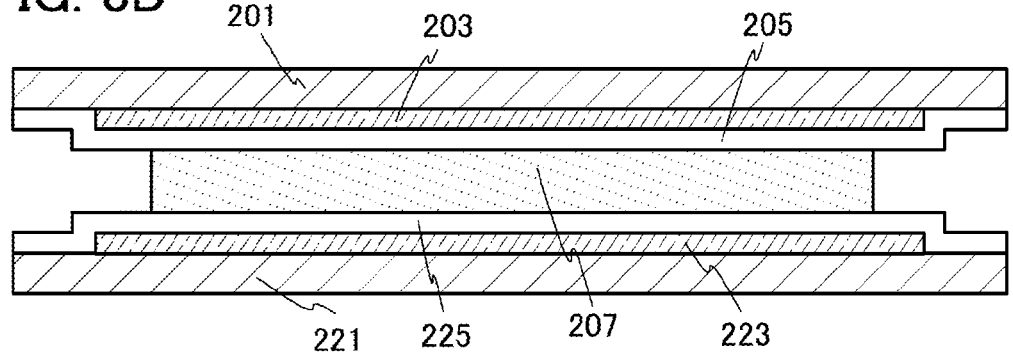

Note that although FIG. 8C illustrates the case where the peeling layer 203 and the peeling layer 223 are different in size, peeling layers of the same size as illustrated in FIG. 8D may be used.

The bonding layer 207 is provided to overlap with the peeling layer 203, the layer 205, the layer 225, and the peeling layer 223. Then, an end portion of the bonding layer 207 is preferably positioned on an inner side than at least an end portion of either the peeling layer 203 or the peeling layer 223 (the peeling layer which is desirably peeled first). Accordingly, strong adhesion between the formation substrate 201 and the formation substrate 221 can be suppressed; thus, a decrease in yield of a subsequent peeling process can be suppressed. The sheet-like adhesive used in one embodiment of the present invention preferably is preferable because it has low fluidity and can be disposed only in a desired region.

Figure 9A:
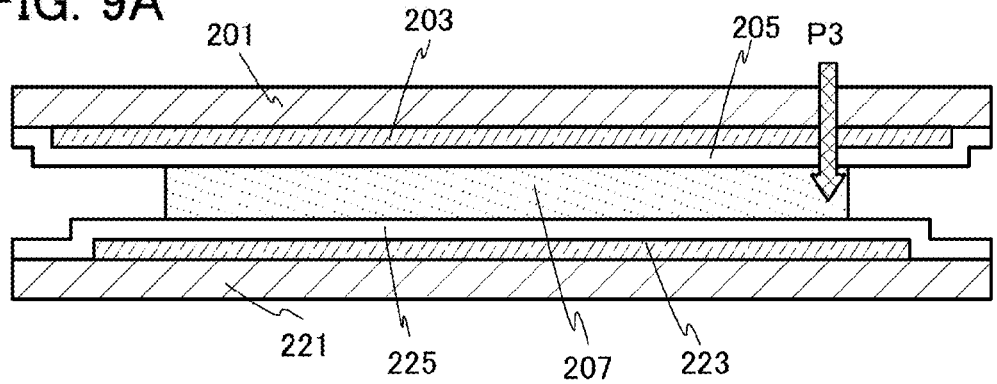
FIGS. 9A to 9D illustrate a peeling method.
Figure 9B:
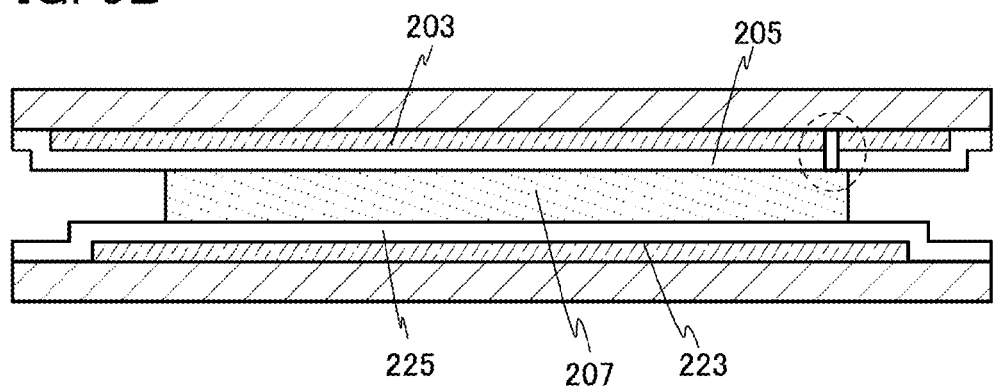

Next, a peeling starting point is formed by laser light irradiation (FIGS. 9A and 9B).

Either the formation substrate 201 or the formation substrate 221 may be peeled first. In the case where the peeling layers differ in size, a substrate over which a larger peeling layer is formed may be peeled first or a substrate over which a smaller peeling layer is formed may be peeled first. In the case where an element such as a semiconductor element, a light-emitting element, or a display element is formed only over one of the substrates, the substrate on the side where the element is formed may be peeled first or the other substrate may be peeled first. Here, an example in which the formation substrate 201 is peeled first is described.

A region where the bonding layer 207 in a cured state, the layer 205, and the peeling layer 203 overlap with one another is irradiated with laser light (see an arrow P3 in FIG. 9A).

Part of the first layer is removed; thus, the peeling starting point can be formed (see a region surrounded by a dashed line in FIG. 9B). At this time, not only the first layer but also the peeling layer 203, the bonding layer 207, or another layer included in the layer 205 may be partly removed.

It is preferable that laser light irradiation be performed from the substrate side provided with the peeling layer which is desirably peeled. In the case where a region where the peeling layer 203 and the peeling layer 223 overlap with each other is irradiated with laser light, the formation substrate 201 and the peeling layer 203 can be selectively peeled by cracking only the layer 205 between the layer 205 and the layer 225 (see a region surrounded by a dotted line in FIG. 9B). Here, an example in which films of the layer 205 are partly removed is described.

When a peeling starting point is formed in both the layer 205 on the peeling layer 203 side and the layer 225 on the peeling layer 223 side in the case where the region where the peeling layer 203 and the peeling layer 223 overlap with each other is irradiated with laser light, it might be difficult to selectively peel one of the formation substrates. Therefore, laser light irradiation conditions might be restricted so that only one of the layers to be peeled is cracked.

Figure 11A:
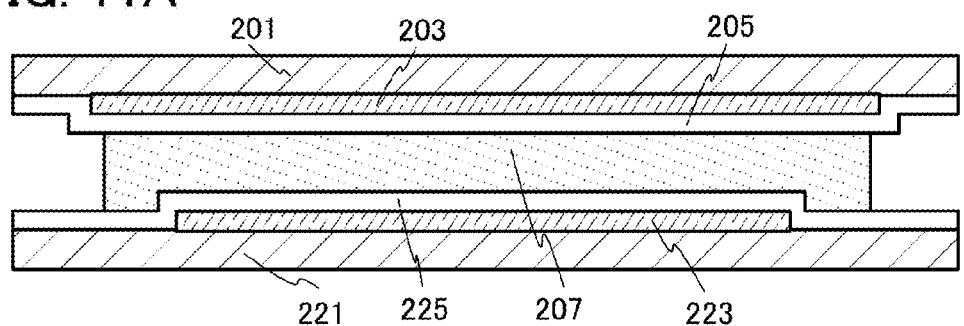
FIGS. 11A to 11C illustrate a peeling method.
Figure 11B:
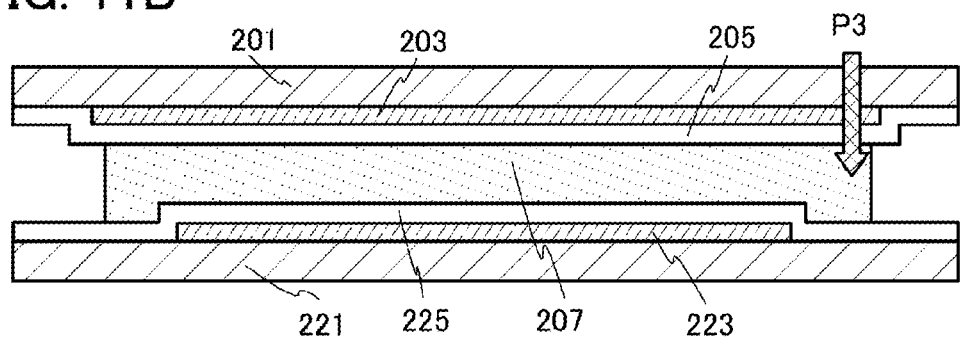
Figure 11C:
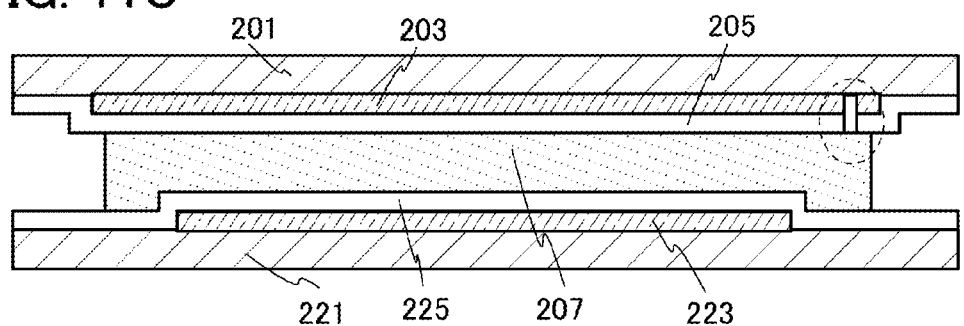

At this time, it is preferable that the end portion of the bonding layer 207 be positioned on an inner side than the end portion of one of the peeling layer 203 or the peeling layer 223 and on an outer side than an end portion of the other peeling layer. For example, in FIG. 11A, the end portion of the bonding layer 207 is positioned on an inner side than the end portion of the peeling layer 203 and on an outer side than the end portion of the peeling layer 223. With a structure illustrated in FIG. 11A, a peeling starting point can be prevented from being formed in both the peeling layer 203 and the peeling layer 223 by irradiating only a region overlapping with the peeling layer 203 but not overlapping with the peeling layer 223 with laser light (FIGS. 11B and 11C). Therefore, there is preferably a small restrict on the laser light irradiation conditions. Although laser light irradiation may be performed from either substrate side at this time, it is preferable to perform laser light irradiation from the formation substrate 201 side in which the peeling layer 203 is provided so that irradiation of the functional element or the like with scattered light can be suppressed.

Figure 9C:
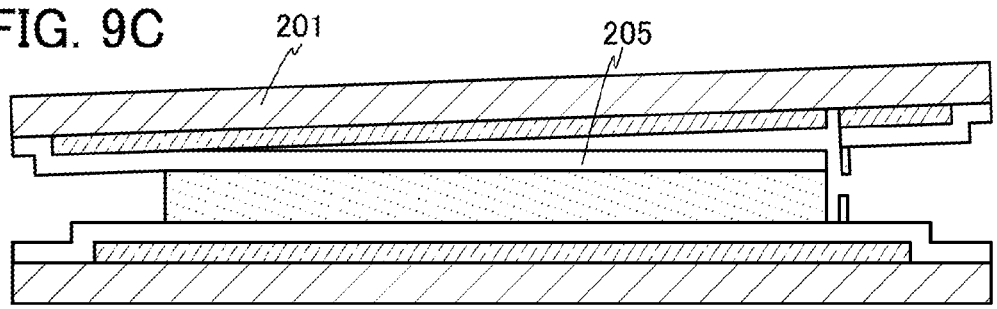
Figure 9D:
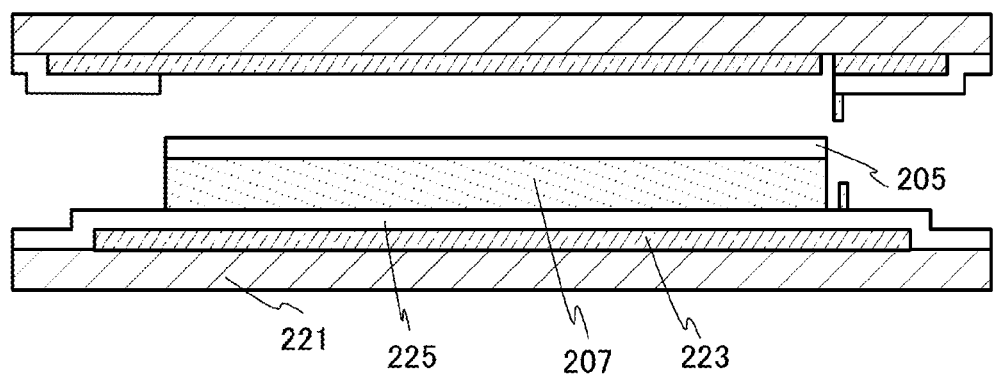

Then, the layer 205 and the formation substrate 201 are separated from each other from the formed peeling starting point (FIGS. 9C and 9D). Accordingly, the layer 205 can be transferred from the formation substrate 201 to the formation substrate 221.

Figure 10A:
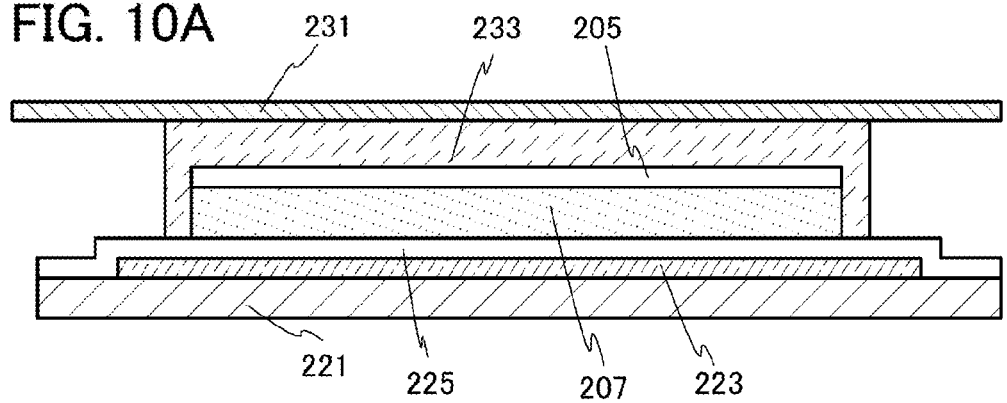
FIGS. 10A to 10D illustrate a peeling method.

Next, the exposed layer 205 is attached to the substrate 231 with a bonding layer 233, and the bonding layer 233 is cured (FIG. 10A). In this embodiment, a sheet-like adhesive is used for the bonding layer 233.

Note that the layer 205 and the substrate 231 are preferably attached to each other in a reduced-pressure atmosphere.

Figure 10B:
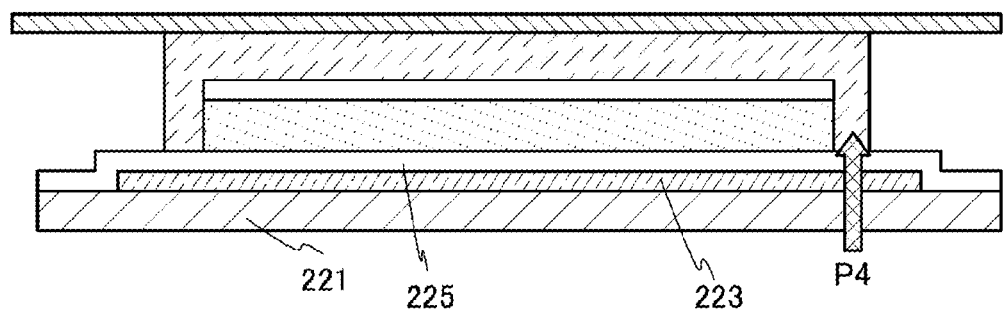
Figure 10C:
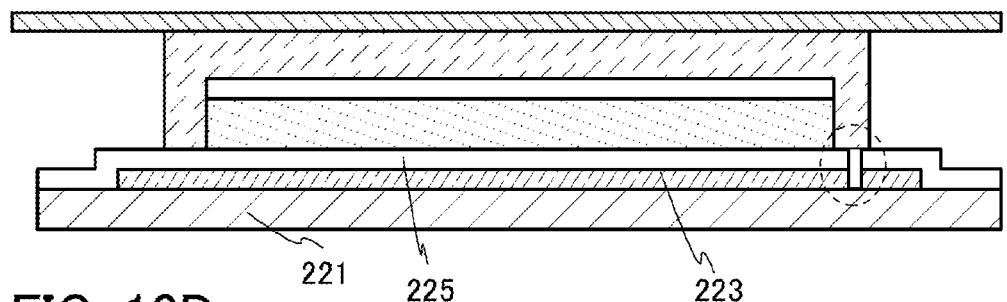

Next, a peeling starting point is formed by laser light irradiation (FIGS. 10B and 10C).

A region where the bonding layer 233 in a cured state, the layer 225, and the peeling layer 223 overlap with one another is irradiated with laser light (see an arrow P4 in FIG. 10B). Part of the first layer is removed; thus, the peeling starting point can be formed (see a region surrounded by a dashed line in FIG. 10C). Here, an example in which films of the layer 225 are partly removed is described. At this time, not only the first layer but also the peeling layer 223, the bonding layer 233, or another layer included in the layer 225 may be partly removed.

It is preferable that laser light irradiation be performed from the formation substrate 221 side in which the peeling layer 223 is provided.

Figure 10D:
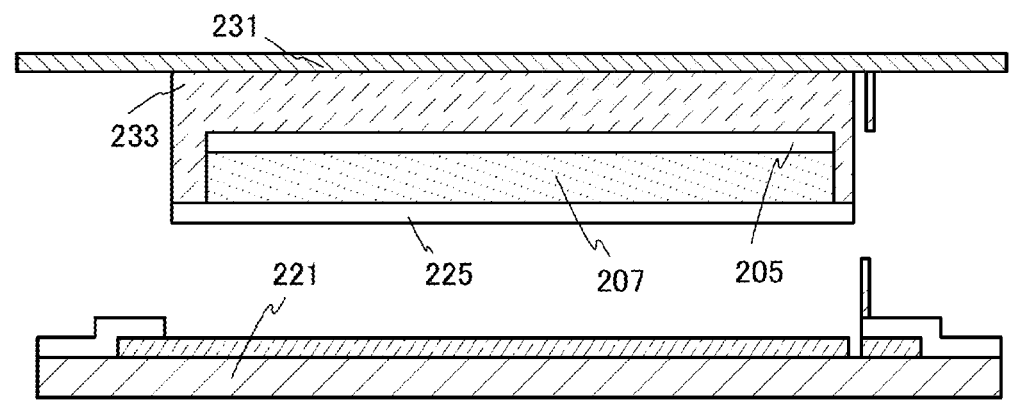

Then, the layer 225 and the formation substrate 221 are separated from each other from the formed peeling starting point (FIG. 10D). Accordingly, the layer 205 and the layer 225 can be transferred to the substrate 231.

Note that although an example in which a sheet-like adhesive is used for both the bonding layer 207 and the bonding layer 233 is described above, one embodiment of the present invention is not limited thereto; a sheet-like adhesive may be used for one of the bonding layers, for example.

In addition, although an example in which an end portion of the bonding layer 233 is positioned on an outer side than an end portion of the bonding layer 207 is illustrated in FIGS. 10A to 10D, one embodiment of the present invention is not limited thereto. For example, as illustrated in FIGS. 37A to 37D, the end portion of the bonding layer 233 may be positioned on an inner side than the end portion of the bonding layer 207.

In the peeling method of one embodiment of the present invention described above, peeling is performed in such a manner that a peeling starting point is formed by laser light irradiation after a pair of formation substrates each provided with a peeling layer and a layer to be peeled are attached to each other and then the peeling layers and layers to be peeled are made in a peelable state. Accordingly, the yield of the peeling process can be improved.

Peeling is performed after the pair of formation substrates each provided with the layer to be peeled are attached to each other in advance, then the substrates of the device which is desirably manufactured can be attached to each other. Therefore, formation substrates having low flexibility can be attached to each other when the layers to be peeled are attached to each other, whereby alignment accuracy at the time of attachment can be improved as compared to the case where flexible substrates are attached to each other.

<Planar Shapes of Peeling Layer>

The planar shape of the peeling layer used in one embodiment of the present invention is not particularly limited. FIGS. 12A to 12F each illustrate an example of the planar shape of the peeling layer. Examples of a peeling starting portion are illustrated in FIGS. 12A to 12F. It is preferable that at a peeling process, force of separating the layer to be peeled and the peeling layer be concentrated at the peeling starting point; therefore, it is preferable to form the peeling starting point in the vicinity of the corner portion compared to the center portion or the side portion of the peeling layer. Note that peeling may be started at a portion other than a peeling starting portion 117 in each of FIGS. 12A to 12F.

Figure 12A:
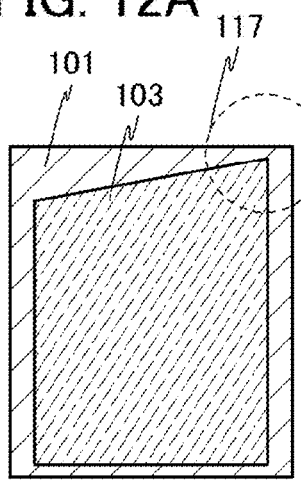
FIGS. 12A to 12I illustrate planar shapes of a peeling layer.
Figure 12B:
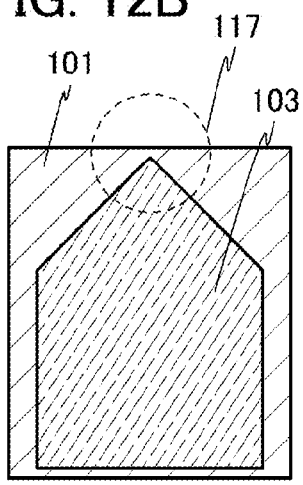
Figure 12C:
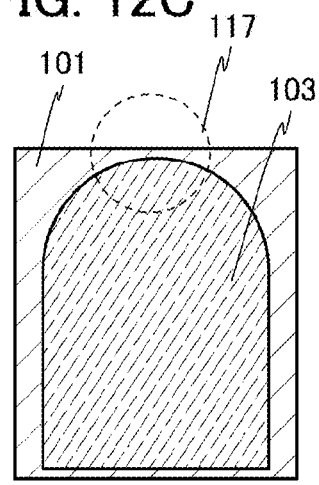
Figure 12D:
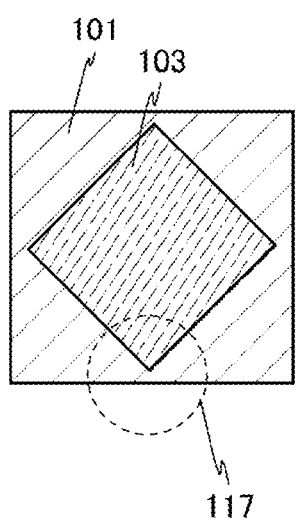
Figure 12E:
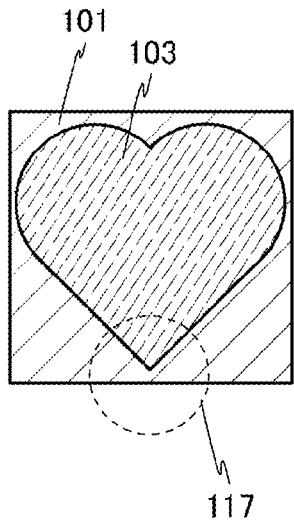
Figure 12F:
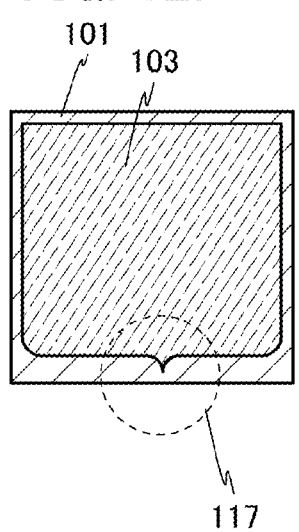

As illustrated in FIG. 12A, the corner portion of the peeling layer 103 may be positioned at the corner portion of the formation substrate 101 in the planar shape in the case where peeling is desirably started from the corner portion of the formation substrate 101. As illustrated in FIGS. 12B, 12D, 12E, and 12F, the corner portion of the peeling layer 103 may be positioned at the side portion of the formation substrate 101 in the planar shape in the case where peeling is desirably started from the side portion of the formation substrate 101. As illustrated in FIG. 12C, the corner portion of the peeling layer 103 may be rounded.

Figure 12G:
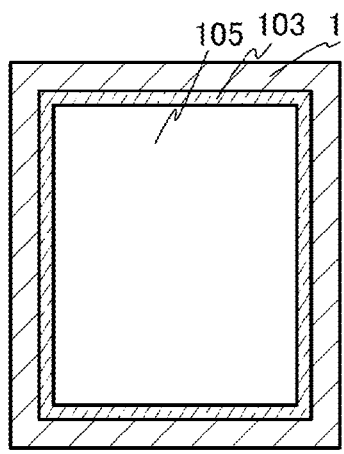
Figure 12H:
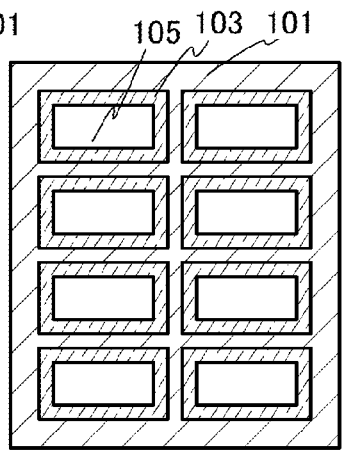
Figure 12I:
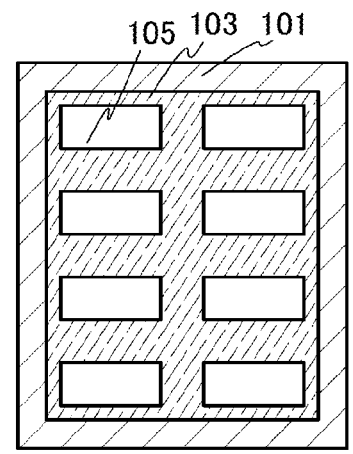

As illustrated in FIG. 12G, an end portion of the layer 105 is positioned on an inner side than the end portion of the peeling layer 103. Accordingly, the yield of the peeling process can be improved. In the case where there are a plurality of layers 105, the peeling layer 103 may be provided in each layer 105 as illustrated in FIG. 12H or a plurality of layers 105 may be provided over one peeling layer 103 as illustrated in FIG. 12I.

<First Method for Manufacturing Device>

Various devices can be manufactured using the peeling method of one embodiment of the present invention. An example in which a light-emitting device including a light-emitting element is manufactured by the peeling method of one embodiment of the present invention is described below. The device that can be manufactured by one embodiment of the present invention is not limited thereto; for example, a device including another functional element described in Embodiment 1 as an example can be manufactured.

First, a method for manufacturing the above light-emitting device using the first peeling method is described. The above description can be referred to for materials that can be applied to the components described using reference numerals similar to those already described.

Note that the light-emitting devices in Specific Examples 3 to 5 of Embodiment 1 can be manufactured in a similar manner by changing the structure of the layer to be peeled.

Figure 13A:
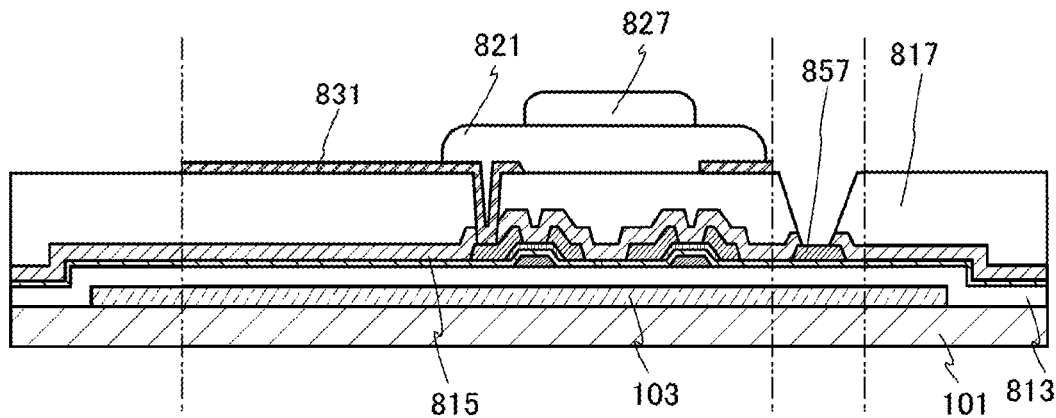
FIGS. 13A to 13C illustrate a method for manufacturing a light-emitting device.

First, as illustrated in FIG. 13A, the peeling layer 103, the insulating layer 813, the transistor, the insulating layer 815, the conductive layer 857, and the insulating layer 817 are formed over the formation substrate 101 in this order. Next, the lower electrode 831 electrically connected to the source electrode or the drain electrode of the transistor is formed. Then, the insulating layer 821 covering the end portion of the lower electrode 831 and the spacer 827 over the insulating layer 821 are formed. Here, layers from the insulating layer 813 to the spacer 827 correspond to a layer to be peeled.

Figure 13B:
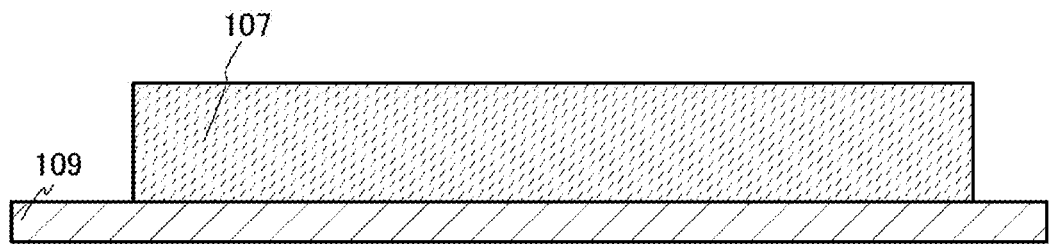

In addition, as illustrated in FIG. 13B, the bonding layer 107 serving as a peeling adhesive is formed over the substrate 109 serving as a temporary support substrate. At this time, adhesive with which the substrate 109 and the layer to be peeled can be chemically or physically separated is used as the peeling adhesive. Although a sheet-like adhesive is used in this embodiment, one embodiment of the present invention is not limited thereto.

Figure 13C:
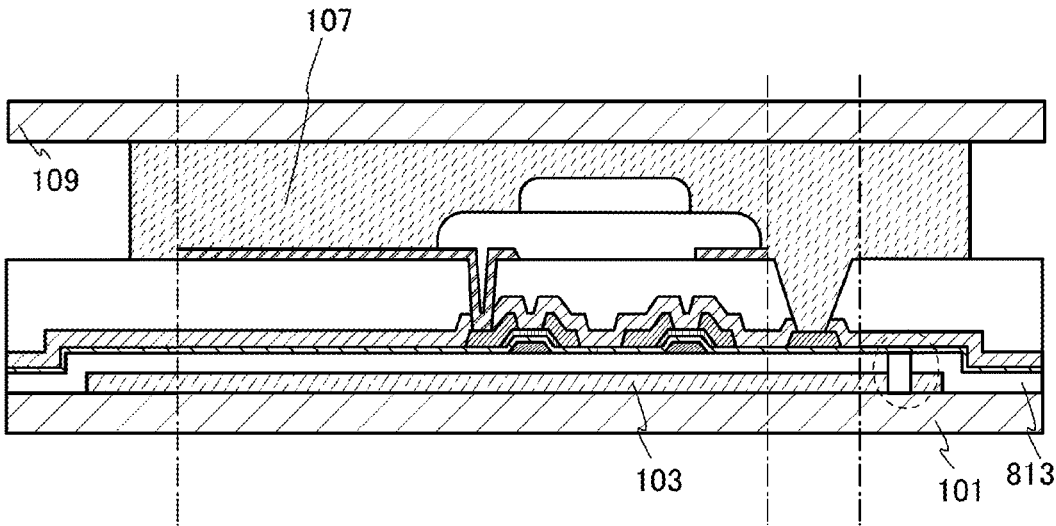

Next, the substrate 109 and the formation substrate 101 are attached to each other with the bonding layer 107, and the peeling layer 107 is cured. Then, a peeling starting point is formed by laser light irradiation (FIG. 13C). At least part of the insulating layer 813 is removed; thus, the peeling starting point can be formed. Here, an example in which the insulating layer 813 and the peeling layer 103 are partly removed is described. Note that in each of the figures illustrating the steps of forming the peeling starting point, a region where the peeling starting point is formed is surrounded by a dashed line.

Figure 14A:
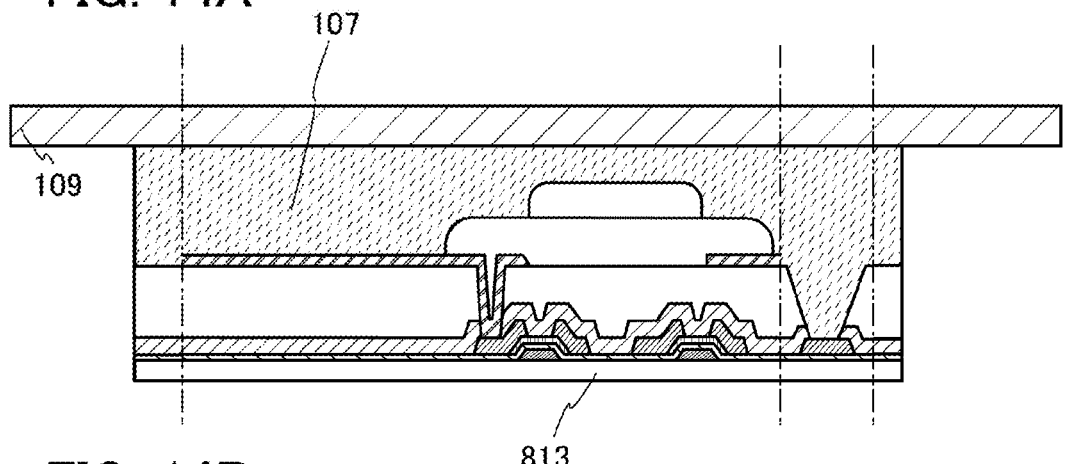
FIGS. 14A to 14C illustrate a method for manufacturing a light-emitting device.

The layer to be peeled and the formation substrate 101 are separated from each other from the formed peeling starting point. Accordingly, the layer to be peeled can be transferred from the formation substrate 101 to the substrate 109 (FIG. 14A).

Figure 14B:
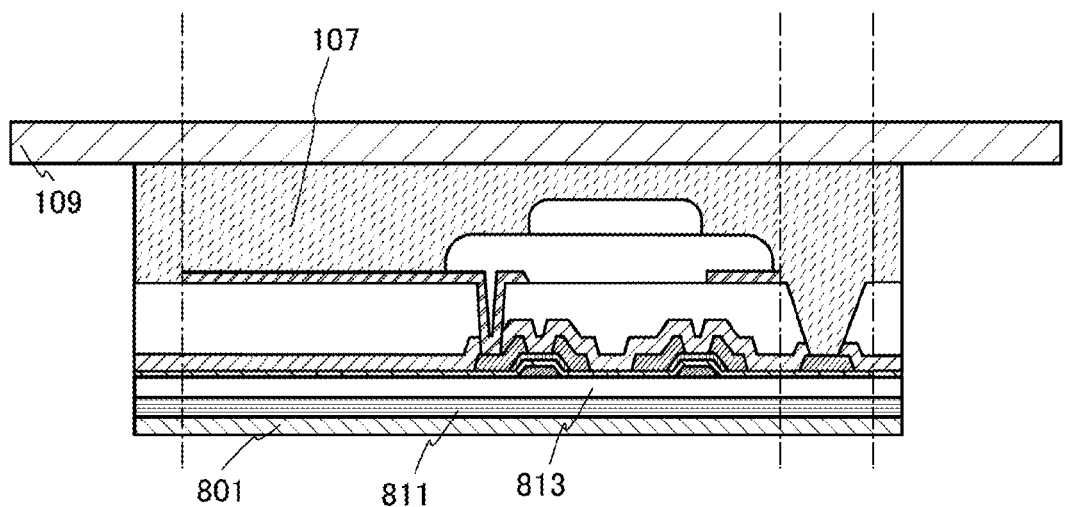

Next, the insulating layer 813 peeled off from the formation substrate 101 and exposed is attached to the substrate 801 with the bonding layer 811 (FIG. 14B). Although a sheet-like adhesive is used for the bonding layer 811 in this embodiment, one embodiment of the present invention is not limited thereto.

Figure 14C:
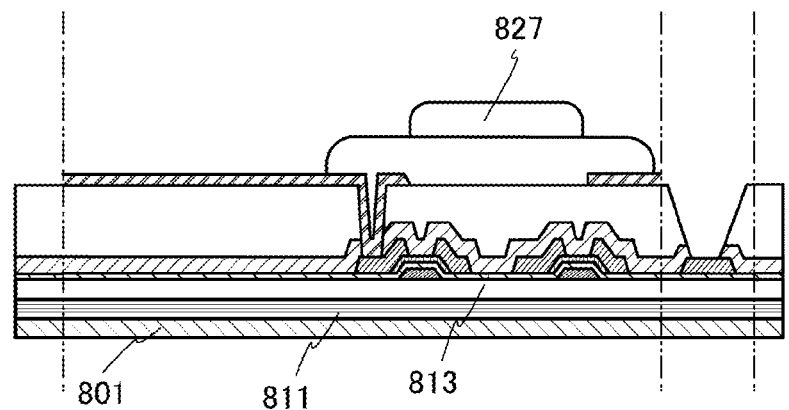

After that, the substrate 109 is removed by dissolving or plasticizing the bonding layer 107. Then, the bonding layer 107 is removed by water, a solvent, or the like to expose the layer to be peeled (here, the spacer 827 or the like) (FIG. 14C).

In the above manner, the layer to be peeled can be transferred from the formation substrate 101 to the substrate 801.

After that, the EL layer and the upper electrode are formed over the lower electrode 831 and the spacer 827 which are exposed, and the light-emitting element and the substrate are attached to each other with the bonding layer (e.g., a sheet-like adhesive). Finally, the FPC is attached to each electrode of an input-output terminal portion with the use of an anisotropic conductive member. An IC chip or the like may be mounted if necessary. Note that when the flexible substrate warps easily, the attachment accuracy might deteriorate at the time of attachment of the FPC or a TCP. Therefore, the manufactured device may be supported by glass, silicone rubber, or the like at the time of attachment of the FPC or the TCP. Thus, the electrical connection of the FPC or the TCP to the functional element can be performed surely.

<Second Method for Manufacturing Device>

Next, an example in which a top-emission light-emitting device using a color filter method in FIGS. 3A and 3C (Specific Example 1) is manufactured by the peeling method of one embodiment of the present invention is described.

Note that the light-emitting device in Specific Example 2 of Embodiment 1 can be manufactured in a similar manner by changing the structure of the layer to be peeled.

Figure 15A:
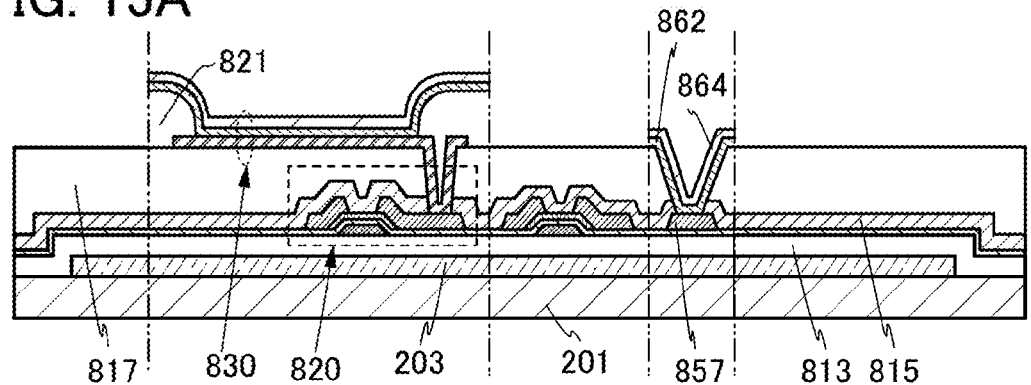
FIGS. 15A to 15C illustrate a method for manufacturing a light-emitting device.

First, as illustrated in FIG. 15A, the peeling layer 203 is formed over the formation substrate 201, and the insulating layer 813 is formed over the peeling layer 203. Next, a plurality of transistors (the transistor 820 and the like), the conductive layer 857, the insulating layer 815, the insulating layer 817, a plurality of light-emitting elements (the light-emitting element 830 and the like), and the insulating layer 821 are formed over the insulating layer 813. An opening is formed in the insulating layer 821, the insulating layer 817, and the insulating layer 815 to expose the conductive layer 857. Here, an EL layer 862 is formed over the exposed conductive layer 857 with the same material and in the same process as the EL layer of the light-emitting element, and a conductive layer 864 is formed over the EL layer 862 with the same material and in the same process as the upper electrode of the light-emitting element. Note that the EL layer 862 and the conductive layer 864 are not necessarily provided. Here, layers from the insulating layer 813 to the light-emitting element correspond to a layer to be peeled.

Figure 15B:
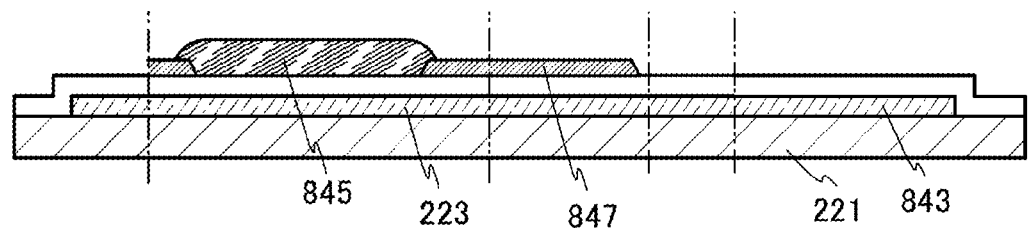

Moreover, as illustrated in FIG. 15B, the peeling layer 223 is formed over the formation substrate 221, and the insulating layer 843 is formed over the peeling layer 223. Next, the light-blocking layer 847 and the coloring layer 845 are formed over the insulating layer 843 (FIG. 11B). Note that although not illustrated in FIGS. 15A to 15C, an overcoat covering the light-blocking layer 847 and the coloring layer 845 may be provided as illustrated in FIG. 3D. Here, the insulating layer 843, the light-blocking layer 847, and the coloring layer 845 correspond to a layer to be peeled.

Figure 15C:
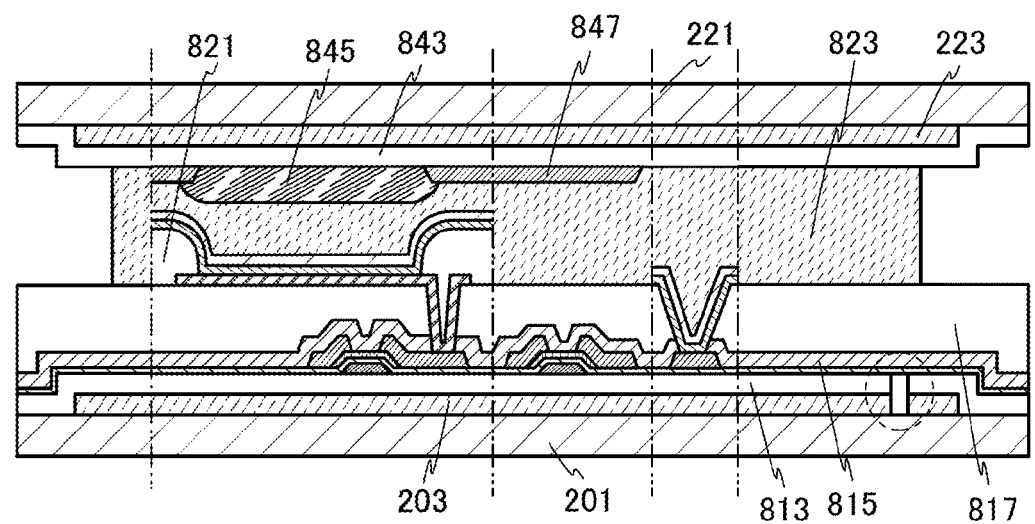

Next, the formation substrate 201 and the formation substrate 221 are attached to each other with the bonding layer 823, and the bonding layer 823 is cured. Although a sheet-like adhesive is used for the bonding layer 823 in this embodiment, one embodiment of the present invention is not limited thereto. Then, a peeling starting point is formed by laser light irradiation (FIG. 15C). Here, an example in which the insulating layer 813 and the peeling layer 203 are partly removed is described.

Peeling is performed after the pair of formation substrates each provided with the layer to be peeled are attached to each other in advance, then the flexible substrates can be attached to each other. Therefore, formation substrates having low flexibility can be attached to each other when the layers to be peeled are attached to each other, whereby alignment accuracy at the time of attachment can be improved as compared to the case where flexible substrates are attached to each other. Therefore, it can be said that this manufacturing method has high alignment accuracy at the time of attachment of the light-emitting element and the color filter.

Figure 16A:
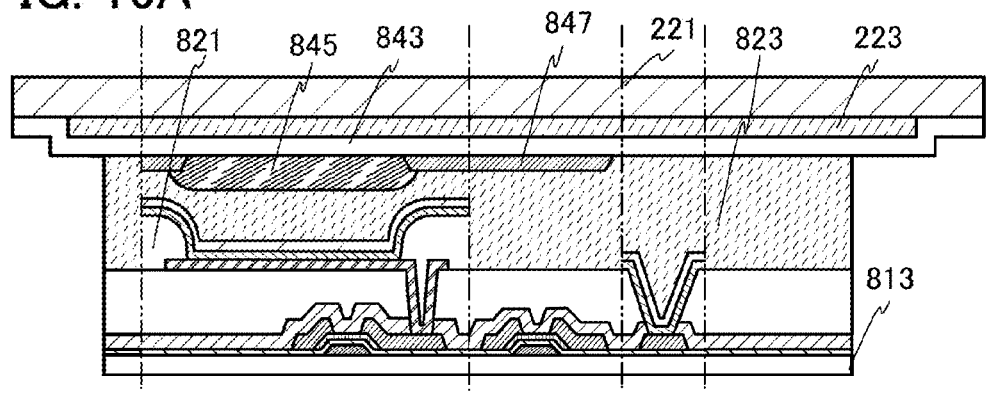
FIGS. 16A to 16C illustrate a method for manufacturing a light-emitting device.

The layer to be peeled and the formation substrate 201 are separated from each other from the formed peeling starting point. Accordingly, the layer to be peeled can be transferred from the formation substrate 201 to the formation substrate 221 (FIG. 16A).

Next, the insulating layer 813 peeled off from the formation substrate 201 and exposed is attached to the substrate 801 with the bonding layer 811. Although a sheet-like adhesive is used for the bonding layer 811 in this embodiment, one embodiment of the present invention is not limited thereto.

Figure 16B:
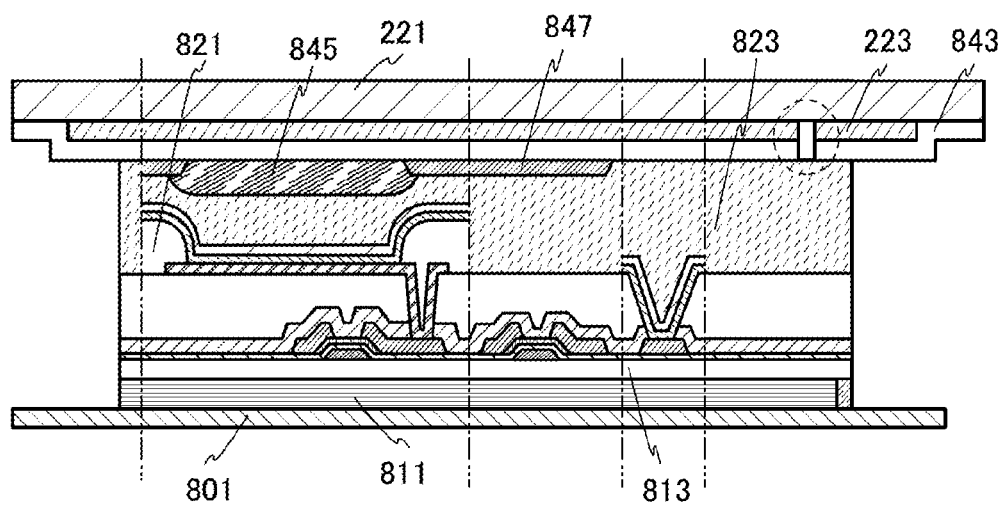
Figure 16C:
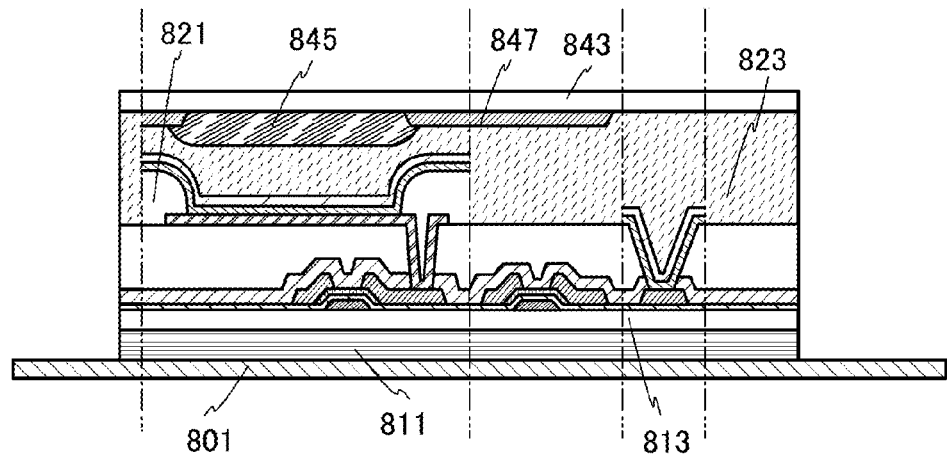

Next, a peeling starting point is formed by laser light irradiation (FIG. 16B). Then, the insulating layer 843 and the formation substrate 221 are separated from each other from the formed peeling starting point (FIG. 16C).

In the above manner, the layer to be peeled can be transferred from the formation substrate 201 and the formation substrate 221 to the substrate 801.

After that, a step of exposing the conductive layer 857 and a step of attaching the insulating layer 843 and the substrate 803 with the bonding layer 841 are performed. Either step may be performed first. Although a sheet-like adhesive is used for the bonding layer 841 in this embodiment, one embodiment of the present invention is not limited thereto.

For example, an opening is formed in the insulating layer 843 and the bonding layer 823 to expose the conductive layer 857. In the case where the substrate 803 overlaps with the conductive layer 857, the opening is formed also in the substrate 803 and the bonding layer 841 so that the conductive layer 857 is exposed.

The method for forming the opening is not particularly limited and may be, for example, a laser ablation method, an etching method, an ion beam sputtering method, or the like. As another method, a cut may be made in a film over the conductive layer 857 with a needle, a sharp knife such as a cutter, or the like and part of the film may be peeled off by physical force.

Figure 17A:
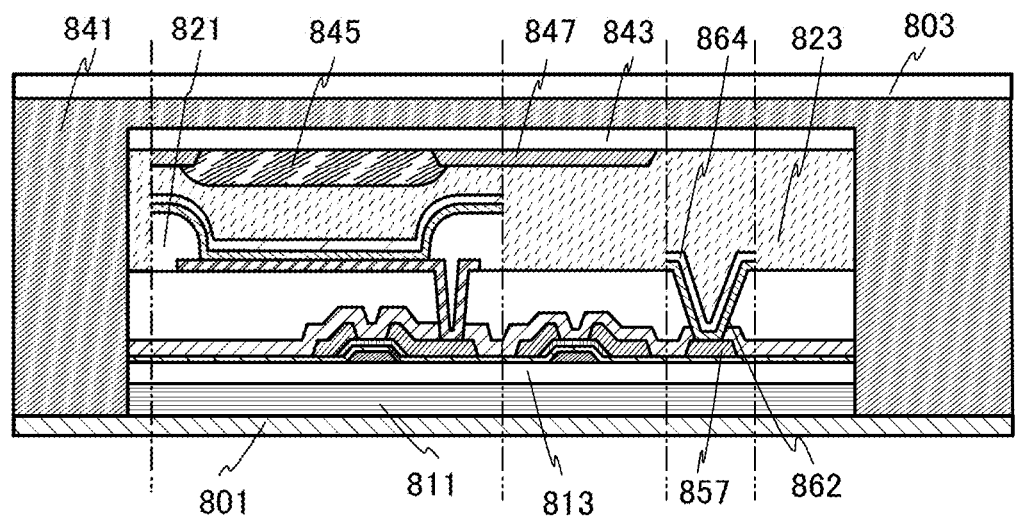
FIGS. 17A and 17B illustrate a method for manufacturing a light-emitting device.
Figure 17B:
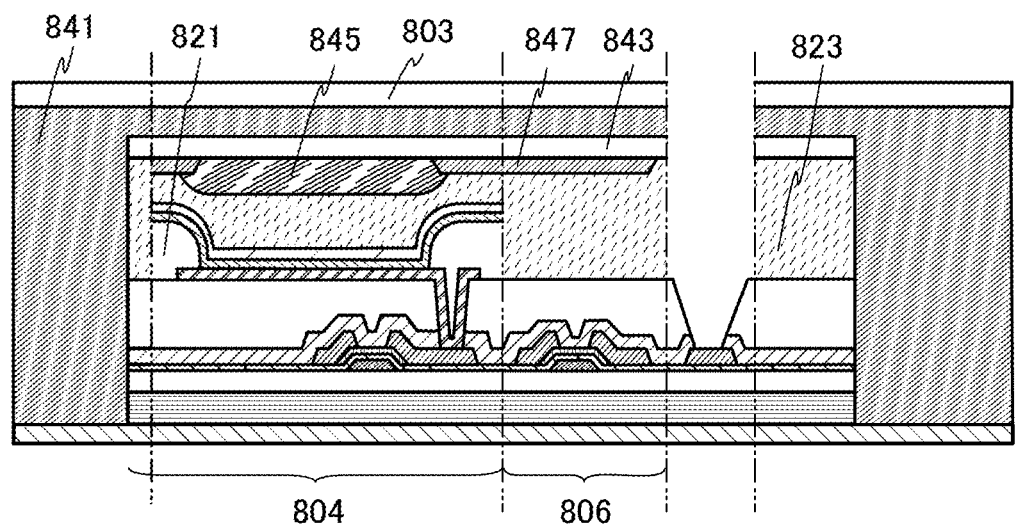
Figure 18:
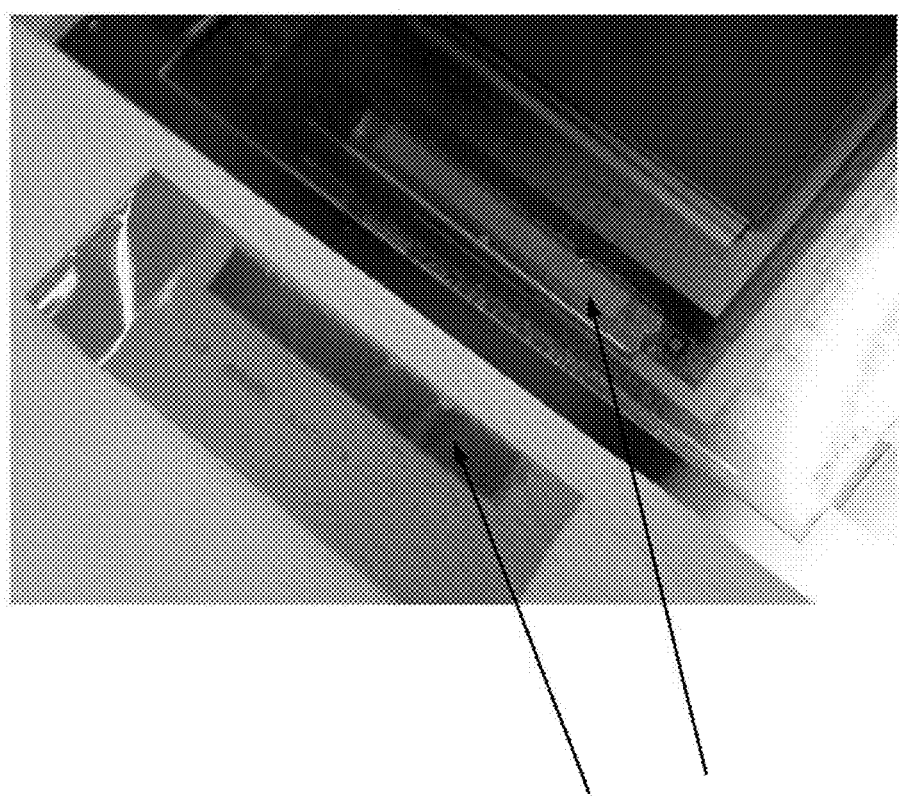
FIG. 18 is a photograph showing a light-emitting device under manufacture.

For example, removal of part of the film leads to removal of the substrate 803, the bonding layer 841, the insulating layer 843, the bonding layer 823, the EL layer 862, and the conductive layer 864 each overlapping with the conductive layer 857 (FIG. 17B). For example, an adhesive roller is pressed to the substrate 803 and the roller is rolled and moved relatively. Alternatively, an adhesive tape may be attached to the substrate 803 and then peeled. Adhesion between the EL layer 862 and the conductive layer 864 and adhesion between layers included in the EL layer 862 are low; therefore, separation occurs at an interface between the EL layer 862 and the conductive layer 864 or in the EL layer 862. Accordingly, a region where the substrate 803, the bonding layer 841, the insulating layer 843, the bonding layer 823, the EL layer 862, or the conductive layer 864 overlaps with the conductive layer 857 can be removed selectively. Note that in the case where the EL layer 862 or the like remains over the conductive layer 857, it may be removed with an organic solvent or the like. FIG. 18 shows how the insulating layer 843 or the like overlapping with the conductive layer 857 is actually removed. As indicated by arrows, the insulating layer 843 or the like can be partly peeled off.

Note that there is no limitation on a method for removing the layer overlapping with the conductive layer 857 as long as the conductive layer 857 can be exposed and can be electrically connected to the FPC 808 in subsequent steps. The EL layer 862 or the conductive layer 864 does not necessarily overlap with the conductive layer 857. For example, the conductive layer 864 is not necessarily provided in the case where separation occurs in the EL layer 862. Moreover, when the EL layer 862 and the bonding layer 823 are in contact with each other, for example, materials of the two layers might be mixed or an interface between the layers might become unclear depending on the materials to be used. In such a case, the conductive layer 864 is preferably provided between the EL layer 862 and the bonding layer 823 so as to suppress a reduction of the reliability of the light-emitting device.

Finally, the FPC 808 is attached to each electrode (the conductive layer 857) of the input-output terminal portion with the use of an anisotropic conductive member (the connector 825). An IC chip or the like may be mounted if necessary.

In the peeling method of one embodiment of the present invention described above, peeling is performed in such a manner that a peeling starting point is formed and then the interface between the peeling layer and the layer to be peeled is made in a peelable state. Accordingly, the yield of the peeling process can be improved. As a result, the light-emitting device can be manufactured with a high yield.

As described in this embodiment, in one embodiment of the present invention, the device is manufactured using a sheet-like adhesive. The sheet-like adhesive has low fluidity and can be disposed only in a desired region. Thus, the bonding layer can be inhibited from spreading outside the peeling layer and a decrease in the yield of the peeling process can be suppressed. In addition, it is possible to provide a peeling method and a method for manufacturing the device which has advantages in that dust can be reduced, the process time can be shortened, and they are favorable for mass production, for example.

This embodiment can be combined with any other embodiment as appropriate.

Embodiment 3

In this embodiment, a structure of a bendable touch panel will be described with reference to FIGS. 19A to 19C, FIGS. 20A and 20B, FIGS. 21A to 21C, and FIGS. 22A to 22C. Note that Embodiment 1 can be referred to for a material of each layer. Although a touch panel including a light-emitting element is described in this embodiment as an example, one embodiment of the present invention is not limited to this example. In one embodiment of the present invention, for example, a touch panel including another element described in Embodiment 1 as an example can be formed.

Note that in a manner similar to that described in detail in Embodiment 1, a bonding layer having hardness higher than Shore D of 70 and a substrate having a coefficient of expansion less than 58 ppm/° C. are preferably applied to the touch panel of this embodiment. Moreover, in a manner similar to that described in detail in Embodiment 2, the touch panel of this embodiment is preferably manufactured using a sheet-like adhesive.

Structure Example 1

Figure 19A:
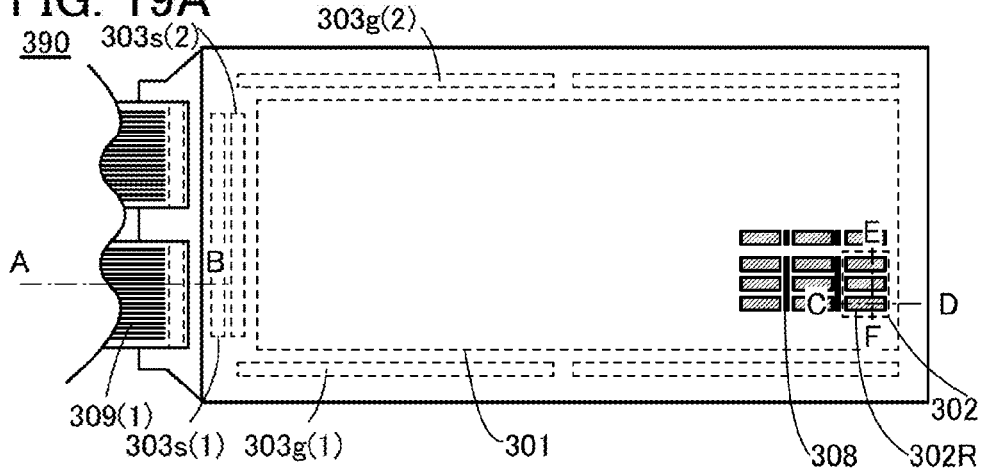
FIGS. 19A to 19C illustrate an example of a touch panel.
Figure 19B:
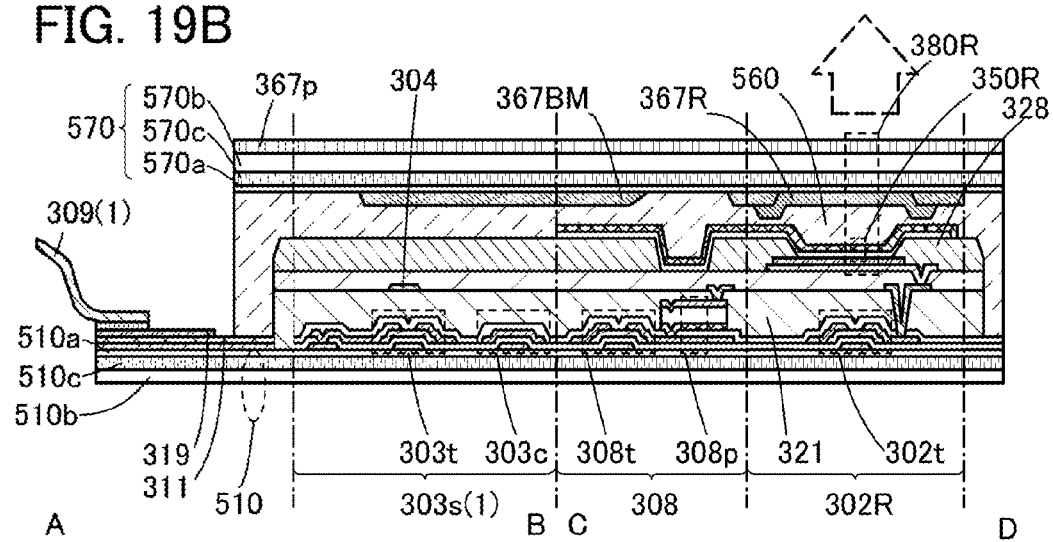
Figure 19C:
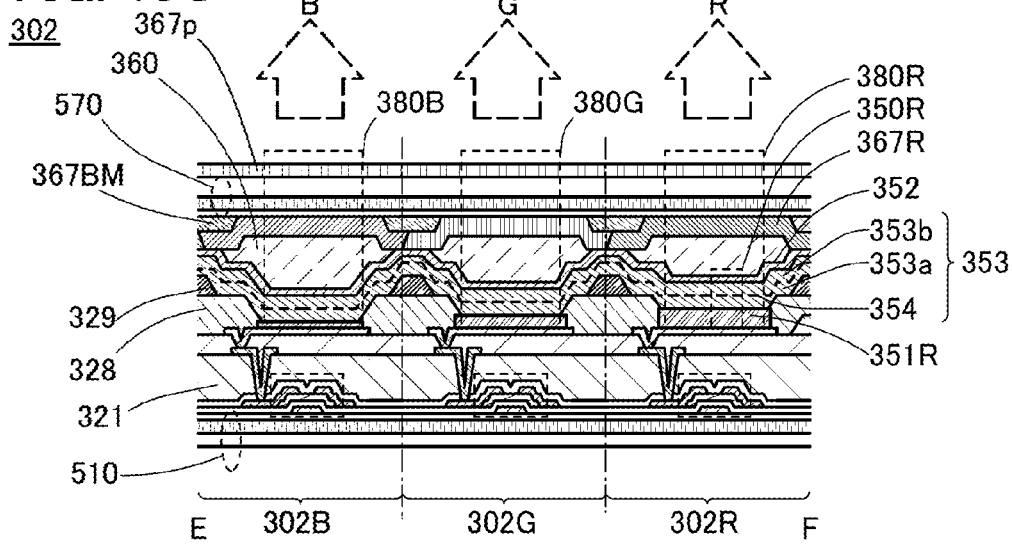

FIG. 19A is a top view of the touch panel. FIG. 19B is a cross-sectional view taken along the dashed-dotted line A-B and dashed-dotted line C-D in FIG. 19A. FIG. 19C is a cross-sectional view taken along the dashed-dotted line E-F in FIG. 19A.

A touch panel 390 includes a display portion 301 as illustrated in FIG. 19A.

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the touch panel 390 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signal include a signal for selecting an imaging pixel circuit from which a recorded imaging signal is read, a signal for initializing an imaging pixel circuit, a signal for determining the time it takes for an imaging pixel circuit to sense light, and the like.

The touch panel 390 is provided with an imaging pixel driver circuit 303g(2) that can supply control signals to the imaging pixels 308 and an imaging signal line driver circuit 303s(2) that reads out imaging signals.

The touch panel 390 includes a substrate 510 and a substrate 570 facing the substrate 510 as illustrated in FIG. 19B.

Flexible materials can be favorably used for the substrate 510 and the substrate 570.

Materials with which unintended passage of impurities is inhibited can be favorably used in the substrate 510 and the substrate 570. For example, materials with a vapor permeability lower than or equal to $10^{-5}$ g/m$^2$·day, or preferably lower than or equal to $10^{-6}$ g/m$^2$·day can be favorably used.

The substrate 510 can be favorably formed using a material having a coefficient of linear expansion which is substantially equal to that of the substrate 570. For example, the coefficient of linear expansion of the materials are preferably lower than or equal to $1\times10^{-3}$/K, further preferably lower than or equal to $5\times10^{-5}$/K, or still further preferably lower than or equal to $1\times10^{-5}$/K.

The substrate 510 is a stacked body including a flexible substrate 510b, an insulating layer 510a that prevents diffusion of unintentional impurities to light-emitting elements, and a bonding layer 510c that attaches the insulating layer 510a to the flexible substrate 510b.

The substrate 570 is a stacked body including a flexible substrate 570b, an insulating layer 570a that prevents diffusion of unintentional impurities to the light-emitting elements, and a bonding layer 570c that attaches the insulating layer 570a to the flexible substrate 570b.

For example, materials that include polyester, polyolefin, polyamide (e.g., nylon or aramid), polyimide, polycarbonate, or a resin having an acrylic bond, an urethane bond, an epoxy bond, or a siloxane bond can be used for the bonding layer.

A bonding layer 560 attaches the substrate 570 to the substrate 510. The bonding layer 560 has a refractive index higher than that of the air. The pixel circuits and the light-emitting elements (e.g., a light-emitting element 350R) are provided between the substrate 510 and the substrate 570.

Each of the pixels 302 includes the sub-pixel 302R, a sub-pixel 302G and a sub-pixel 302B (see FIG. 19C). The sub-pixel 302R includes a light-emitting module 380R, the sub-pixel 302G includes a light-emitting module 380G and the sub-pixel 302B includes a light-emitting module 380B.

For example, the sub-pixel 302R includes the light-emitting element 350R and the pixel circuit that can supply electric power to the light-emitting element 350R and includes a transistor 302$t$ (see FIG. 19B). Furthermore, the light-emitting module 380R includes the light-emitting element 350R and an optical element (e.g., a coloring layer 367R).

The light-emitting element 350R includes a lower electrode 351R, an upper electrode 352, and an EL layer 353 between the lower electrode 351R and the upper electrode 352 (see FIG. 19C).

The EL layer 353 includes a first EL layer 353$a$, a second EL layer 353$b$, and an intermediate layer 354 between the first EL layer 353$a$ and the second EL layer 353$b$.

The light-emitting module 380R includes the coloring layer 367R on the substrate 570. The coloring layer transmits light of a particular wavelength and is, for example, a layer that selectively transmits light of red, green, or blue color. A region that transmits light emitted from the light-emitting element as it is may be provided as well.

The light-emitting module 380R, for example, includes a bonding layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the bonding layer 360 and through the coloring layer 367R and is emitted to the outside of the light-emitting module 380R as indicated by an arrow in FIG. 19B or 19C.

The touch panel 390 includes a light-blocking layer 367BM on the substrate 570. The light-blocking layer 367BM is provided so as to surround the coloring layer (e.g., the coloring layer 367R).

The touch panel 390 includes an anti-reflective layer 367$p$ positioned in a region overlapping with the display portion 301. As the anti-reflective layer 367$p$, a circular polarizing plate can be used, for example.

The touch panel 390 includes an insulating layer 321. The insulating layer 321 covers the transistor 302$t$. Note that the insulating layer 321 can be used as a layer for planarizing unevenness caused by the pixel circuits. An insulating layer on which a layer that can suppress diffusion of impurities to the transistor 302$t$ and the like is stacked can be used as the insulating layer 321.

The touch panel 390 includes the light-emitting elements (e.g., the light-emitting element 350R) over the insulating layer 321.

The touch panel 390 includes, over the insulating layer 321, a partition 328 that overlaps with an end portion of the lower electrode 351R. In addition, a spacer 329 that controls the distance between the substrate 510 and the substrate 570 is provided on the partition 328.

The image signal line driver circuit 303$s$(1) includes a transistor 303$t$ and a capacitor 303$c$. Note that the driver circuit can be formed in the same process and over the same substrate as those of the pixel circuits. As illustrated in FIG. 19B, the transistor 303$t$ may include a second gate 304 over the insulating layer 321. The second gate 304 may be electrically connected to a gate of the transistor 303$t$, or different potentials may be supplied to these gates. Alternatively, if necessary, the second gate 304 may be provided for a transistor 308$t$, the transistor 302$t$, or the like.

The imaging pixels 308 each include a photoelectric conversion element 308$p$ and an imaging pixel circuit for sensing light received by the photoelectric conversion element 308$p$. The imaging pixel circuit includes the transistor 308$t$.

For example, a PIN photodiode can be used as the photoelectric conversion element 308$p$.

The touch panel 390 includes a wiring 311 through which a signal is supplied. The wiring 311 is provided with a terminal 319. Note that an FPC 309(1) through which a signal such as an image signal or a synchronization signal is supplied is electrically connected to the terminal 319. Note that a printed wiring board (PWB) may be attached to the FPC 309(1).

Transistors formed in the same process can be used as the transistor 302$t$, the transistor 303$t$, the transistor 308$t$, and the like.

Gates, sources, and drains of the transistors, and various wirings and electrodes that form the touch panel can be formed to have a single-layer structure or a stacked-layer structure using, as a material, any of metals such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used, in which case the shape can be processed by etching with high controllability.

Structure Example 2

Figure 20A:
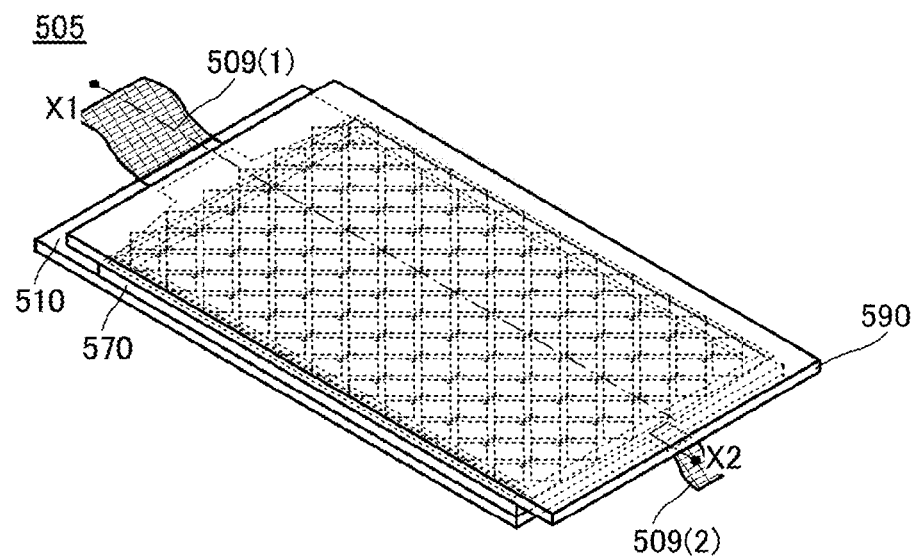
FIGS. 20A and 20B illustrate an example of a touch panel.
Figure 20B:
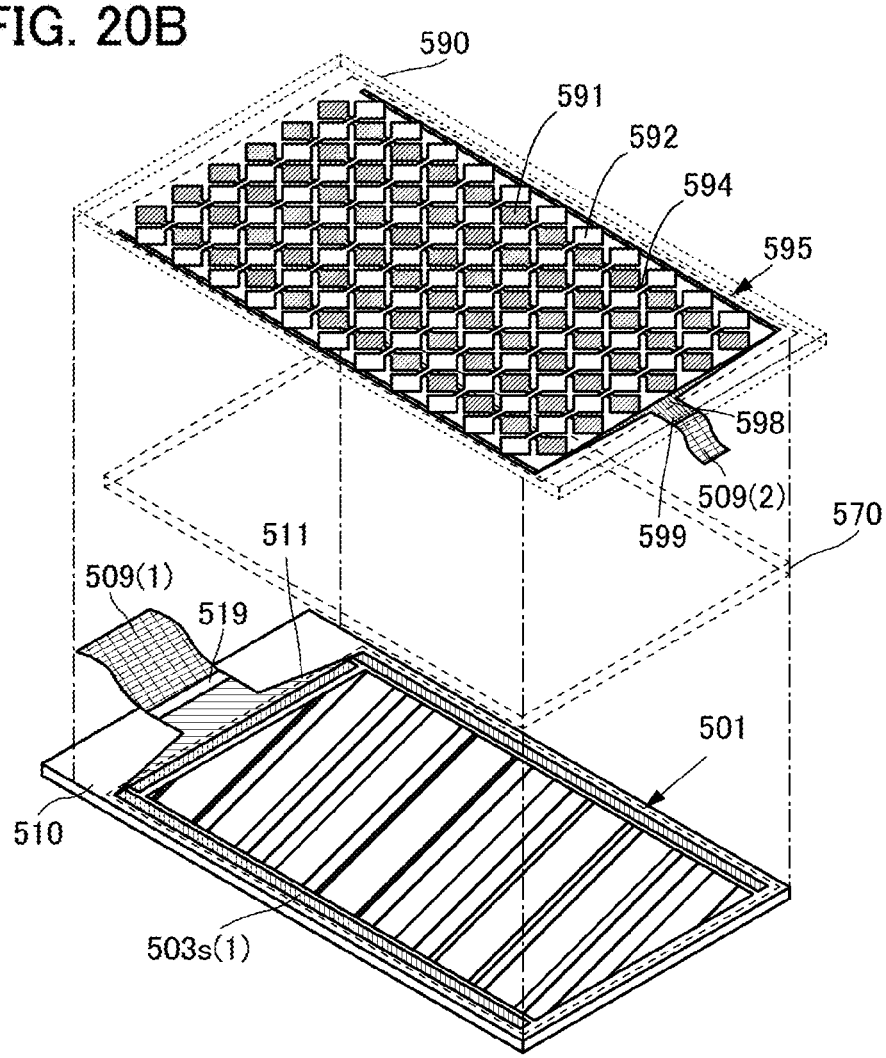
Figure 21A:
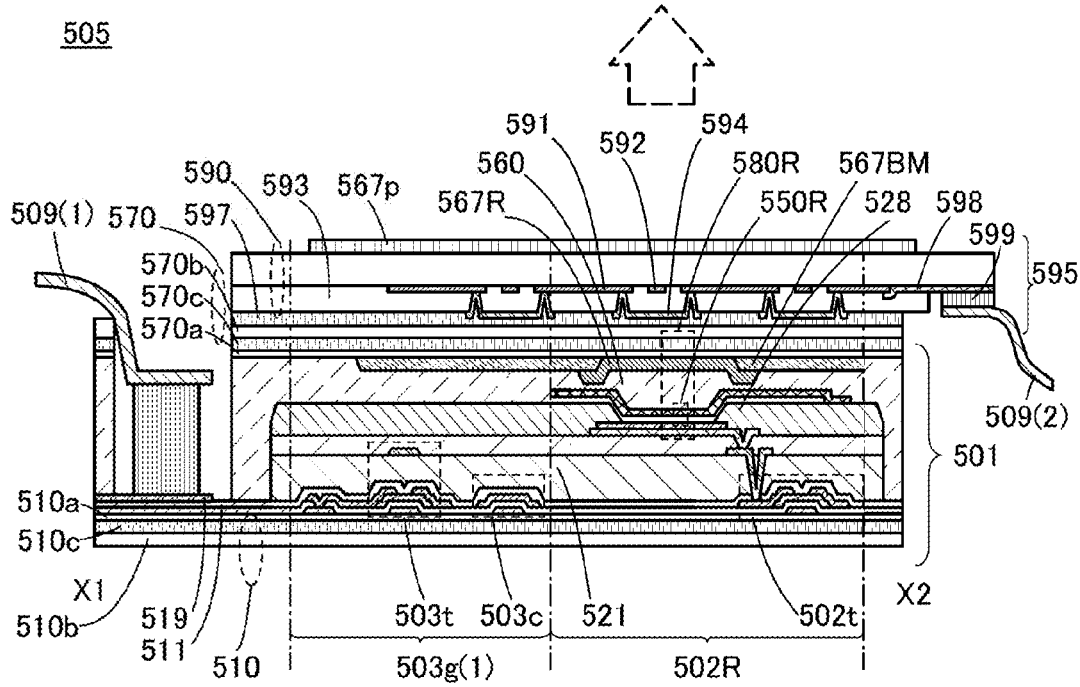
FIGS. 21A to 21C illustrate examples of a touch panel.
Figure 21B:
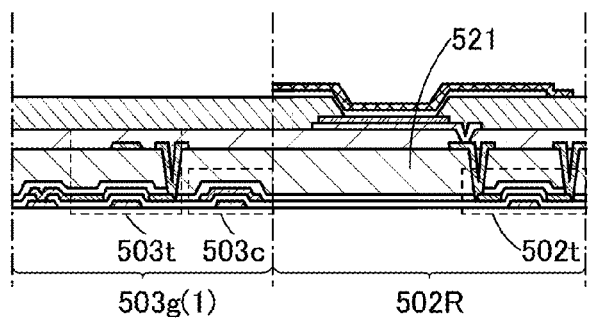
Figure 21C:
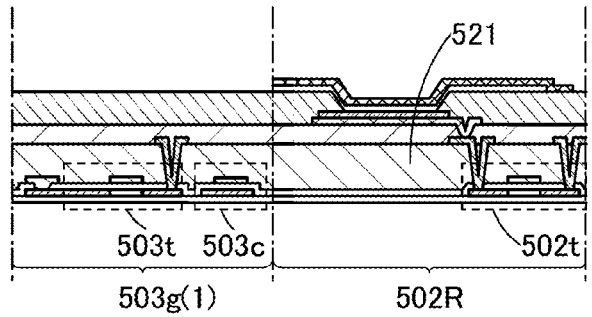

FIGS. 20A and 20B are perspective views of a touch panel 505. Note that FIGS. 20A and 20B illustrate only main components for simplicity. FIGS. 21A to 21C are each a cross-sectional view taken along the dashed-dotted line X1-X2 in FIG. 20A.

The touch panel 505 includes a display portion 501 and a touch sensor 595 (see FIG. 20B). Furthermore, the touch panel 505 includes the substrate 510, the substrate 570, and a substrate 590. Note that the substrate 510, the substrate 570, and the substrate 590 each have flexibility.

The display portion 501 includes the substrate 510, a plurality of pixels over the substrate 510, and a plurality of wirings 511 through which signals are supplied to the pixels. The plurality of wirings 511 are led to a peripheral portion of the substrate 510, and part of the plurality of wirings 511 form a terminal 519. The terminal 519 is electrically connected to an FPC 509(1).

The substrate 590 includes the touch sensor 595 and a plurality of wirings 598 electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 20B, electrodes, wirings, and the like of the touch sensor 595 provided on the back side of the substrate 590 (the side facing the substrate 510) are indicated by solid lines for clarity.

As the touch sensor 595, for example, a capacitive touch sensor can be used. Examples of the capacitive touch sensor are a surface capacitive touch sensor, a projected capacitive touch sensor, and the like.

Examples of the projected capacitive touch sensor are a self capacitive touch sensor, a mutual capacitive touch sensor, and the like, which differ mainly in the driving method. The use of a mutual capacitive type is preferable because multiple points can be sensed simultaneously.

An example of using a projected capacitive touch sensor is described below with reference to FIG. 20B.

Note that a variety of sensors that can sense the closeness or the contact of a sensing target such as a finger can be used.

The projected capacitive touch sensor 595 includes first electrodes 591 and second electrodes 592. The first electrodes 591 are electrically connected to any of the plurality of wirings 598, and the second electrodes 592 are electrically connected to any of the other wirings 598.

The second electrodes 592 each have a shape of a plurality of quadrangles arranged in one direction with one corner of a quadrangle connected to one corner of another quadrangle as illustrated in FIGS. 20A and 20B.

The first electrodes 591 each have a quadrangular shape and are arranged in a direction intersecting with the direction in which the second electrodes 592 extend.

A wiring 594 electrically connects two first electrodes 591 between which one of the second electrodes 592 is positioned. The intersecting area of the one of the second electrodes 592 and the wiring 594 is preferably as small as possible. Such a structure allows a reduction in the area of a region where the electrodes are not provided, reducing unevenness in transmittance. As a result, unevenness in luminance of light transmitted through the touch sensor 595 can be reduced.

Note that the shapes of the first electrodes 591 and the second electrodes 592 are not limited to the above-mentioned shapes and can be any of a variety of shapes. For example, a plurality of first electrodes each having a stripe shape may be provided so that space between two adjacent first electrodes are reduced as much as possible, and a plurality of second electrodes each having a stripe shape may be provided so as to intersect the first electrodes with an insulating layer sandwiched between the first electrodes and the second electrodes. In that case, two adjacent second electrodes may be spaced apart from each other. In that case, it is preferable to provide, between the two adjacent second electrodes, a dummy electrode which is electrically insulated from these electrodes, whereby the area of a region having a different transmittance can be reduced.

The touch sensor 595 includes the substrate 590, the first electrodes 591 and the second electrodes 592 provided in a staggered arrangement on the substrate 590, an insulating layer 593 covering the first electrodes 591 and the second electrodes 592, and the wiring 594 that electrically connects the adjacent first electrodes 591 to each other.

A bonding layer 597 attaches the substrate 590 to the substrate 570 so that the touch sensor 595 overlaps with the display portion 501 as illustrated in FIG. 20B and FIG. 21A.

The first electrodes 591 and the second electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The first electrodes 591 and the second electrodes 592 may be formed by depositing a light-transmitting conductive material on the substrate 590 by a sputtering method and then removing an unnecessary portion by a variety of patterning technique such as photolithography.

Examples of a material for the insulating layer 593 are a resin such as acrylic or an epoxy resin, a resin having a siloxane bond, and an inorganic insulating material such as silicon oxide, silicon oxynitride, or aluminum oxide.

Furthermore, openings reaching the first electrodes 591 are formed in the insulating layer 593, and the wiring 594 electrically connects the adjacent first electrodes 591. A light-transmitting conductive material can be favorably used as the wiring 594 because the aperture ratio of the touch panel can be increased. Moreover, a material with higher conductivity than the conductivities of the first electrode 591 and the second electrode 592 can be favorably used for the wiring 594 because electric resistance can be reduced.

Each of the second electrodes 592 extends in one direction, and the second electrodes 592 are provided in the form of stripes.

The wiring 594 intersects with one of the second electrodes 592.

Adjacent first electrodes 591 are provided with one of the second electrodes 592 provided therebetween and are electrically connected by the wiring 594.

Note that the first electrodes 591 are not necessarily arranged in the direction orthogonal to the one of the second electrodes 592.

The wirings 598 are electrically connected to the first electrodes 591 and the second electrodes 592. Part of the wirings 598 serves as a terminal. For the wirings 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer covering the insulating layer 593 and the wiring 594 may be provided to protect the touch sensor 595.

Furthermore, a connection layer 599 electrically connects the wirings 598 to the FPC 509(2).

As the connection layer 599, any of various anisotropic conductive films (ACF), anisotropic conductive pastes (ACP), or the like can be used.

The bonding layer 597 has a light-transmitting property. For example, a thermosetting resin or an ultraviolet curable resin can be used; specifically, a resin such as an acrylic resin, a urethane resin, an epoxy resin, or a resin having a siloxane bond can be used.

The display portion 501 includes a plurality of pixels arranged in a matrix. Each of the pixels includes a display element and a pixel circuit for driving the display element.

In this embodiment, an example of using a light-emitting element that emits white light as a display element will be described; however, the display element is not limited to such an element.

For example, light-emitting elements that emit light of different colors may be included in sub-pixels so that the light of different colors can be emitted from the respective sub-pixels.

Structures which are similar to those of the substrate 510, the substrate 570, and the bonding layer 560 in Structure Example 1 can be applied to the substrate 510, the substrate 570, and the sealing layer 560 in Structure Example 2.

A pixel includes a sub-pixel 502R, and the sub-pixel 502R includes a light-emitting module 580R.

The sub-pixel 502R includes a light-emitting element 550R and the pixel circuit that can supply electric power to the light-emitting element 550R and includes a transistor 502t. Furthermore, the light-emitting module 580R includes the light-emitting element 550R and an optical element (e.g., a coloring layer 567R).

The light-emitting element 550R includes a lower electrode, an upper electrode, and an EL layer between the lower electrode and the upper electrode.

The light-emitting module 580R includes the coloring layer 567R on the light extraction side.

In the case where the bonding layer 560 is provided on the light extraction side, the bonding layer 560 is in contact with the light-emitting element 550R and the coloring layer 567R.

The coloring layer 567R is positioned in a region overlapping with the light-emitting element 550R. Accordingly, part of light emitted from the light-emitting element 550R passes through the coloring layer 567R and is emitted to the outside of the light-emitting module 580R as indicated by an arrow in FIG. 21A.

The display portion 501 includes a light-blocking layer 567BM on the light extraction side. The light-blocking layer 567BM is provided so as to surround the coloring layer (e.g., the coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness caused by the pixel circuits. A stacked film including a layer that can suppress diffusion of impurities can be used as the insulating film 521. This can suppress a reduction of the reliability of the transistor 502t or the like by diffusion of impurities.

The display portion 501 includes the light-emitting elements (e.g., the light-emitting element 550R) over the insulating film 521.

The display portion 501 includes, over the insulating film 521, a partition 528 that overlaps with an end portion of the lower electrode. In addition, a spacer that controls the distance between the substrate 510 and the substrate 570 is provided on the partition 528.

A scan line driver circuit 503g(1) includes a transistor 503t and a capacitor 503c. Note that the driver circuit can be formed in the same process and over the same substrate as those of the pixel circuits.

The display portion 501 includes a wiring 511 through which a signal is supplied. The wiring 511 is provided with a terminal 519. Note that the FPC 509(1) through which a signal such as an image signal or a synchronization signal is supplied is electrically connected to the terminal 519.

Note that a printed wiring board (PWB) may be attached to the FPC 509(1).

The display portion 501 includes wirings such as scan lines, signal lines, and power supply lines. Any of the various conductive films described above can be used as the wirings.

Any of various kinds of transistors can be used in the display portion 501. A structure in the case of using bottom-gate transistors in the display portion 501 is illustrated in FIGS. 21A and 21B.

For example, a semiconductor layer containing an oxide semiconductor, amorphous silicon, or the like can be used in the transistor 502t and the transistor 503t illustrated in FIG. 21A.

For example, a semiconductor layer containing polycrystalline silicon that is obtained by crystallization process such as laser annealing can be used in the transistor 502t and the transistor 503t illustrated in FIG. 21B.

A structure in the case of using top-gate transistors in the display portion 501 is illustrated in FIG. 21C.

For example, a semiconductor layer including polycrystalline silicon, a single crystal silicon film that is transferred from a single crystal silicon substrate, or the like can be used in the transistor 502t and the transistor 503t illustrated in FIG. 21C.

Structure Example 3

FIGS. 22A to 22C are cross-sectional views of a touch panel 505B. The touch panel 505B described in this embodiment is different from the touch panel 505 in Structure Example 2 in that the display portion 501 displays received image data on the side where the transistors are provided and that the touch sensor is provided on the substrate 510 side of the display portion. Different structures will be described in detail below, and the above description is referred to for the other similar structures.

The coloring layer 567R is positioned in a region overlapping with the light-emitting element 550R. The light-emitting element 550R illustrated in FIG. 22A emits light to the side where the transistor 502t is provided. Accordingly, part of light emitted from the light-emitting element 550R passes through the coloring layer 567R and is emitted to the outside of the light-emitting module 580R as indicated by an arrow in FIG. 22A.

The display portion 501 includes the light-blocking layer 567BM on the light extraction side. The light-blocking layer 567BM is provided so as to surround the coloring layer (e.g., the coloring layer 567R).

The touch sensor 595 is provided on the substrate 510 side of the display portion 501 (see FIG. 22A).

The bonding layer 597 is provided between the substrate 510 and the substrate 590 and attaches the touch sensor 595 to the display portion 501.

Any of various kinds of transistors can be used in the display portion 501. A structure in the case of using bottom-gate transistors in the display portion 501 is illustrated in FIGS. 22A and 22B.

For example, a semiconductor layer containing an oxide semiconductor, amorphous silicon, or the like can be used in the transistor 502t and the transistor 503t illustrated in FIG. 22A.

For example, a semiconductor layer containing polycrystalline silicon or the like can be used in the transistor 502t and the transistor 503t illustrated in FIG. 22B.

A structure in the case of using top-gate transistors in the display portion 501 is illustrated in FIG. 22C.

For example, a semiconductor layer containing polycrystalline silicon, a single crystal silicon film that is transferred from a single crystal silicon substrate, or the like can be used in the transistor 502t and the transistor 503t illustrated in FIG. 22C.

This embodiment can be combined with any other embodiment as appropriate.

Embodiment 4

In this embodiment, electronic devices and lighting devices which can be manufactured by one embodiment of the present invention will be described with reference to FIGS. 23A to 23G and FIGS. 24A to 24I.

A variety of devices such as a light-emitting device, a display device, and a semiconductor device that can be used for an electronic device or a lighting device can be manufactured with a high yield by one embodiment of the present invention. Moreover, a flexible electronic device or lighting device having high productivity can be manufactured by one embodiment of the present invention. Furthermore, an electronic device or a lighting device having high reliability and high resistance to repeated bending can be manufactured by one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The device manufactured by one embodiment of the present invention has flexibility and therefore can be incorporated along a curved inside/outside wall surface of a house or a building or a curved interior/exterior surface of a car.

Figure 23A:
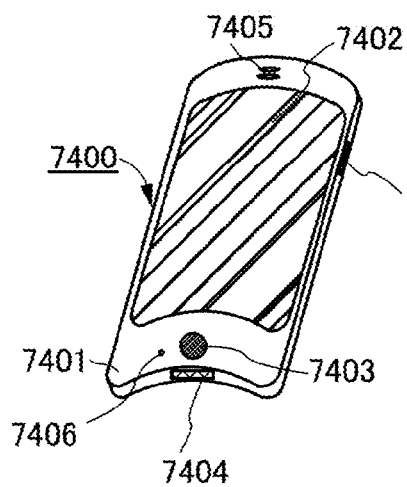
FIGS. 23A to 23G illustrate examples of electronic devices and lighting devices.

FIG. 23A illustrates an example of a cellular phone. A cellular phone 7400 includes a display portion 7402 incorporated in a housing 7401, an operation button 7403, an external connection port 7404, a speaker 7405, a microphone 7406, and the like. Note that the cellular phone 7400 is manufactured using the display device manufactured by one embodiment of the present invention for the display portion 7402. According to one embodiment of the present invention, a highly reliable cellular phone having a curved display portion can be provided with a high yield.

When the display portion 7402 of the cellular phone 7400 in FIG. 23A is touched with a finger or the like, data can be input into the cellular phone 7400. Moreover, operations such as making a call and inputting a letter can be performed by touch on the display portion 7402 with a finger or the like.

With the operation button 7403, power ON or OFF can be switched. In addition, a variety of images displayed on the display portion 7402 can be switched; switching a mail creation screen to a main menu screen, for example.

Figure 23B:
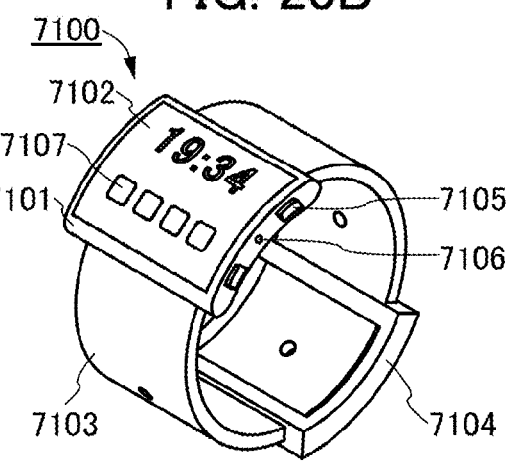

FIG. 23B is an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power ON/OFF, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device manufactured by one embodiment of the present invention. According to one embodiment of the present invention, a highly reliable portable information terminal having a curved display portion can be provided with a high yield.

Figure 23C:
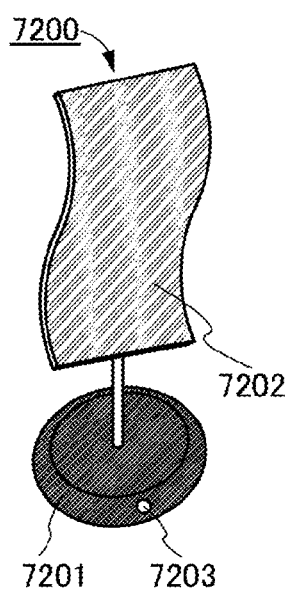
Figure 23D:
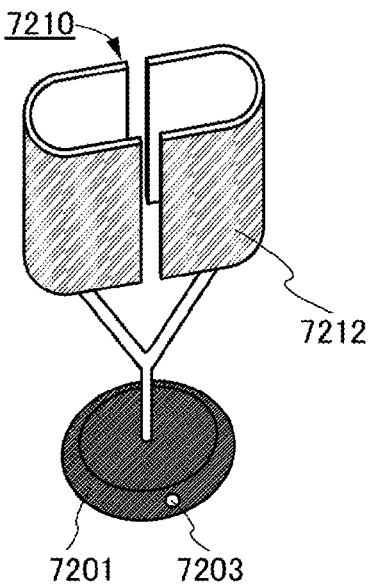
Figure 23E:
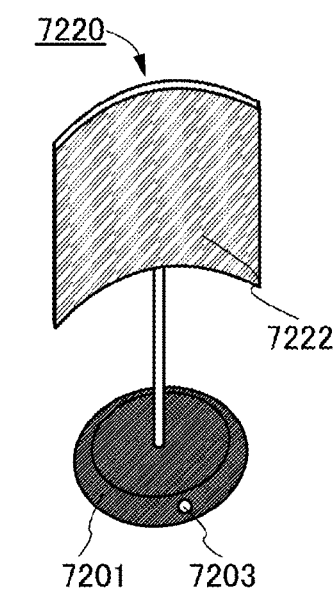

FIGS. 23C to 23E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 23C includes a light-emitting portion 7202 having a wave-shaped light-emitting surface, which is a good-design lighting device.

A light-emitting portion 7212 included in the lighting device 7210 in FIG. 23D has two convex-curved light-emitting portions symmetrically placed. Thus, all directions can be illuminated with the lighting device 7210 as a center.

The lighting device 7220 illustrated in FIG. 23E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device manufactured by one embodiment of the present invention. According to one embodiment of the present invention, a highly reliable lighting device having a curved light-emitting portion can be provided with a high yield.

Figure 23F:
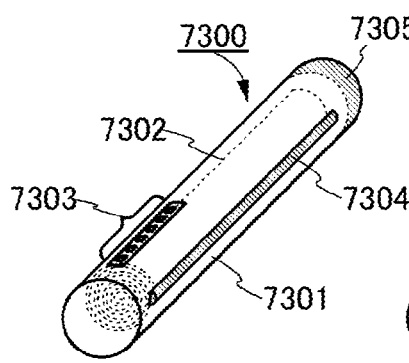

FIG. 23F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 23G:
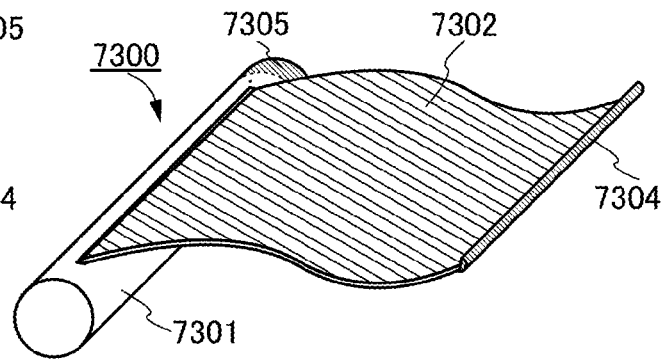

FIG. 23G illustrates the display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 23F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device manufactured by one embodiment of the present invention. According to one embodiment of the present invention, a lightweight and highly reliable display device can be provided with a high yield.

Figure 24A:
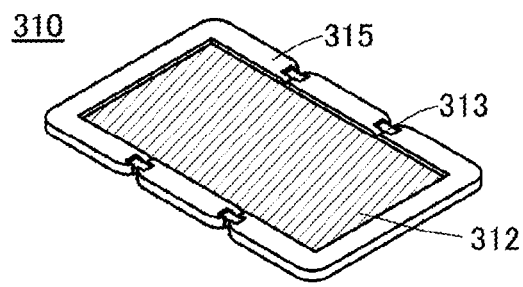
FIGS. 24A to 24I illustrate examples of electronic devices.
Figure 24F:
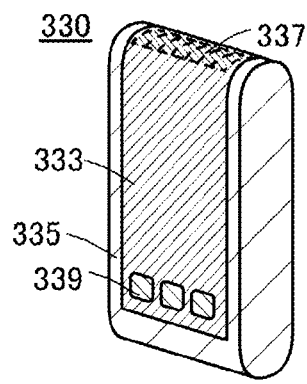
Figure 24B:
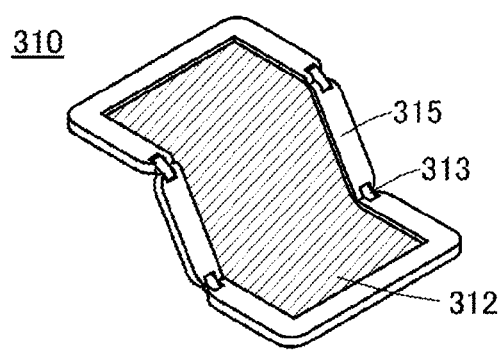
Figure 24G:
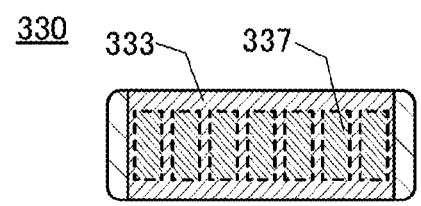
Figure 24C:
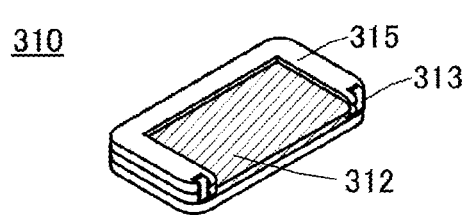

FIGS. 24A to 24C illustrate a foldable portable information terminal 310. FIG. 24A illustrates the portable information terminal 310 that is opened. FIG. 24B illustrates the portable information terminal 310 that is being opened or being folded. FIG. 24C illustrates the portable information terminal 310 that is folded. The portable information terminal 310 is highly portable when folded. The portable information terminal 310 is highly browsable when opened because of its seamless large display region.

A display panel 312 is supported by three housings 315 joined together by hinges 313. By folding the portable information terminal 310 at a connection portion between two housings 315 with the hinges 313, the portable information terminal 310 can be reversibly changed in shape from an opened state to a folded state. A display device manufactured by one embodiment of the present invention can be used for the display panel 312. For example, a display device that can be bent with a radius of curvature of greater than or equal to 1 mm and less than or equal to 150 mm can be used.

Figure 24H:
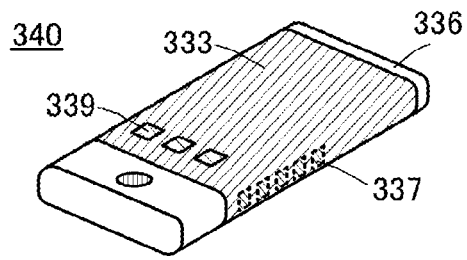
Figure 24D:
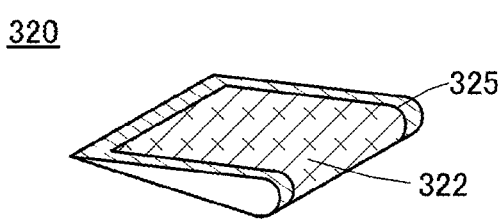
Figure 24I:
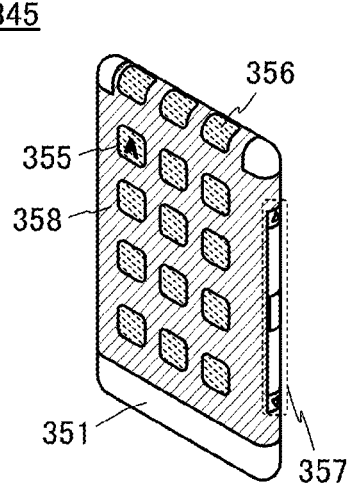
Figure 24E:
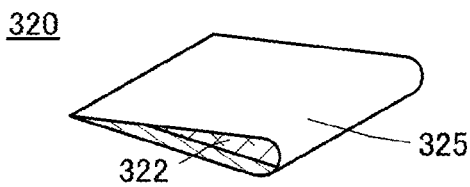

FIGS. 24D and 24E each illustrate a foldable portable information terminal 320. FIG. 24D illustrates the portable information terminal 320 that is folded so that a display portion 322 is on the outside. FIG. 24E illustrates the portable information terminal 320 that is folded so that the display portion 322 is on the inside. When the portable information terminal 320 is not used, the portable information terminal 320 is folded so that a non-display portion 325 faces the outside, whereby the display portion 322 can be prevented from being contaminated or damaged. A display device manufactured by one embodiment of the present invention can be used for the display portion 322.

FIG. 24F is a perspective view illustrating an external shape of the portable information terminal 330. FIG. 24G is a top view of the portable information terminal 330. FIG. 24H is a perspective view illustrating an external shape of a portable information terminal 340.

The portable information terminals 330 and 340 each function as, for example, one or more of a telephone set, a notebook, an information browsing system, and the like. Specifically, the portable information terminals 330 and 340 each can be used as a smartphone.

The portable information terminals 330 and 340 can display characters and image information on its plurality of surfaces. For example, three operation buttons 339 can be displayed on one surface (FIGS. 24F and 24H). In addition, information 337 indicated by dashed rectangles can be displayed on another surface (FIGS. 24G and 24H). Examples of the information 337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 339, an icon, or the like may be displayed in place of the information 337. Although FIGS. 24F and 24G illustrate an example in which the information 337 is displayed at the top, one embodiment of the present invention is not limited thereto. For example, the information may be displayed on the side as in the portable information terminal 340 in FIG. 24H.

For example, a user of the portable information terminal 330 can see the display (here, the information 337) with the portable information terminal 330 put in a breast pocket of his/her clothes.

Specifically, a caller's phone number, name, or the like of an incoming call is displayed in a position that can be seen from above the portable information terminal 330. Thus, the user can see the display without taking out the portable information terminal 330 from the pocket and decide whether to answer the call.

A display device manufactured by one embodiment of the present invention can be used for a display portion 333 mounted in each of a housing 335 of the portable information terminal 330 and a housing 336 of the portable information terminal 340. One embodiment of the present invention makes it possible to provide a highly reliable display device having a curved display portion with a high yield.

As in a portable information terminal 345 illustrated in FIG. 24I, data may be displayed on three or more surfaces. Here, data 355, data 356, and data 357 are displayed on different surfaces.

For a display portion 358 included in a housing 351 of the portable information terminal 345, a display device manufactured by one embodiment of the present invention can be used. One embodiment of the present invention makes it possible to provide a highly reliable display device having a curved display portion with a high yield.

This embodiment can be combined with any other embodiment as appropriate.

Example 1

In this example, a plurality of flexible samples which differ in the material of a bonding layer were fabricated and crack occurrence was checked.

[Fabrication of Samples]

A method for fabricating samples of this example is described with reference to FIGS. 13A to 13C and FIGS. 14A to 14C.

First, an approximately 200-nm-thick silicon oxynitride film was formed as a base film (not illustrated) over a glass substrate serving as the formation substrate 101. The silicon oxynitride film was formed by a plasma CVD method under the following conditions: the flow rates of a silane gas and an $N_2O$ gas were 10 sccm and 1200 sccm, respectively, the power supply was 30 W, the pressure was 22 Pa, and the substrate temperature was 330° C. The base film can also function as an etching stopper of the glass substrate.

Next, a 30-nm-thick tungsten film serving as the peeling layer 103 was formed over the base film. The tungsten film was formed by a sputtering method under the following conditions: the flow rate of an Ar gas was 100 sccm, the power supply was 60 kW, the pressure was 2 Pa, and the substrate temperature was 100° C.

Next, dinitrogen monoxide ($N_2O$) plasma treatment was performed. The $N_2O$ plasma treatment was performed for 240 seconds under the following conditions: the flow rate of an $N_2O$ gas was 100 sccm, the power supply was 500 W, the pressure was 100 Pa, and the substrate temperature was 330° C.

Next, a layer to be peeled was formed over the peeling layer 103. The layer to be peeled includes the insulating layer 813, the transistors, the conductive layer 857, the insulating layer 815, the insulating layer 817, the lower electrode 831, the insulating layer 821, and the spacer 827 which are illustrated in FIG. 13A.

The insulating layer 813 was formed by stacking a first silicon oxynitride film, a silicon nitride film, a second silicon oxynitride film, a silicon nitride oxide film, and a third silicon oxynitride film in this order.

Specifically, first, the first silicon oxynitride film was formed to a thickness of approximately 600 nm over the peeling layer 103. The first silicon oxynitride film was formed by a plasma CVD method under the following conditions: the flow rates of a silane gas and an $N_2O$ gas were 75 sccm and 1200 sccm, respectively, the power supply was 120 W, the pressure was 70 Pa, and the substrate temperature was 330° C.

Then, the first silicon oxynitride film was processed into an island shape by wet etching and the peeling layer 103 was processed into an island shape by dry etching.

Next, the silicon nitride film was formed to a thickness of approximately 200 nm over the first silicon oxynitride film. The silicon nitride film was formed by a plasma CVD method under the following conditions: the flow rates of a silane gas, an $H_2$ gas, and an $NH_3$ gas were 30 sccm, 800 sccm, and 300 sccm, respectively, the power supply was 600 W, the pressure was 60 Pa, and the substrate temperature was 330° C.

Next, the second silicon oxynitride film was formed to a thickness of approximately 200 nm over the silicon nitride film. The second silicon oxynitride film was formed by a plasma CVD method under the following conditions: the flow rates of a silane gas and an $N_2O$ gas were 50 sccm and 1200 sccm, respectively, the power supply was 120 W, the pressure was 70 Pa, and the substrate temperature was 330° C.

Then, the silicon nitride oxide film was formed to a thickness of approximately 140 nm over the second silicon oxynitride film. The silicon nitride oxide film was formed by a plasma CVD method under the following conditions: the flow rates of a silane gas, an $H_2$ gas, an $N_2$ gas, an $NH_3$ gas, and an $N_2O$ gas were 110 sccm, 800 sccm, 800 sccm, 800 sccm, and 70 sccm, respectively, the power supply was 320 W, the pressure was 100 Pa, and the substrate temperature was 330° C.

After that, the third silicon oxynitride film was formed to a thickness of approximately 100 nm over the silicon nitride oxide film. The third silicon oxynitride film was formed under the same conditions as the base film.

After that, heat treatment was performed at 450° C. in a nitrogen atmosphere for one hour.

The stacked-layer structure of the three layers of the tungsten film, the first silicon oxynitride film, and the silicon nitride film and the heat treatment are preferable conditions to perform peeling with a high yield.

The second silicon oxynitride film, the silicon nitride oxide film, and the third silicon oxynitride film adjust the stress on the entire insulating layer 813 and function as a moisture-proof layer.

In this way, such inorganic films for forming the peeling layer and the insulating layer have both peelability and a moisture-proof property, and are preferable for manufacturing a highly reliable flexible device.

As the transistor, a transistor including a c-axis aligned crystalline oxide semiconductor (CAAC-OS) was used. Since the CAAC-OS, which is not amorphous, has few defect states, using the CAAC-OS can improve the reliability of the transistor. Moreover, since the CAAC-OS does not have a grain boundary, stress that is caused by bending a flexible device does not easily make a crack occur in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

In this example, a channel-etched transistor including an In—Ga—Zn-based oxide was used. The transistor was fabricated over a glass substrate at a process temperature lower than 500° C.

In a method for fabricating an element such as a transistor directly on an organic resin such as a plastic substrate, the temperature of the process for fabricating the element needs to be lower than the heat-resistant temperature of the organic resin. In this example, the formation substrate is a glass substrate and the peeling layer, which is an inorganic film, has high heat resistance; thus, the transistor can be fabricated at a temperature equal to that when a transistor is fabricated over a glass substrate. Thus, the performance and reliability of the transistor can be easily secured.

Then, the layer to be peeled is attached to the substrate 109 with the bonding layer 107 (FIG. 13C). The materials of the substrate 109 and the bonding layer 107 differ from sample to sample (see Table 1 below). The substrate 109 in each sample has flexibility.

In each sample except a sample 4, the bonding layer 107 was formed using a laminator, and the thickness of the bonding layer 107 was approximately greater than or equal to 3 μm and approximately less than or equal to 10 μm. In the sample 4, the bonding layer 107 was formed with a spin coater, and the thickness of the bonding layer 107 was approximately greater than or equal to 10 μm and approximately less than or equal to 20 μm.

The thickness of the substrate 109 was 125 µm. Note that in the sample 4, a UV-curable adhesive film UDT-1025MC (manufactured by DENKA ADTECS CO., LTD) was used as the substrate 109. A thickness of 25 µm of the total thickness, 125 µm, corresponds to an adhesive layer.

Next, a peeling starting point was formed by laser light irradiation, and the layer to be peeled and the formation substrate 101 were separated from each other (FIG. 13C and FIG. 14A).

After that, an exposed surface of the insulating layer 813 was observed, and crack occurrence was checked.

[Experimental Result]

Table 1 shows kinds of the bonding layers 107 and the substrates 109 used in the respective samples and the hardness of each bonding layer 107. Furthermore, Table 1 also shows result of crack occurrence which is judged by observing the surface of the insulating layer 813 after peeling. Here, the case where a crack was hardly observed was indicated by circles (o), and the case where a number of cracks were observed was indicated by crosses (x).

substrate serving as the formation substrate 101. Next, a 30-nm-thick tungsten film serving as the peeling layer 103 was formed over the base film. Next, dinitrogen monoxide ($N_2O$) plasma treatment was performed. Next, a layer to be peeled was formed over the peeling layer 103. The layer to be peeled includes the insulating layer 813, the transistors, the conductive layer 857, the insulating layer 815, the insulating layer 817, the lower electrode 831, the insulating layer 821, and the spacer 827 which are illustrated in FIG. 13A. The insulating layer 813 was formed by stacking a first silicon oxynitride film, a first silicon nitride film, a second silicon oxynitride film, a silicon nitride oxide film, and a third silicon oxynitride film in this order. After that, heat treatment was performed at 450° C. in a nitrogen atmosphere for one hour. As the transistor, a transistor including a CAAC-OS was used. In this example, a channel-etched transistor including an In—Ga—Zn-based oxide was used. Since the steps up to here are similar to those of Example 1, the detailed description is omitted.

Then, the layer to be peeled is attached to the substrate 109 with the bonding layer 107 (FIG. 13C). As the substrate

TABLE 1

| | | sample 1 | sample 2 | sample 3 | sample 4 | sample 5 | sample 6 |
|---|---|---|---|---|---|---|---|
| bonding layer 107 | material | material a | material b | material c | material d | material e | material f |
| | | two-part curable epoxy-based resin | | | UV curable acrylic-based resin | two-part curable epoxy-based resin | acrylic-based adhesive layer |
| | hardness | shore D of 84-86 | shore D of 82.5 | shore D of 82 | shore D of 80 | shore D of 70 | JIS K6253 E25 degrees |
| substrate 109 | | Kapton ®500H (DU PONT-TORAY CO. LTD.) | | | UDT-1025MC (DENKA ADTECS CO., LTD.) | Kapton ®500H (DU PONT-TORAY CO. LTD.) | |
| result of crack occurrence judged by surface observation | | o | o | o | o | x | x |

According to the result of surface observation, a number of cracks were found to occur in the fabricating process in a sample 5 using a material e having hardness of Shore D of 70 for the bonding layer 107 and a sample 6 using a material f having hardness of E25 degrees in accordance with JIS K6253 which is lower than Shore D of 70. On the other hand, in a sample 1, a sample 2, a sample 3, and the sample 4 using a material a, a material b, a material c, and a material d having hardness higher than or equal to Shore D of 80, respectively, a fatal crack did not occur in the fabricating process.

Thus, the hardness of the bonding layer used for the flexible light-emitting device of one embodiment of the present invention was found to be preferably higher than Shore D of 70, or further preferably higher than or equal to Shore D of 80. Accordingly, occurrence of cracks in the fabricating process can be suppressed. Therefore, the yield of the light-emitting device can be improved. Additionally, the reliability of the light-emitting device can be improved.

Example 2

In this example, a plurality of flexible samples which differ in the material of a flexible substrate were fabricated and crack occurrence was checked.

[Fabrication of Samples]

A method for fabricating samples of this example is described with reference to FIGS. 13A to 13C and FIGS. 14A to 14C.

First, an approximately 200-nm-thick silicon oxynitride film was formed as a base film (not illustrated) over a glass 109 and the bonding layer 107, a UV-curable adhesive film and the material d which is a water-soluble resin were used, respectively, in a manner similar to that of the sample 4 of Example 1.

Next, a peeling starting point was formed by laser light irradiation, and the layer to be peeled and the formation substrate 101 were separated from each other (FIG. 13C and FIG. 14A).

After that, the substrate 801 is attached to an exposed surface of the insulating layer 813 with the bonding layer 811 (FIG. 14B). As the material of the bonding layer 811, the material c, a two-part curable epoxy-based resin, which was used for the bonding layer 107 in the sample 3 of Example 1, was used. The material of the substrate 801 differs from sample to sample (see Table 2 below).

Next, by removal of the bonding layer 107 and the substrate 109 (FIG. 14B), the exposed surface (the surface on which the spacer 827 and the like are formed as illustrated in FIG. 14C) was observed, and crack occurrence was checked. As a result of the observation, there was hardly any crack in each sample.

[Heat Treatment]

The fabricated samples were each heated at 60° C. for one hour. After that, the same surface was observed, and crack occurrence was checked. As for a sample in which a fatal crack (e.g., a large crack, a number of cracks, or the like) was observed after the heat treatment, the experiment was terminated at that time and subsequent heat treatment was not performed.

Next, the sample in which a crack was hardly observed was heated at 80° C. for one hour. After that, crack occurrence was checked similarly.

Then, the sample in which a crack was hardly observed was still further heated at 100° C. for one hour. After that, crack occurrence was checked.

[Experimental Result]

Table 2 shows kinds and coefficients of expansion of the substrate 801 used in respective samples. Furthermore, Table 2 also shows result of crack occurrence which is judged by observing the surface of the sample before and after the heat treatment. Here, the case where a crack was hardly observed was indicated by circles (o), and the case where a number of cracks were observed was indicated by crosses (x).

TABLE 2

| | | sample 7 | sample 8 | sample 9 | sample 10 | sample 11 | sample 12 |
|---|---|---|---|---|---|---|---|
| substrate 801 | material | materaial m polyethylene terephthalate | materaial n polyethylene terephthalate | materaial o polyimide | materaial p polyimide | materaial q cyclic olefin | materaial r polycarbonate |
| | thickness (μm) | 125 | 100 | 125 | 100 | 100 | 100 |
| | coefficient of expansion (ppm/° C.) | 10 | 13-20 | 27 | 58 | 65 | 70 |
| crack occurrence judged by surface observation | before heat treatment | o | o | o | o | o | o |
| | at 60° C. for 1 hour | o | o | o | o | x | x |
| | at 80° C. for 1 hour | o | o | o | x | | |
| | at 100° C. for 1 hour | o | o | o | | | |

According to the result of surface observation after the heat treatment, in a sample 10, a sample 11, and a sample 12 whose coefficients of expansion of the substrates 801 were each greater than or equal to 58 ppm/° C., a fatal crack was found to occur after the heat treatment at 60° C. for one hour or at 80° C. for one hour. On the other hand, in a sample 7, a sample 8, and a sample 9 whose coefficients of expansion of the substrates 801 were each less than or equal to 27 ppm/° C., a fatal crack did not occur even after the heat treatment at 100° C. for one hour.

Thus, the coefficient of expansion of the flexible substrate used for the flexible light-emitting device of one embodiment of the present invention was found to be preferably less than 58 ppm/° C., or further preferably less than or equal to 27 ppm/° C. With such a coefficient of expansion, occurrence of cracks at the heat treatment can be suppressed. Therefore, the reliability of the light-emitting device can be improved.

Example 3

In this example, the flexible light-emitting device of one embodiment of the present invention was fabricated and its reliability was evaluated.

The structure of Specific Example 2 (FIGS. 3B and 3D) described in Embodiment 1 is applied to the light-emitting device fabricated in this example. Description in Embodiment 1 can be referred to for the details.

In this example, the light-emitting device was fabricated by the second peeling method described in Embodiment 2.

First, the peeling layer 203 was formed over a glass substrate serving as the formation substrate 201, and the layer 205 was formed over the peeling layer 203 (FIG. 8A). In addition, the peeling layer 223 was formed over a glass substrate serving as the formation substrate 221, and the layer 225 was formed over the peeling layer 223 (FIG. 8B). Next, the formation substrate 201 and the formation substrate 221 were attached to each other so that the surfaces on which the layers to be peeled are formed face each other (FIG. 8C). Then, the two formation substrates were peeled from the respective layers to be peeled, and flexible substrates were attached to the respective layers to be peeled (FIG. 10D). Materials for each of the layers are described below.

A stacked-layer structure of a tungsten film and a tungsten oxide film thereover was formed as each of the peeling layer 203 and the peeling layer 223.

The peeling layer having the stacked-layer structure right after deposition is not easily peeled; however, by reaction with an inorganic insulating film by heat treatment, the state of the interface between the peeling layer and the inorganic insulating film is changed to become brittle. Then, forming a peeling starting point enables physical peeling.

As the layer 205, the insulating layer 813, a transistor, and an organic EL element serving as the light-emitting element 830 were formed. A color filter, which corresponds to the coloring layer 845, and the like were formed as the layer 225.

A structure and a formation method similar to those of the insulating layer 813 formed in Example 1 were applied to the insulating layer 813 and the insulating layer 843.

As the transistor, a transistor including a CAAC-OS was used. In this example, a channel-etched transistor including an In—Ga—Zn-based oxide was used. The transistor was fabricated over a glass substrate at a process temperature lower than 500° C.

In a method for fabricating an element such as a transistor directly on an organic resin such as a plastic substrate, the temperature of the process for fabricating the element needs to be lower than the upper temperature limit of the organic resin. In this example, the formation substrate is a glass substrate and the peeling layer, which is an inorganic film, has high heat resistance; thus, the transistor can be fabricated at a temperature equal to that when a transistor is fabricated over a glass substrate. Thus, the performance and reliability of the transistor can be easily secured.

As the light-emitting element 830, a tandem organic EL element that included a fluorescence-emitting unit including a blue light-emitting layer and a phosphorescence-emitting unit including a green light-emitting layer and a red light-emitting layer was used. The light-emitting element 830 is a top-emission light-emitting element. As the lower electrode 831 of the light-emitting element 830, an aluminum film, a titanium film over the aluminum film, and an ITO film serving as an optical adjustment layer over the titanium film were stacked. The thickness of the optical adjustment layer was varied depending on the color of the pixel. Owing to the combination of a color filter and a microcavity structure, light with high color purity can be extracted from the light-emitting device fabricated in this example.

A 20-μm-thick organic resin film having a coefficient of expansion less than or equal to 27 ppm/° C. was used as the substrate 801 and the substrate 803.

For the bonding layer 823, the bonding layer 811, and the bonding layer 841, a two-part curable epoxy-based resin having hardness of Shore D of 82, which is similar to the material c used for the sample 3 of Example 1, was used.

Figure 26:
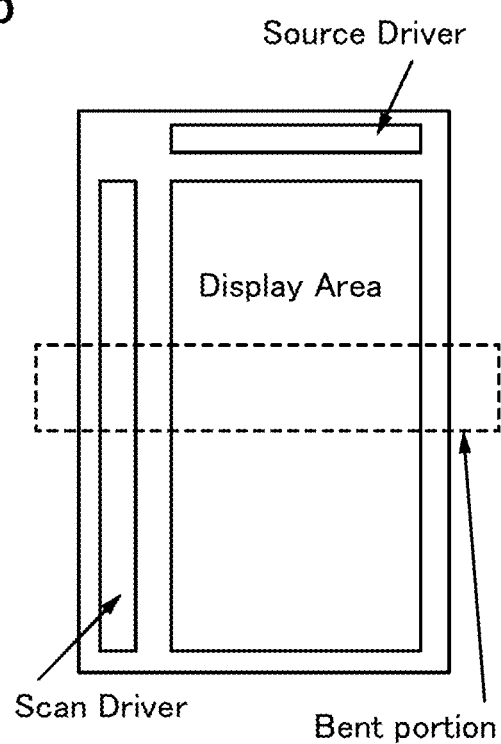
FIG. 26 illustrates a bent portion.

FIG. 26 illustrates the light-emitting device fabricated in this example. The fabricated light-emitting device had a size of a light-emitting portion (pixel portion) of 3.4 inches diagonal, 540×960×3 (RGB) pixels, a pixel pitch of 0.078 mm×0.078 mm, a resolution of 326 ppi, and an aperture ratio of 56.9%. The light-emitting device had a built-in scan driver (gate driver) and source driver. In addition, the light-emitting device had a thickness less than or equal to 100 μm and a weight of 2 g.

Figure 25A:
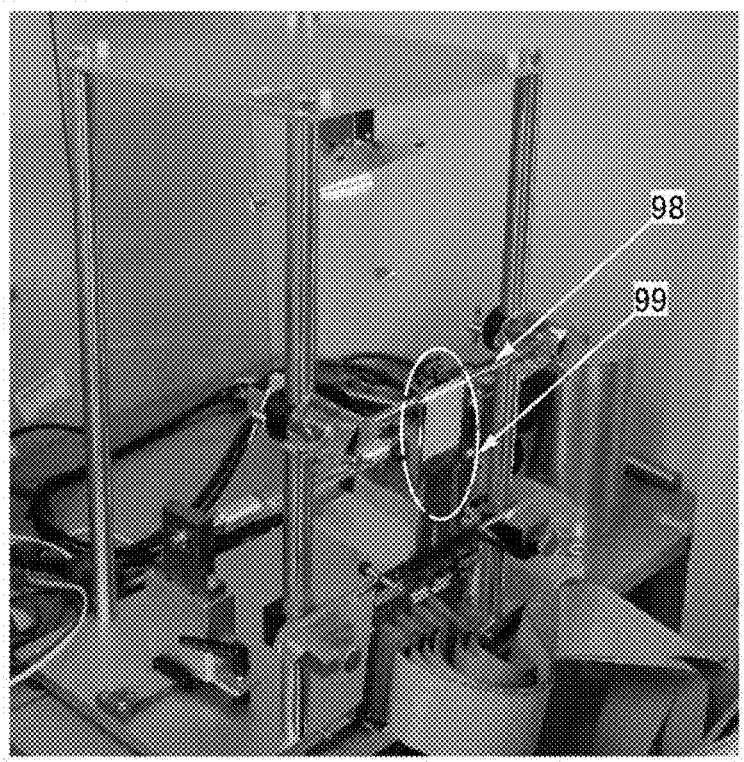
FIGS. 25A to 25C are photographs and diagrams illustrating a bending test.
Figure 25B:
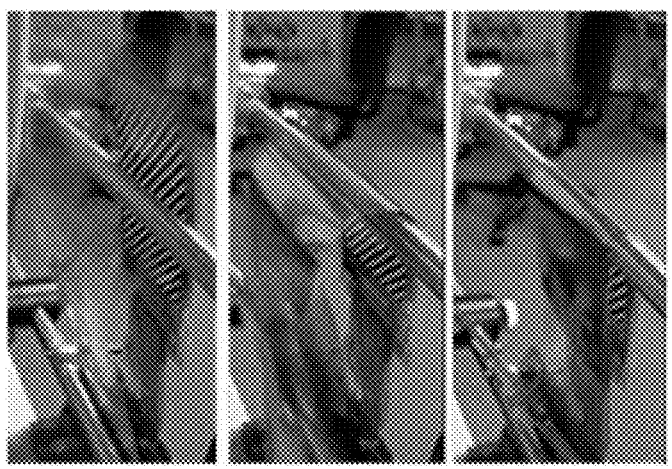
Figure 25C:
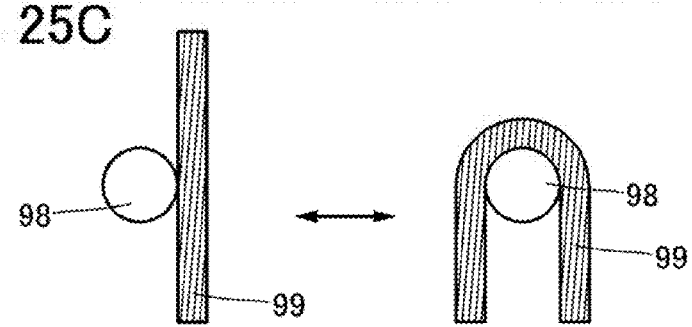

The fabricated light-emitting device was bent repeatedly while displaying an image. As illustrated in FIG. 26, a bent portion is a middle portion of the light-emitting device and includes the light-emitting portion (Display Area) and the scan driver (Scan Driver). FIG. 25A is a photograph showing a bend tester where the light-emitting device is set. FIG. 25B shows how a bending test is performed. Fixing the side where an FPC is provided allows the bending test to be performed while the light-emitting device is driven. As illustrated in FIG. 25C, the radius of curvature for bending a light-emitting device 99 was determined by the diameter of a metal rod 98. Four rods with diameters of 10 mm, 6 mm, 4 mm, and 2 mm were used as the rod 98. In other words, four bending tests with radiuses of curvature of 5 mm, 3 mm, 2 mm, and 1 mm were performed on the light-emitting device. Note that here, "outward bending" means bending performed such that a display surface of the light-emitting device faces outward, and "inward bending" means bending performed such that a display surface faces inward. FIG. 25B shows states during an inward bending test. In the bending test, one bending was performed in approximately 2 seconds. In the case where the radius of curvature was 5 mm, the display portion had no defect and the driver operated normally after either outward bending or inward bending performed 100,000 times. When inward bending with a radius of curvature of 3 mm was performed 100,000 times, the display portion had no defect and the driver operated normally. When inward bending with a radius of curvature of 2 mm was performed 100,000 times, the display portion had no defect and the driver operated normally. When inward bending with a radius of curvature of 1 mm was performed 4,000 times, the display portion had no defect and the driver operated normally.

FIG. 27A shows the appearance of the light-emitting device after being subjected to bending with a radius of curvature of 5 mm 100,000 times. FIG. 27B shows display states before and after the bending test. As shown in FIG. 27A, warpage due to bending and a scratch on a surface were caused in the light-emitting device; however, the display state and the operation of the driver had no problem. Furthermore, a preservation test was performed at a high temperature of 65° C. and a high humidity of 90% for 100 hours after the bending test. FIG. 27C shows display states of the light-emitting device before and after the preservation test. No defect was also observed in the bent portion after the preservation test, and a crack did not probably occur in the inorganic insulating film or the like in the light-emitting device.

Figure 28A:
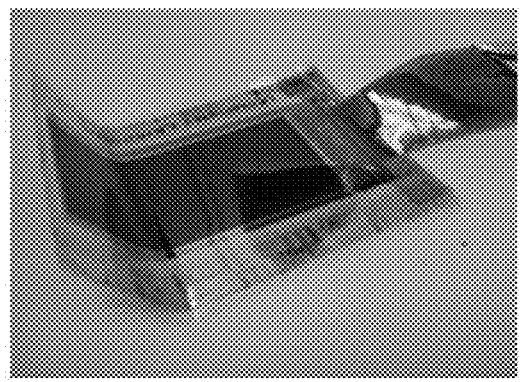
FIGS. 28A to 28C show results of a bending test and a preservation test.
Figure 28B:
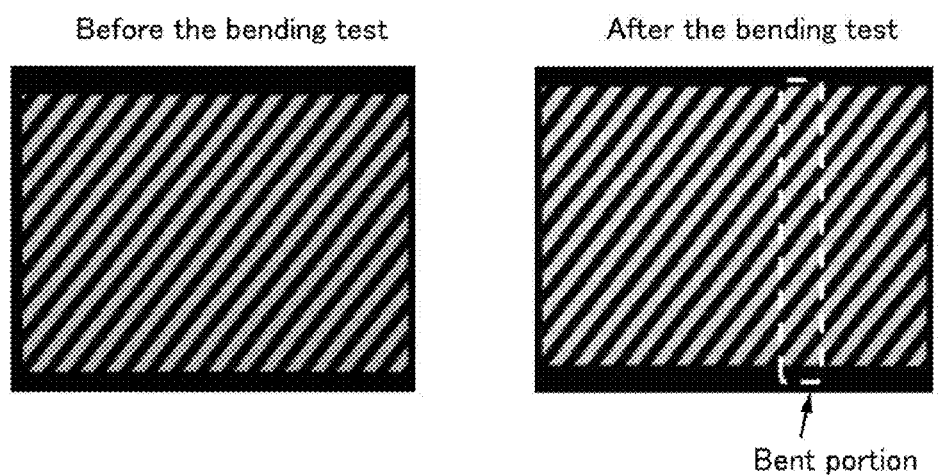
Figure 28C:
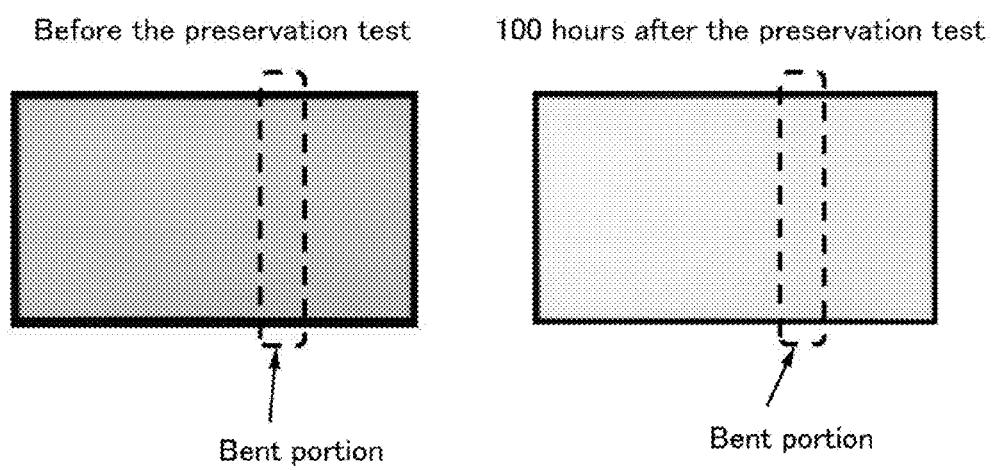

FIG. 28A shows the appearance of the light-emitting device after being subjected to the bending with a radius of curvature of 2 mm 100,000 times. FIG. 28B shows display states before and after the bending test. As shown in FIG. 28A, warpage due to bending and a scratch on a surface were caused in the light-emitting device; however, the display state and the operation of the driver had no problem. Furthermore, a preservation test was performed at a high temperature of 65° C. and a high humidity of 90% for 100 hours after the bending test. FIG. 28C shows display states of the light-emitting device before and after the preservation test. No defect was also observed in the bent portion after the preservation test, and a crack did not probably occur in the inorganic insulating film or the like in the light-emitting device.

The result of the bending test with the bend tester involves factors such as tensile stress, compressive stress, and friction as well as simple bending.

Figure 29A:
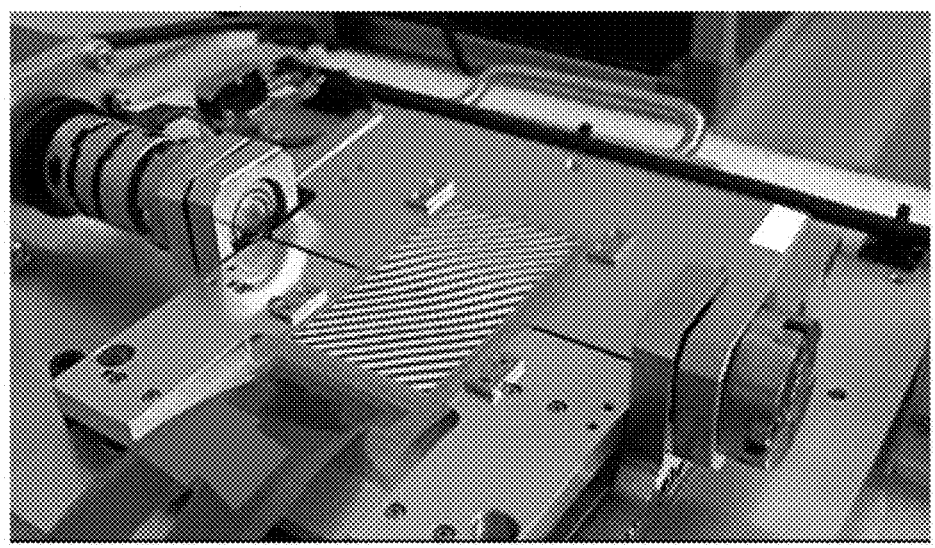
FIGS. 29A and 29B are photographs of a bend tester.
Figure 29B:
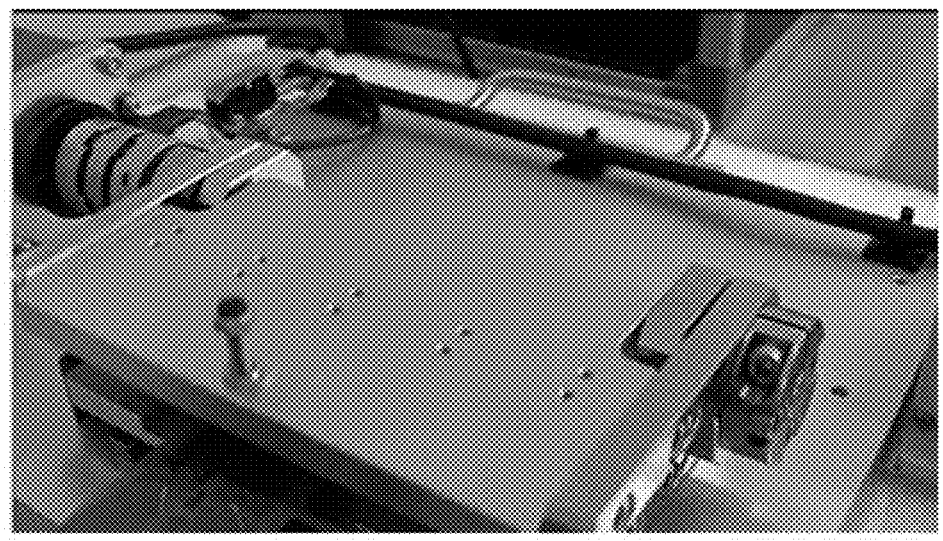

A bending test performed with a book-type bend tester that is capable of examining only resistance to bending is described below. In the bending test, the bend tester is repeatedly opened (see FIG. 29A) and closed (see FIG. 29B) like a book. The radius of curvature for bending the light-emitting device was determined by setting the distance between plates when bent.

The bending characteristics of the light-emitting devices examined with the book-type bend tester are described. When inward bending with each of radiuses of curvature of 5 mm, 3 mm, and 2 mm was performed 100,000 times, the display portion had no defect and the driver operated normally. When inward bending with a radius of curvature of 1 mm was performed 9,000 times, the display portion had no defect and the driver operated normally. Less warpage due to the bending test was caused in the case where the book-type bend tester was used than in the case where the bend tester described above was used, and almost no warpage was observed when bending with a radius of curvature of 5 mm was performed with the book-type bend tester.

According to this example described above, the flexible light-emitting device of one embodiment of the present invention, in which the substrate having a coefficient of expansion less than or equal to 27 ppm/° C. was used, was found to have high resistance to bending and high reliability. Moreover, according to this example, the flexible light-emitting device of one embodiment of the present invention, in which the bonding layer having hardness higher than or equal to Shore D of 80 was used, was found to have high resistance to bending and high reliability.

Example 4

In this example, the flexible light-emitting device of one embodiment of the present invention was fabricated and its reliability was evaluated.

Five light-emitting devices were fabricated in this example. A structure and a fabricating method similar to those of the light-emitting device fabricated in Example 3 are omitted.

A sample 13 and a sample 14 differ from the light-emitting device in Example 3 in that a sheet-like adhesive is used for the bonding layer 811 and the bonding layer 841. The thickness of the sheet-like adhesive used for the sample 13 was 10 μm, and the thickness of the sheet-like adhesive used for the sample 14 was 20 μm.

The bonding layers were used for attachment while pressure treatment and heating were performed under reduced pressure (approximately 100 Pa) so that inclusion of air bubbles in the bonding surface can be suppressed. The sheet-like adhesive used for the sample 13 and the sample 14 has low adhesion at room temperature and exhibits high adhesion when heated at a temperature higher than or equal to 60° C. In this example, the sheet-like adhesive was cured by heating at 80° C. for one hour.

A sample 15 differs from the light-emitting device in Example 3 in that a two-part curable epoxy-based resin having hardness of Shore D of 84 to 86, which is similar to the material a used for the sample 1 of Example 1, is used for the bonding layer 811 and the bonding layer 841.

A sample 16 differs from the light-emitting device in Example 3 in that a sheet-like adhesive having hardness of Shore D of 58 to 62 is used for the bonding layer 811 and the bonding layer 841. The sheet-like adhesive used for the sample 16 was cured in such a manner that both surfaces of the adhesive were irradiated with UV light (energy of 3,000 mJ/cm$^2$) with a high-pressure mercury lamp and was heated at 120° C. for one hour.

A sample 17 differs from the light-emitting device in Example 3 in that a two-part curable epoxy-based resin having hardness of Shore D of 84 to 86, which is similar to the material a used for the sample 1 of Example 1, is used for the bonding layer 811, the bonding layer 823, and the bonding layer 841.

When a preservation test was performed at a high temperature of 65° C. and a high humidity of 90% for 100 hours in the sample 13 and the sample 14, the display state and the operation of the driver had no problem.

When, on the sample 13 and the sample 14, inward bending with a radius of curvature of 3 mm was performed 100,000 times with the bend tester in FIG. 25A, the display portion had no defect and the driver operated normally.

In the sample 16 in which hardness of the bonding layer 811 and hardness of the bonding layer 841 are each Shore D of 58 to 62, a crack has already occurred in the fabricating process. On the other hand, in the sample 15 in which hardness of the bonding layer 811 and hardness of the bonding layer 841 are each Shore D of 84 to 86, a crack was not observed in the fabricated light-emitting device. When a preservation test was performed at a high temperature of 65° C. and a high humidity of 90% for 500 hours in the sample 15 and the sample 16, there were less shrinkage (here, luminance decay from the end portion of the light-emitting portion or expansion of a non-light-emitting region of the light-emitting portion) than in the sample 15 and the sample 16. Accordingly, the reliability of the light-emitting device was found to be improved by suppressing occurrence of a crack in the inorganic insulating film or the element in the fabricating process of the light-emitting device.

When, on the sample 17, inward bending with a radius of curvature of 5 mm was performed 100,000 times with the bend tester in FIG. 25A, the display portion had no defect and the driver operated normally. Furthermore, when, on the sample 17, a preservation test was performed at a high temperature of 65° C. and a high humidity of 95% for 240 hours after the bending test, shrinkage was not caused in the bent portion and thus even a minute crack did not occur.

According to this example described above, the flexible light-emitting device of one embodiment of the present invention, in which the bonding layer having hardness higher than or equal to Shore D of 80 was used, was found to have high resistance to bending and high reliability. Moreover, according to this example, the flexible light-emitting device of one embodiment of the present invention, in which the sheet-like adhesive was used, was found to have high resistance to bending and high reliability.

Example 5

Examples of time taken to form the base film, the peeling layer 103, and the insulating layer 813 formed in Example 1 will be described.

Table 3 shows deposition methods of layers for forming the base film, the peeling layer 103, and the insulating layer 813, processing time per batch, and processing time per substrate.

TABLE 3

| | | thickness (nm) | deposition method | takt time per batch (min) | takt time per substrate (min) |
|---|---|---|---|---|---|
| insulating layer 813 | third silicon oxynitride film | 100 | batch processing | 52 | 5.2 |
| | silicon nitride oxide film | 140 | | | |
| | second silicon oxynitride film | 200 | | | |
| | silicon nitride film | 200 | | | |
| | first silicon oxynitride film | 600 | batch processing | 20 | 2 |
| peeling layer 103 | tungsten film | 30 | single wafer processing | — | 2 |
| base film | silicon oxynitride film | 200 | batch processing | 44 | 4.4 |

Here, the base film, the peeling layer 103, and the first silicon oxynitride film were each formed in a single layer, and the other four layers of the insulating layer 813 were formed collectively. The tungsten film was formed with a single-wafer sputtering apparatus, and the other layers were formed with a batch type CVD apparatus.

Note that the takt time in Table 3 does not include time for transferring substrates. As for the takt time of the batch processing, the takt time per batch and the takt time per substrate (the value obtained by dividing the takt time per batch by the number of substrates processed, and here 10 substrates were processed per batch) are shown.

In this example, fabrication by a device which is suitable for mass production is not performed; therefore, the takt time is probably further shortened depending on the specification of the device. Moreover, even when a structure that has both peelability and a moisture-proof property is applied to the inorganic films for forming the peeling layer and the insulating layer, it was found that deposition at an extremely low rate is not needed and a highly reliable device can be manufactured with high productivity.

Example 6

In this example, yield of each step and time taken for each step in the method for manufacturing the device of one embodiment of the present invention will be described.

The method for manufacturing the device of one embodiment of the present invention which is described in Embodiment 2 as an example (see FIGS. 15A to 15C, FIGS. 16A to 16C, and FIGS. 17A and 17B) includes a first process of performing first peeling of a formation substrate and first attachment of a flexible substrate, a second process of performing second peeling of the formation substrate and second attachment of the flexible substrate, and a third process of exposing a conductive layer electrically connected to an FPC and attaching the FPC by pressure.

Note that in this example, the formation substrate 201 over which a transistor or an organic EL element was formed was peeled in the first process, and the formation substrate 221 on which a color filter or the like was formed was peeled in the second process. The hardness of each of the bonding layer 823, the bonding layer 811, and the bonding layer 841 was set to be higher than or equal to Shore D of 80. As the material, a two-part curable epoxy-based resin was used instead of a sheet-like adhesive. A flexible substrate having a coefficient of expansion less than or equal to 27 ppm/° C. was used as the substrate 801 and the substrate 803.

First, a 3.4-inch flexible organic EL display was fabricated with a formation substrate having 5 inches on each side, and yield was checked in the above three processes.

As shown in Table 4, when 221 displays were manufactured, the yield in each step was 90% or more and the total yield was 83%.

TABLE 4

|  | first process | second process | third process | total |
| --- | --- | --- | --- | --- |
| yield | 91.40% | 95.00% | 95.80% | 83.20% |
|  | (202/221) | (192/202) | (184/192) | (184/221) |

Furthermore, a 5.3-inch flexible organic EL display was fabricated with a formation substrate sized 300 mm×360 mm, and yield was checked in the above three processes. Note that two displays were taken out from the formation substrate.

As shown in Table 5, when 76 displays were manufactured in total using the 38 formation substrates, the yield in each step was 90% or more and the total yield was 84%.

TABLE 5

|  | first process | second process | third process | total |
| --- | --- | --- | --- | --- |
| yield | 92.10% | 91.40% | 100.00% | 84.20% |
|  | (70/76) | (64/70) | (64/64) | (64/76) |

By mixture of a foreign substance in the fabricating process, for example, film peeling in an organic film at the time of peeling can be given as one mode of defects. The displays were fabricated manually in this example; therefore, the yield can be probably improved with a manufacturing apparatus. In addition, it was found that the yield is unlikely to be decreased even when the formation substrate is increased in size.

Table 6 shows time taken in each step when a 13.5-inch flexible organic EL display is fabricated manually using a formation substrate sized 300 mm×360 mm.

TABLE 6

|  | time (min) |
| --- | --- |
| formation of peeling starting point | 5 |
| peeling of formation substrate 201 | 5 |
| cleaning | 7 |
| attachment of substrate 801 | 10 |
| baking at 40° C. for curing of bonding layer 811 | 720 |
| baking at 80° C. for curing of bonding layer 811 | 30 |
| formation of peeling starting point | 5 |
| peeling of formation substrate 221 | 3 |
| attachment of substrate 803 | 10 |
| baking at 40° C. for curing of bonding layer 841 | 720 |
| exposure of conductive layer 857 | 12 |

In this example, since a two-part curable epoxy-based resin was used as a material of the bonding layer, it takes time to cure the bonding layer. However, the time taken for a process per display can be shortened by batch processing. According to one embodiment of the present invention, a sheet-like adhesive is preferably used, in which case the time taken to fabricate the device can be shortened.

Example 7

In this example, conditions for favorably peeling a thin film will be described.
[Method for Examining Peelability]
First, an examination method for peeling a thin film from a support substrate will be described.

Figure 30A:
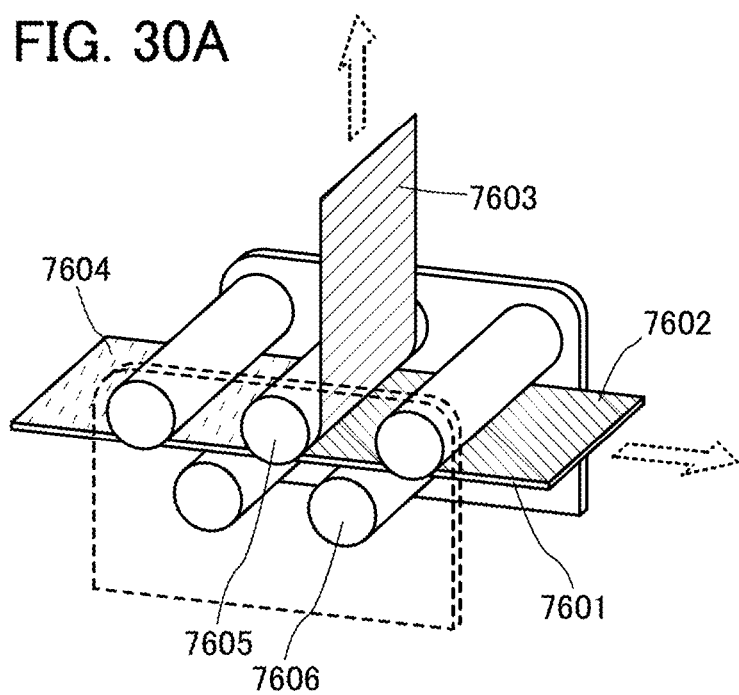
FIGS. 30A and 30B illustrate an apparatus used for a peeling test and a structure example of a sample, respectively.

The force required for peeling may be examined with a jig illustrated in, for example, FIG. 30A. The jig illustrated in FIG. 30A includes a plurality of guide rollers 7606 and a plurality of support rollers 7605. A tape 7604 is attached onto a thin film 7603 which is formed over a support substrate 7601 and an end portion of the tape 7604 is partly peeled in advance. Then, the support substrate 7601 is fixed to the jig so that the tape 7604 is held by the support rollers 7605, and the tape 7604 and the thin film 7603 are positioned perpendicular to the support substrate 7601. The force required for peeling can be measured as follows: when the tape 7604 is pulled perpendicular to the support substrate 7601 to peel the thin film 7603 from the support substrate 7601, the force required for the pulling in the perpendicular direction is measured. During the peeling, the support substrate 7601 moves in the plane direction along the guide rollers 7606 with a peeling layer 7602 exposed. The support rollers 7605 and the guide rollers 7606 are rotatable so that the thin film 7603 and the support substrate 7601 are not affected by friction during the move.

Figure 30B:
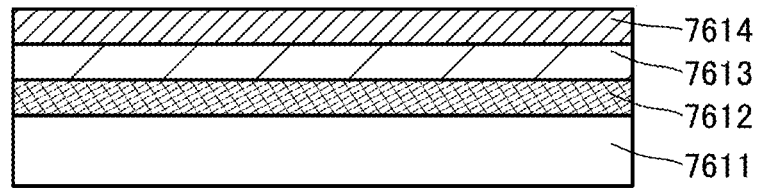

In a sample for a peeling test shown below, the support substrate was cut into a size of 25 mm×126.6 mm, and a UV curable adhesive film (also referred to as a UV film; UHP-0810MC manufactured by DENKI KAGAKU KOGYO KABUSHIKI KAISHA) was attached as the tape 7604 to the cut support substrate by a tape mounter. After that, an approximately 20 mm of an end portion of the UV film was peeled, and the sample was fixed to the jig. For the peeling test, a compact table-top universal tester (EZ-TEST EZ-S-50N) manufactured by Shimadzu Corporation was used. For the peeling test, an adhesive tape/adhesive sheet testing method based on standard number JIS Z0237 of Japanese Industrial Standards (JIS) was referred to.
[Structure of Sample]
The structure of the sample used for examination is described. FIG. 30B illustrates the cross-sectional structure of the sample. In the sample, a peeling layer 7612, a first layer 7613, and a second layer 7614 are stacked in this order over a support substrate 7611. Peeling occurs at an interface between the peeling layer 7612 and the first layer 7613.

[Relation Between Peelability and Hydrogen Releasing Property]

Here, the relation between peelability and the amount of released hydrogen in the first layer is described.

<Samples A to C>

In a sample A, a sample B, and a sample C, a glass substrate over which an approximately 200-nm-thick silicon oxynitride film was formed was used as the support substrate 7611. An approximately 30-nm-thick tungsten film was formed as the peeling layer 7612 by a sputtering method. A silicon oxynitride film was formed as the first layer 7613 by a plasma CVD method. Subsequently, an approximately 200-nm-thick silicon nitride film, an approximately 200-nm-thick silicon oxynitride film, an approximately 140-nm-thick silicon nitride oxide film, and an approximately 100-nm-thick silicon oxynitride film were formed in this order as the second layer 7614 by a plasma CVD method. After that, heat treatment was performed at 450° C. for one hour.

In the sample A, the thickness of the first layer 7613 was set to be approximately 600 nm. In the sample B, the thickness of the first layer 7613 was set to be approximately 400 nm. In the sample C, the thickness of the first layer 7613 was set to be approximately 200 nm.

Figure 31A:
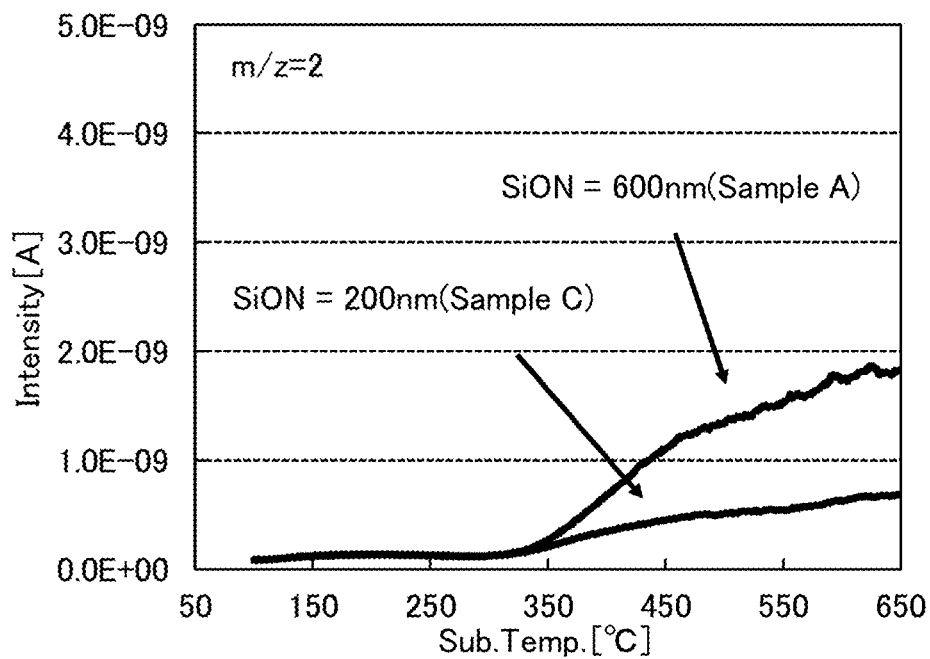
FIGS. 31A and 31B show results of TDS analysis and results of examining peelability, respectively.

Here, as for the approximately 600-nm-thick silicon oxynitride film used for the sample A and the approximately 200-nm-thick silicon oxynitride film used for the sample C, FIG. 31A shows results of examining temperature dependence of intensity detected at the mass-to-charge ratio (m/z) of 2 corresponding to a hydrogen molecule by thermal desorption spectroscopy (TDS) analysis. The results showed that the larger the thickness of the silicon oxynitride film was, the larger the amount of released hydrogen tended to be.

Figure 31B:
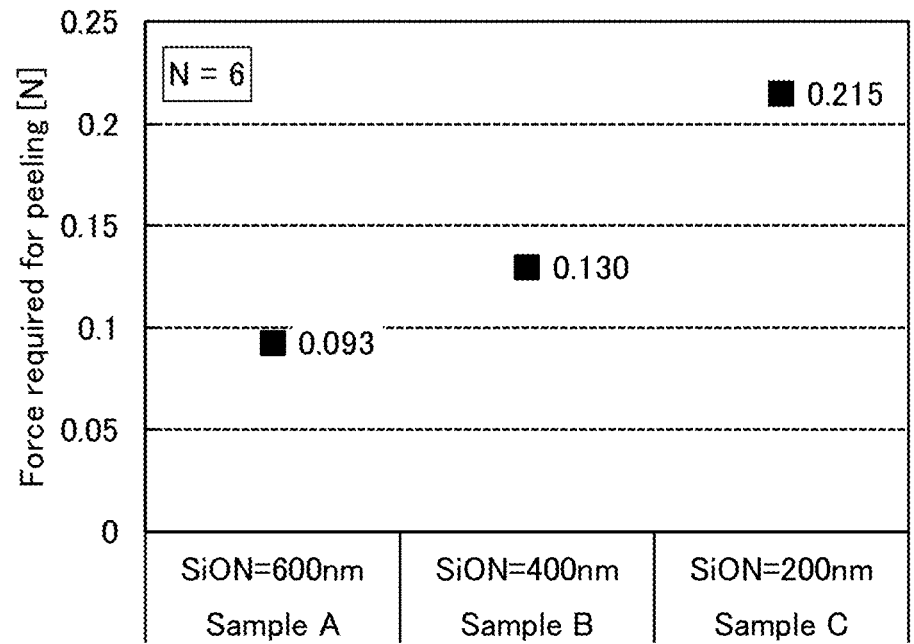

Subsequently, force required for peeling in the samples A to C was measured. For each sample, six samples which were cut from the same substrate according to the above-described size were measured. FIG. 31B shows measurement results. As a result, the force required for peeling in the sample A was the smallest, and the force required for peeling in the sample C was the largest.

<Samples D to F>

In a sample D, a sample E, and a sample F, a glass substrate over which an approximately 200-nm-thick silicon oxynitride film was formed was used as the support substrate 7611. An approximately 30-nm-thick tungsten film was formed as the peeling layer 7612 by a sputtering method. An approximately 600-nm-thick silicon oxynitride film was formed as the first layer 7613 by a plasma CVD method. Subsequently, an approximately 200-nm-thick silicon nitride film was formed as the second layer 7614 by a plasma CVD method. After that, heat treatment was performed at 450° C. for one hour.

Here, as the film formation conditions of the silicon oxynitride film used for the first layer 7613, the flow rates of silane in the sample D, the sample E, and the sample F were set to be 50 sccm, 75 sccm, and 100 sccm, respectively.

Figure 32A:
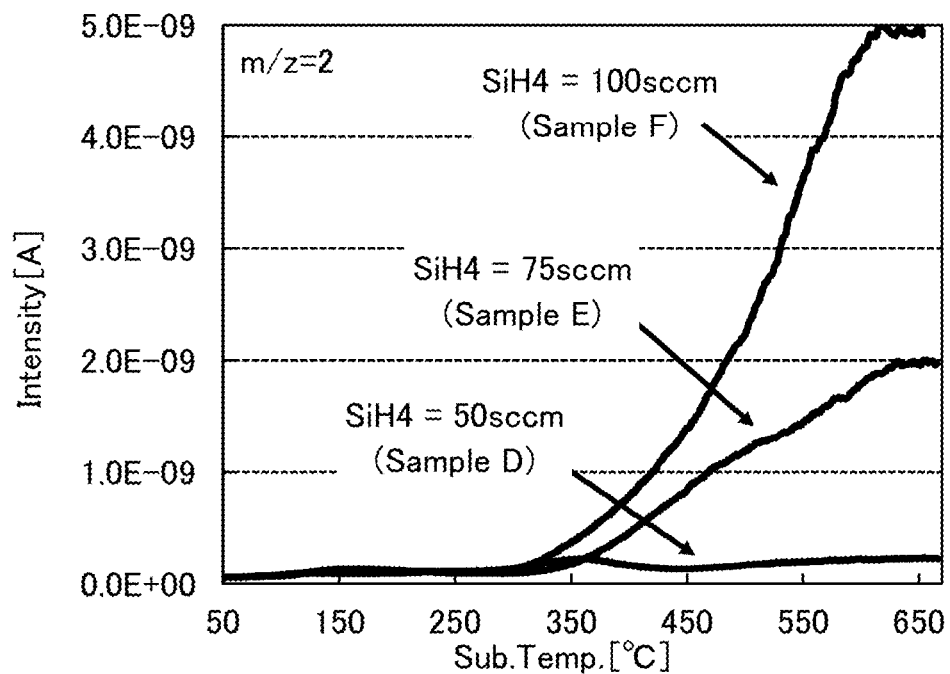
FIGS. 32A and 32B show results of TDS analysis and results of examining peelability, respectively.

FIG. 32A shows the results of TDS analysis of the samples D to F. The results showed that the larger the amount of silane at the film formation of the silicon oxynitride film was, the larger the amount of released hydrogen tended to be.

Figure 32B:
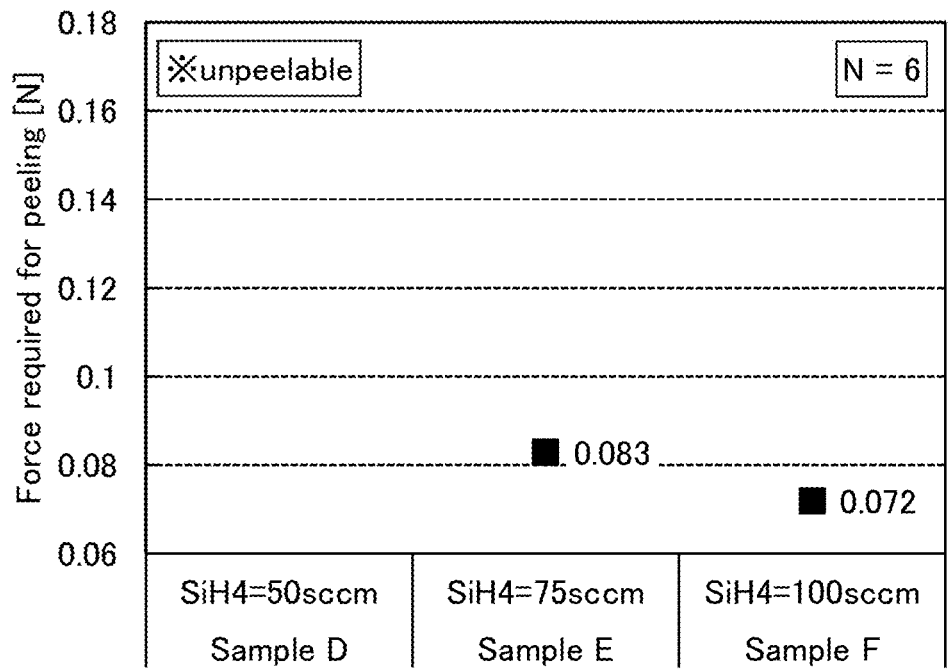

Subsequently, FIG. 32B shows measurement results of force required for peeling in the samples D to F. In the sample D, none of the measured six samples was able to be peeled favorably. In the sample E and the sample F, all of the measured six samples were able to be peeled favorably. Moreover, the force required for peeling of the sample F was smaller than that of the sample E.

<Samples M to O>

In a sample M, a sample N, and a sample O, a glass substrate over which an approximately 200-nm-thick silicon oxynitride film was formed was used as the support substrate 7611. An approximately 30-nm-thick tungsten film was formed as the peeling layer 7612 by a sputtering method. An approximately 600-nm-thick silicon oxynitride film was formed as the first layer 7613 by a plasma CVD method. Subsequently, an approximately 200-nm-thick silicon nitride film was formed as the second layer 7614 by a plasma CVD method. After that, heat treatment was performed at 450° C. for one hour.

Here, the approximately 200-nm-thick silicon oxynitride film, the silicon oxynitride film used for the first layer 7613, and the silicon nitride film used for the second layer 7614 were formed using an apparatus different from the apparatus used for the samples D to F. Specifically, a film formation apparatus which was smaller than the film formation apparatus used for the samples D to F in an electrode area, chamber capacity, and the like was used.

In addition, as the film formation conditions of the silicon oxynitride film used for the first layer 7613, the flow rates of silane in the sample M, the sample N, and the sample O were set to be 5 sccm, 27 sccm, and 60 sccm, respectively.

Figure 35A:
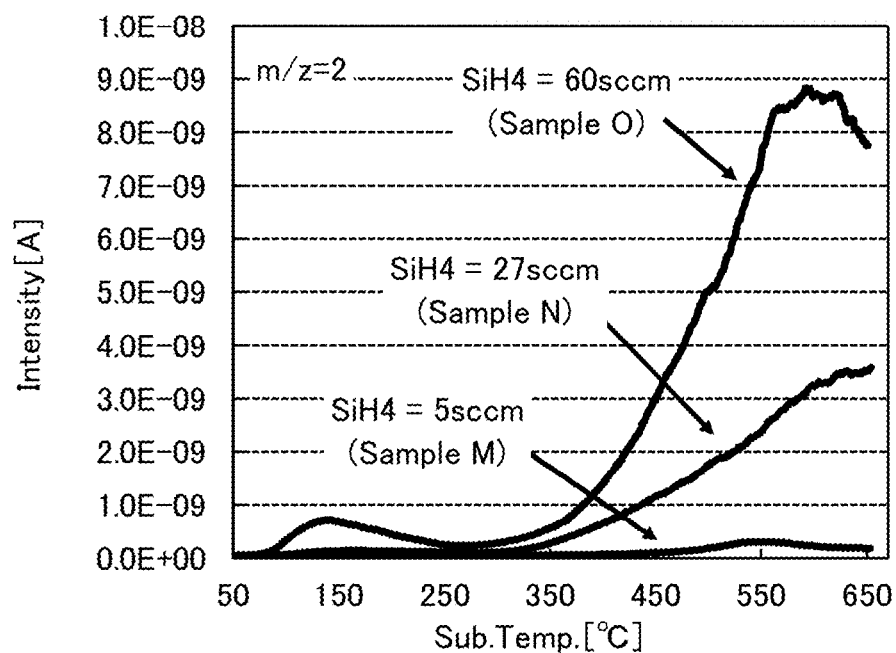
FIGS. 35A and 35B show results of TDS analysis and results of examining peelability, respectively.

FIG. 35A shows the results of TDS analysis of the samples M to O. The results showed that the larger the amount of silane at the film formation of the silicon oxynitride film was, the larger the amount of released hydrogen tended to be.

Figure 35B:
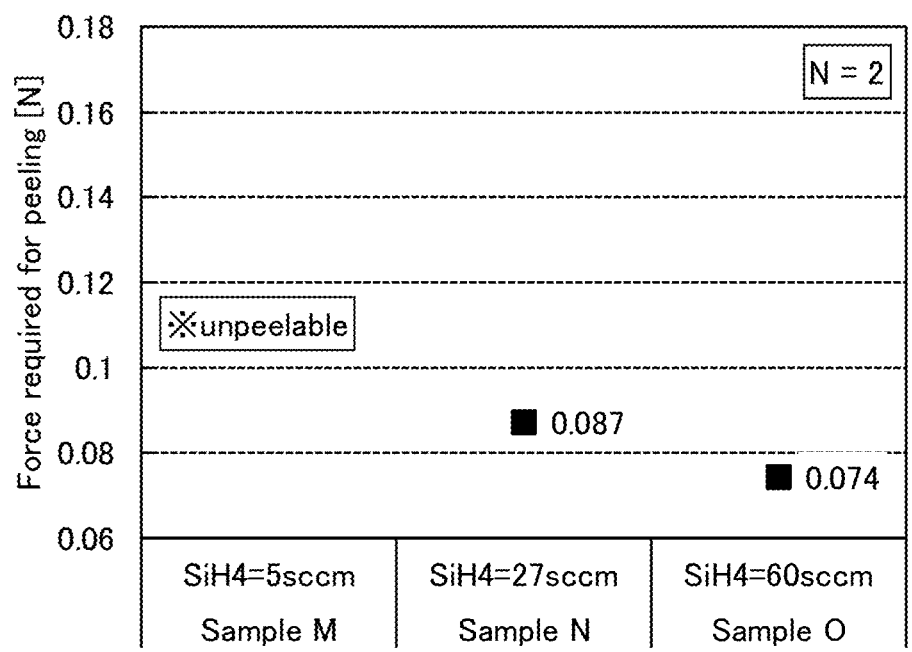

Subsequently, FIG. 35B shows measurement results of force required for peeling in the samples M to O. In the sample M, neither of the measured two samples was able to be peeled favorably. In the sample N and the sample O, both of the measured two samples were able to be peeled favorably. Moreover, the force required for peeling of the sample O was smaller than that of the sample N.

<Samples P to R>

In a sample P, a sample Q, and a sample R, a glass substrate over which an approximately 200-nm-thick silicon oxynitride film was formed was used as the support substrate 7611. An approximately 30-nm-thick tungsten film was formed as the peeling layer 7612 by a sputtering method. An approximately 600-nm-thick silicon oxynitride film was formed as the first layer 7613 by a plasma CVD method. Subsequently, an approximately 200-nm-thick silicon nitride film was formed as the second layer 7614 by a plasma CVD method. After that, heat treatment was performed at 450° C. for one hour.

Here, as the film formation conditions of the silicon oxynitride film used for the first layer 7613, the power densities in the sample P, the sample Q, and the sample R were set to be 0.041 W/cm$^2$, 0.071 W/cm$^2$, and 0.204 W/cm$^2$, respectively.

Figure 36A:
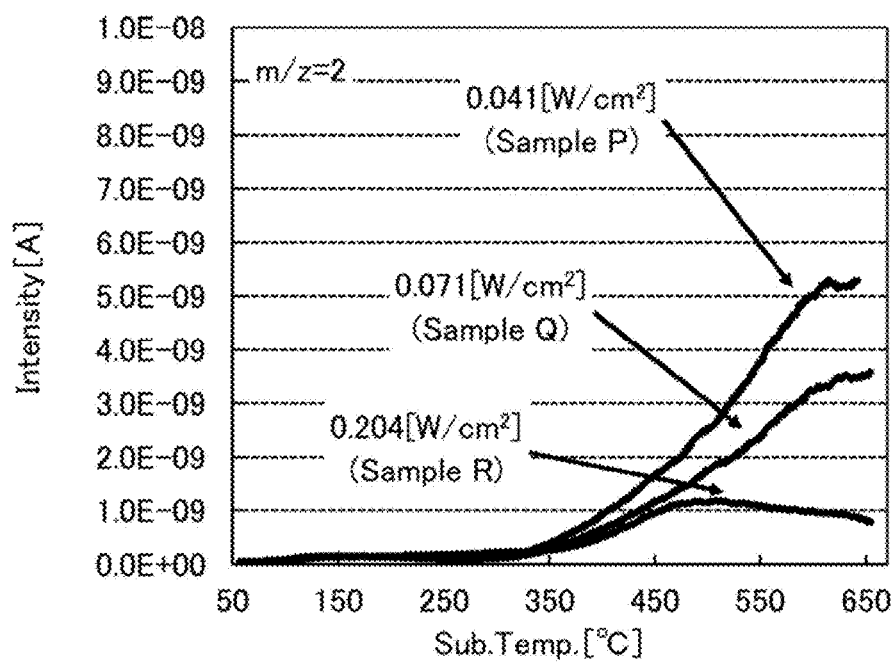
FIGS. 36A and 36B show results of TDS analysis and results of examining peelability, respectively.

FIG. 36A shows the results of TDS analysis of the samples P to R. The results showed that the lower the power density at the film formation of the silicon oxynitride film was, the larger the amount of released hydrogen tended to be.

Figure 36B:
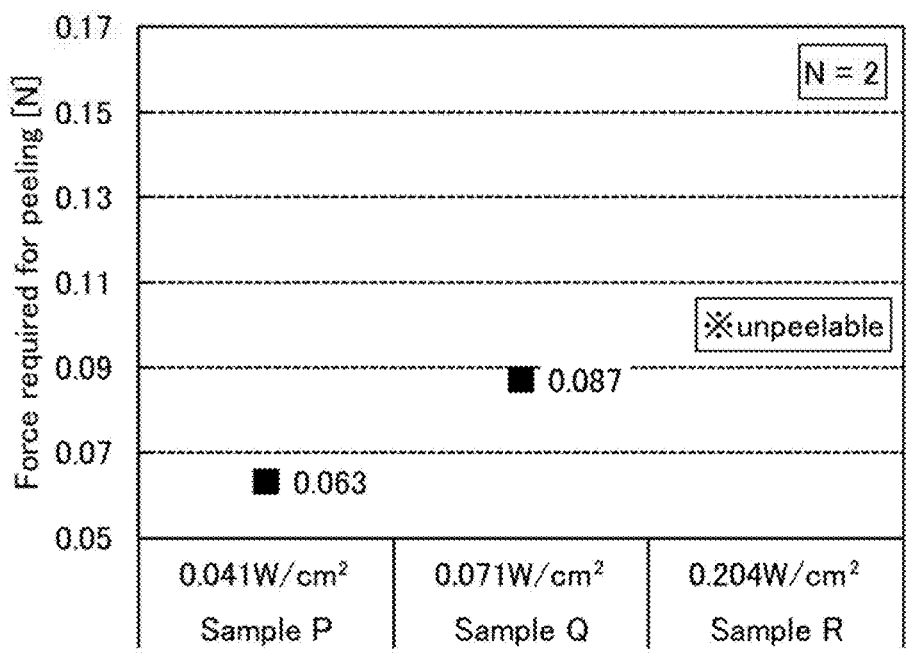

Subsequently, FIG. 36B shows measurement results of force required for peeling in the samples P to R. In the sample R, neither of the measured two samples was able to be peeled favorably. In the sample P and the sample Q, both of the measured two samples were able to be peeled favorably. Moreover, the force required for peeling of the sample P was smaller than that of the sample Q.

The above results showed that the larger the amount of hydrogen released from the first layer 7613 was, the smaller the force required for peeling was.

Moreover, the amount of released hydrogen was able to be controlled by the film formation conditions of the silicon oxynitride film used for the first layer 7613. Specifically, a silicon oxynitride film which was suitable for peeling and had a large amount of released hydrogen was able to be fabricated depending on the conditions of a film thickness, a flow rate of silane with respect to a deposition gas, power density, or the like.

[Relation Between Peelability and Heat Treatment Temperature]

Here, the relation between peelability and the temperature of heat treatment performed after the formation of the second layer 7614 is described.

<Samples G to J>

A sample G, a sample H, a sample I, and a sample J were each fabricated in a manner similar to that of the sample A except the condition of heat treatment.

A sample obtained by heat treatment at 350° C. for one hour performed after the formation of the second layer 7614 was the sample G Similarly, a sample obtained by heat treatment at 400° C. for one hour, a sample obtained by heat treatment at 450° C. for one hour, and a sample obtained by heat treatment at 480° C. for one hour were the sample H, the sample I, and the sample J, respectively.

Figure 33:
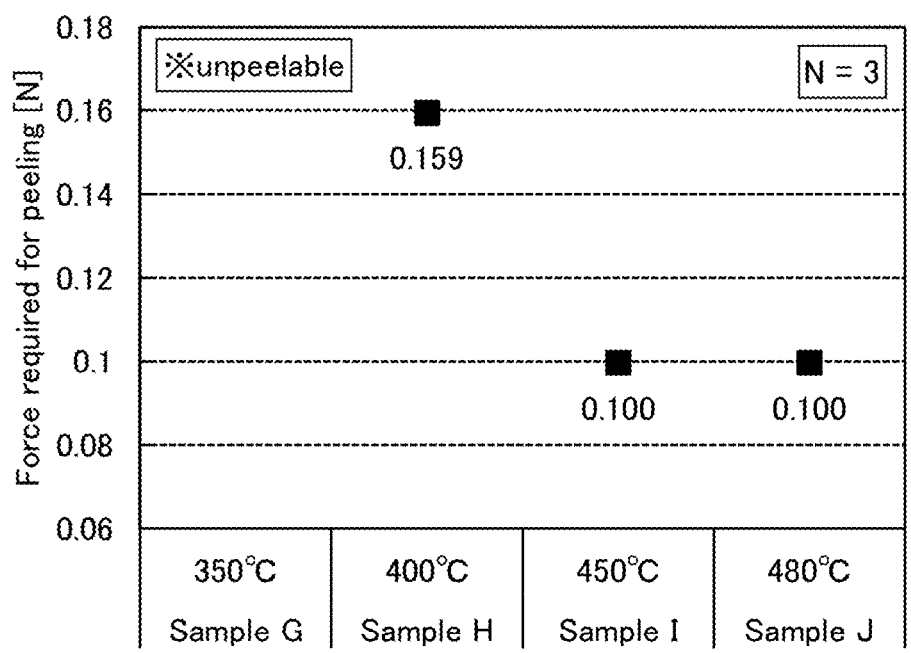
FIG. 33 shows results of examining peelability.

FIG. 33 shows measurement results of force required for peeling in the samples G to J. In the sample G, none of the measured three samples was able to be peeled favorably. In the samples H to J, all of the measured three samples were able to be peeled favorably. The sample I and the sample J were equivalent in the force required for peeling. The force required for peeling in the sample H was stronger than those in the sample I and the sample J.

The above results showed that the higher the temperature of the heat treatment after the formation of the second layer 7614 was, the more peelability was improved, and that peelability was saturated at a temperature higher than or equal to a predetermined temperature. It is probable that the amount of hydrogen released from the first layer 7613 was increased and peelability was improved as the temperature of the heat treatment got higher.

[Relation Between Peelability and Hydrogen-Blocking Property of Second Layer]

Here, the relation between peelability and the hydrogen-blocking property of the second layer 7614 is described.

<Samples K and L>

In a sample K and a sample L, a glass substrate over which an approximately 200-nm-thick silicon oxynitride film was formed was used as the support substrate 7611. An approximately 30-nm-thick tungsten film was formed as the peeling layer 7612 by a sputtering method. Subsequently, an approximately 600-nm-thick silicon oxynitride film was formed as the first layer 7613 by a plasma CVD method.

Only in the sample K, an approximately 200-nm-thick silicon nitride film was formed as the second layer 7614 by a plasma CVD method. After that, heat treatment was performed at 450° C. for one hour. In the sample L, the second layer 7614 was not formed.

Figure 34A:
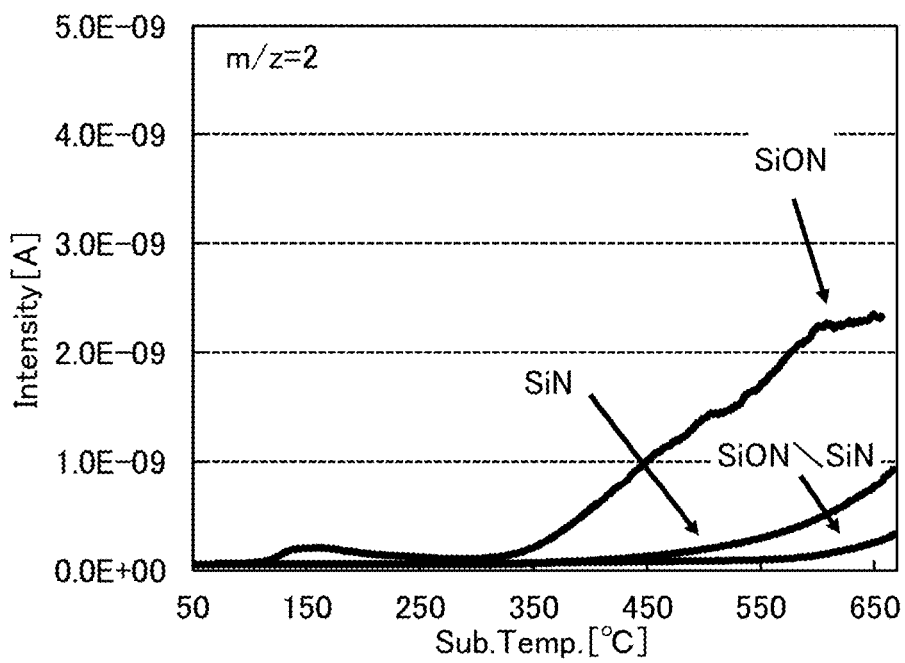
FIGS. 34A and 34B show results of TDS analysis and results of examining peelability, respectively.

First, FIG. 34A shows the results of TDS analysis of the approximately 600-nm-thick silicon oxynitride film used for the first layer 7613, the approximately 200-nm-thick silicon nitride film used for the second layer 7614, and a stack of the silicon oxynitride film and the silicon nitride film. Although the silicon oxynitride film was found to release a large amount of hydrogen, the silicon nitride was found to release hydrogen hardly compared with the silicon oxynitride film. Moreover, the amount of hydrogen that diffuses above was reduced by stacking the silicon nitride film over the silicon oxynitride film. This result shows that the silicon nitride film has a blocking property against hydrogen.

Figure 34B:
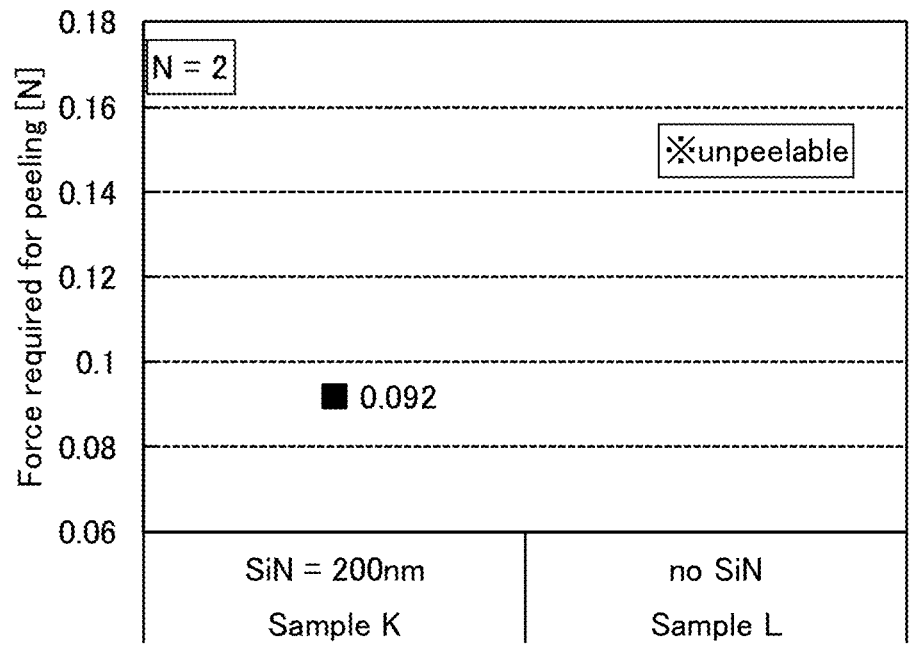

Subsequently, FIG. 34B shows measurement results of force required for peeling in the samples K and L. In the sample K, both of the measured two samples were able to peel be peeled favorably. On the other hand, in the sample L in which the second layer 7614 was not formed, neither of the measured two samples was able to be peeled favorably.

According to the above result, providing the second layer 7614 having a blocking property against hydrogen was found to suppress upward diffusion of hydrogen released from the first layer 7613 and increase the amount of hydrogen that contributes to peeling, resulting in an increase of peelability.

REFERENCE NUMERALS

98: rod, 99: light-emitting device, 101: formation substrate, 103: peeling layer, 104: insulating layer, 105: layer to be peeled, 106: element layer, 107: bonding layer, 109: substrate, 111: bonding layer, 112: bonding layer, 113: resin layer, 114: substrate, 115: laser light irradiation region, 117: peeling starting portion, 171: bonding layer, 173: substrate, 201: formation substrate, 203: peeling layer, 204: insulating layer, 205: layer to be peeled, 206: element layer, 207: bonding layer, 221: formation substrate, 223: peeling layer, 224: insulating layer, 225: layer to be peeled, 226: functional layer, 231: substrate, 233: bonding layer, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): imaging signal line driver circuit, 303s(2): imaging signal driver circuit, 303t: transistor, 304: gate, 308: imaging pixel, 308p: photoelectric conversion element, 308t: transistor, 309: FPC, 310: portable information terminal, 311: wiring, 312: display panel, 313: hinge, 315: housing, 319: terminal, 320: portable information terminal, 321: insulating layer, 322: display portion, 325: non-display portion, 328: partition, 329: spacer, 330: portable information terminal, 333: display portion, 335: housing, 336: housing, 337: information, 339: operation button, 340: portable information terminal, 345: portable information terminal, 350R: light-emitting element, 351: housing, 351R: lower electrode, 352: upper electrode, 353: EL layer, 353a: EL layer, 353b: EL layer, 354: intermediate layer, 355: data, 356: data, 357: data, 358: display portion, 360: bonding layer, 367BM: light-blocking layer, 367p: anti-reflective layer, 367R: coloring layer, 380B: light-emitting module, 380G: light-emitting module, 380R: light-emitting module, 390: touch panel, 501: display portion, 502R: sub-pixel, 502t: transistor, 503c: capacitor, 503g: scan line driver circuit, 503t: transistor, 505: touch panel, 505B: touch panel, 509: FPC, 510: substrate, 510a: insulating layer, 510b: flexible substrate, 510c: bonding layer, 511: wiring, 519: terminal, 521: insulating film, 528: partition, 550R: light-emitting element, 560: bonding layer, 567BM: light-blocking layer, 567p: anti-reflective layer, 567R: coloring layer, 570: substrate, 570a: insulating layer, 570b: flexible substrate, 570c: bonding layer, 580R: light-emitting module, 590: substrate, 591:

electrode, 592: electrode, 593: insulating layer, 594: wiring, 595: touch sensor, 597: bonding layer, 598: wiring, 599: bonding layer, 801: substrate, 803: substrate, 804: light-emitting portion, 806: driver circuit portion, 808: FPC, 811: bonding layer, 813: insulating layer, 814: conductive layer, 815: insulating layer, 816: conductive layer, 817: insulating layer, 817a: insulating layer, 817b: insulating layer, 820: transistor, 821: insulating layer, 822: transistor, 823: bonding layer, 824: bonding layer, 825: connector, 827: spacer, 830: light-emitting element, 831: lower electrode, 833: EL layer, 835: upper electrode, 841: bonding layer, 843: insulating layer, 845: coloring layer, 847: light-blocking layer, 849: overcoat, 857: conductive layer, 857a: conductive layer, 857b: conductive layer, 862: EL layer, 864: conductive layer, 7100: portable information terminal, 7101: housing, 7102: display portion, 7103: band, 7104: buckle, 7105: operation button, 7106: input/output terminal, 7107: icon, 7200: lighting device, 7201: stage, 7202: light-emitting portion, 7203: operation switch, 7210: lighting device, 7212: light-emitting portion, 7220: lighting device, 7222: light-emitting portion, 7300: display device, 7301: housing, 7302: display portion, 7303: operation button, 7304: display portion pull, 7305: control portion, 7400: cellular phone, 7401: housing, 7402: display portion, 7403: operation button, 7404: external connection port, 7405: speaker, 7406: microphone, 7601: support substrate, 7602: peeling layer, 7603: thin film, 7604: tape, 7605: support roller, 7606: guide roller, 7611: support substrate, 7612: peeling layer, 7613: layer, and 7614: layer.

This application is based on Japanese Patent Application serial no. 2014-029756 filed with Japan Patent Office on Feb. 19, 2014, the entire contents of which are hereby incorporated by reference.

The invention claimed is:

1. A light-emitting device comprising:
a first substrate having flexibility;
a second substrate having flexibility;
an element layer between the first substrate and the second substrate;
an insulating layer between the first substrate and the element layer;
a first bonding layer between the first substrate and the insulating layer;
a second bonding layer between the second substrate and the element layer,
wherein the element layer comprises a light-emitting element,
wherein the first bonding layer comprises a first portion whose hardness is higher than Shore D of 70,
wherein the second bonding layer comprises a second portion whose hardness is higher than Shore D of 70,
wherein the first substrate comprises a third portion whose coefficient of expansion is less than 58 ppm/° C., and
wherein the second substrate comprises a fourth portion whose coefficient of expansion is less than 58 ppm/° C.

2. The light-emitting device according to claim 1, wherein the hardness of the first portion is higher than or equal to Shore D of 80, and
wherein the hardness of the second portion is higher than or equal to Shore D of 80.

3. The light-emitting device according to claim 1, wherein the coefficient of expansion of the third portion is less than or equal to 30 ppm/° C., and
wherein the coefficient of expansion of the fourth portion is less than or equal to 30 ppm/° C.

4. The light-emitting device according to claim 1, wherein the insulating layer comprises:
a first silicon oxynitride film;
a silicon nitride film over the first silicon oxynitride film;
a second silicon oxynitride film over the silicon nitride film;
a silicon nitride oxide film over the second silicon oxynitride film; and
a third silicon oxynitride film over the silicon nitride oxide film.

5. A light-emitting device comprising:
a first substrate having flexibility;
a second substrate having flexibility;
an element layer between the first substrate and the second substrate;
an insulating layer between the first substrate and the element layer;
a first bonding layer between the first substrate and the insulating layer;
a second bonding layer between the second substrate and the element layer,
wherein the element layer comprises a light-emitting element,
wherein the first bonding layer comprises a first portion whose hardness is higher than or equal to Shore D of 80,
wherein the second bonding layer comprises a second portion whose hardness is higher than or equal to Shore D of 80,
wherein the first substrate comprises a third portion whose coefficient of expansion is less than or equal to 27 ppm/° C., and
wherein the second substrate comprises a fourth portion whose coefficient of expansion is less than or equal to 27 ppm/° C.

6. The light-emitting device according to claim 5, wherein the insulating layer comprises:
a first silicon oxynitride film;
a silicon nitride film over the first silicon oxynitride film;
a second silicon oxynitride film over the silicon nitride film;
a silicon nitride oxide film over the second silicon oxynitride film; and
a third silicon oxynitride film over the silicon nitride oxide film.

7. A light-emitting device comprising:
a first substrate having flexibility;
a second substrate having flexibility;
an element layer between the first substrate and the second substrate;
an insulating layer between the first substrate and the element layer;
a first bonding layer between the first substrate and the insulating layer;
a second bonding layer between the second substrate and the element layer,
wherein the element layer comprises a light-emitting element,
wherein the first bonding layer comprises a first portion whose hardness is higher than Shore D of 70,
wherein the second bonding layer comprises a second portion whose hardness is higher than Shore D of 70,
wherein the first substrate comprises a third portion whose coefficient of expansion is less than 58 ppm/° C.,
wherein the second substrate comprises a fourth portion whose coefficient of expansion is less than 58 ppm/° C., and wherein a display portion comprising the light-emitting element is a curved display portion.

8. The light-emitting device according to claim 7, wherein a display surface of the display portion is bent.

9. The light-emitting device according to claim 7,
wherein a housing of the light-emitting device comprises a front surface and a side surface, and
wherein the display portion comprises a region corresponding to the front surface and a region corresponding to the side surface.

10. The light-emitting device according to claim 7,
wherein a housing of the light-emitting device comprises a front surface, a shorter side surface, and a longer side surface, and
wherein the display portion comprises a region corresponding to the front surface, a region corresponding to the shorter side surface, and a region corresponding to the longer side surface.

11. A portable information terminal comprising the light-emitting device according to claim 7.

12. A light-emitting device comprising:
a first substrate having flexibility;
a second substrate having flexibility;
an element layer between the first substrate and the second substrate;
an insulating layer between the first substrate and the element layer;
a first bonding layer between the first substrate and the insulating layer;
a second bonding layer between the second substrate and the element layer,
wherein the element layer comprises a light-emitting element,
wherein the first bonding layer comprises a first portion whose hardness is higher than Shore D of 70,
wherein the second bonding layer comprises a second portion whose hardness is higher than Shore D of 70,
wherein the first substrate comprises a third portion whose coefficient of expansion is less than 58 ppm/° C.,
wherein the second substrate comprises a fourth portion whose coefficient of expansion is less than 58 ppm/° C., and
wherein the light-emitting device is a foldable light-emitting device.

13. The light-emitting device according to claim 12, wherein the light-emitting device is foldable so that a first region of a display surface of the light-emitting device and a second region of the display surface face each other.

14. The light-emitting device according to claim 12, wherein the light-emitting device is foldable so that a first region of a display surface of the light-emitting device and a second region of the display surface do not face each other.

15. The light-emitting device according to claim 12, wherein the light-emitting device is foldable so that a first region of a display surface of the light-emitting device and a second region of the display surface face each other and the second region of the display surface and a third region of the display surface do not face each other.

16. A portable information terminal comprising the light-emitting device according to claim 12.

17. A light-emitting device comprising:
a first substrate having flexibility;
a second substrate having flexibility;
an element layer between the first substrate and the second substrate;
an insulating layer between the first substrate and the element layer;
a first bonding layer between the first substrate and the insulating layer;
a second bonding layer between the second substrate and the element layer,
wherein the element layer comprises a light-emitting element,
wherein the first bonding layer comprises a first portion whose hardness is higher than or equal to Shore D of 80,
wherein the second bonding layer comprises a second portion whose hardness is higher than or equal to Shore D of 80,
wherein the first substrate comprises a third portion whose coefficient of expansion is less than or equal to 27 ppm/° C.,
wherein the second substrate comprises a fourth portion whose coefficient of expansion is less than or equal to 27 ppm/° C., and
wherein a display portion comprising the light-emitting element is a curved display portion.

18. The light-emitting device according to claim 17, wherein a display surface of the display portion is bent.

19. The light-emitting device according to claim 17,
wherein a housing of the light-emitting device comprises a front surface and a side surface, and
wherein the display portion comprises a region corresponding to the front surface and a region corresponding to the side surface.

20. The light-emitting device according to claim 17,
wherein a housing of the light-emitting device comprises a front surface, a shorter side surface, and a longer side surface, and
wherein the display portion comprises a region corresponding to the front surface, a region corresponding to the shorter side surface, and a region corresponding to the longer side surface.

21. A portable information terminal comprising the light-emitting device according to claim 17.

22. A light-emitting device comprising:
a first substrate having flexibility;
a second substrate having flexibility;
an element layer between the first substrate and the second substrate;
an insulating layer between the first substrate and the element layer;
a first bonding layer between the first substrate and the insulating layer;
a second bonding layer between the second substrate and the element layer,
wherein the element layer comprises a light-emitting element,
wherein the first bonding layer comprises a first portion whose hardness is higher than or equal to Shore D of 80,
wherein the second bonding layer comprises a second portion whose hardness is higher than or equal to Shore D of 80,
wherein the first substrate comprises a third portion whose coefficient of expansion is less than or equal to 27 ppm/° C.,
wherein the second substrate comprises a fourth portion whose coefficient of expansion is less than or equal to 27 ppm/° C., and
wherein the light-emitting device is a foldable light-emitting device.

23. The light-emitting device according to claim 22, wherein the light-emitting device is foldable so that a first region of a display surface of the light-emitting device and a second region of the display surface face each other.

24. The light-emitting device according to claim 22, wherein the light-emitting device is foldable so that a first region of a display surface of the light-emitting device and a second region of the display surface do not face each other.

25. The light-emitting device according to claim 22, wherein the light-emitting device is foldable so that a first region of a display surface of the light-emitting device and a second region of the display surface face each other and the second region of the display surface and a third region of the display surface do not face each other.

26. A portable information terminal comprising the light-emitting device according to claim 22.

* * * * *